(12) United States Patent
Miskin

(10) Patent No.: US 11,566,759 B2
(45) Date of Patent: Jan. 31, 2023

(54) LED LIGHTING SYSTEM AND INSTALLATION METHODS

(71) Applicant: Lynk Labs, Inc., Elgin, IL (US)

(72) Inventor: Michael Miskin, Sleepy Hollow, IL (US)

(73) Assignee: Lynk Labs, Inc., Elgin, IL (US)

(*) Notice: Subject to any disclaimer, the term of this patent is extended or adjusted under 35 U.S.C. 154(b) by 0 days.

(21) Appl. No.: 17/391,611

(22) Filed: Aug. 2, 2021

(65) Prior Publication Data

US 2021/0356089 A1 Nov. 18, 2021

Related U.S. Application Data

(63) Continuation of application No. 16/120,003, filed on Aug. 31, 2018, now Pat. No. 11,079,077.
(Continued)

(51) Int. Cl.
*H05B 45/40* (2020.01)
*F21V 23/06* (2006.01)
(Continued)

(52) U.S. Cl.
CPC .......... *F21S 8/026* (2013.01); *F21S 2/00* (2013.01); *F21S 8/046* (2013.01); *F21S 9/022* (2013.01);
(Continued)

(58) Field of Classification Search
CPC ........ H05B 45/10; H05B 45/37; H05B 45/39; H05B 45/40; H05B 45/42; H05B 45/50;
(Continued)

(56) References Cited

U.S. PATENT DOCUMENTS 3,582,932 A 6/1971 Chapman
3,712,706 A 1/1973 Stamm
(Continued)

FOREIGN PATENT DOCUMENTS

AU 2003100206 4/2003
AU 2003100206 7/2003
(Continued)

OTHER PUBLICATIONS

Petition for Inter Partes Review, *Home Depot USA, Inc.*, Petitioner, v. *Lynk Labs, Inc.*, Patent Owner, Case IPR2021-001368 U.S. Pat. No. 10,757,783, Issue Date Aug. 25, 2020, Title: "Color Temperature Controlled and Low THD LED Lighting Devices and Driving the Same," 95 pages dated Aug. 18, 2021.
(Continued)

*Primary Examiner* — Haissa Philogene
(74) *Attorney, Agent, or Firm* — K&L Gates LLP

(57) ABSTRACT

A lighting system includes an LED downlight mountable to a ceiling, a driver, and an insulation displacement connector (IDC). Light from the downlight can be faced downward to project light or upward to reflect light off of the ceiling. The driver has an input with a first voltage and an output with a second voltage, the second voltage being lower than the first and being provided through a wire system extending from the LED driver. The IDC connects the downlight to the wire system. The lighting system can be changed from a first to a second configuration by at least one of adding an additional downlight using a corresponding IDC or removing an existing downlight using a corresponding IDC. The second configuration does not significantly affect a desired output range of light from any downlight or any LED circuit of any downlight that remains or preexists from the first configuration.

1 Claim, 27 Drawing Sheets

Related U.S. Application Data

(60) Provisional application No. 62/605,890, filed on Aug. 31, 2017.

(51) Int. Cl.

| | |
|---|---|
| *F21S 9/02* | (2006.01) |
| *F21S 8/02* | (2006.01) |
| *F21S 8/04* | (2006.01) |
| *F21V 23/00* | (2015.01) |
| *F21V 25/10* | (2006.01) |
| *F21S 2/00* | (2016.01) |
| *H05B 47/19* | (2020.01) |
| *H05B 45/39* | (2020.01) |
| *H05B 45/42* | (2020.01) |
| *H05B 45/50* | (2022.01) |
| *H05B 45/37* | (2020.01) |
| *F21W 131/30* | (2006.01) |
| *F21Y 115/10* | (2016.01) |
| *F21Y 113/13* | (2016.01) |
| *F21W 131/40* | (2006.01) |
| *H01L 25/075* | (2006.01) |
| *H01L 33/62* | (2010.01) |

(52) U.S. Cl.
CPC ......... *F21V 23/001* (2013.01); *F21V 23/003* (2013.01); *F21V 23/06* (2013.01); *F21V 25/10* (2013.01); *H05B 45/37* (2020.01); *H05B 45/39* (2020.01); *H05B 45/40* (2020.01); *H05B 45/42* (2020.01); *H05B 45/50* (2020.01); *H05B 47/19* (2020.01); *F21W 2131/30* (2013.01); *F21W 2131/40* (2013.01); *F21Y 2113/13* (2016.08); *F21Y 2115/10* (2016.08); *H01L 25/0753* (2013.01); *H01L 33/62* (2013.01)

(58) Field of Classification Search
CPC ......... H05B 47/19; H05B 47/20; F21S 8/026; F21S 8/046; F21S 9/022; F21V 23/001; F21V 23/003; F21V 23/06; F21W 2131/30; F21W 2131/40; F21Y 2113/13; F21Y 2115/10

See application file for complete search history.

(56) References Cited

U.S. PATENT DOCUMENTS

| | | |
|---|---|---|
| 3,821,662 A | 6/1974 | Dewinter et al. |
| 3,981,023 A | 9/1976 | King et al. |
| 4,104,562 A | 8/1978 | DiCola |
| 4,145,655 A | 3/1979 | Caudel et al. |
| 4,170,018 A | 10/1979 | Runge |
| 4,246,533 A | 1/1981 | Chiang |
| 4,271,408 A | 6/1981 | Teshima et al. |
| 4,298,869 A | 11/1981 | Okano |
| 4,350,973 A | 9/1982 | Petryk, Jr. |
| 4,530,973 A | 7/1985 | Koster et al. |
| 4,563,592 A | 1/1986 | Yuhasz et al. |
| 4,573,766 A | 3/1986 | Bournay, Jr. et al. |
| 4,653,895 A | 3/1987 | Deguchi et al. |
| 4,654,880 A | 3/1987 | Sontag |
| 4,646,398 A | 4/1987 | Michael et al. |
| 4,656,398 A | 4/1987 | Michael et al. |
| 4,691,341 A | 9/1987 | Knoble et al. |
| 4,780,621 A | 10/1988 | Bartleucci et al. |
| 4,797,651 A | 1/1989 | Havel |
| 4,816,698 A | 3/1989 | Hook |
| RE33,285 E | 7/1990 | Kunen |
| 4,962,347 A | 10/1990 | Burroughs et al. |
| 5,010,459 A | 4/1991 | Taylor et al. |
| 5,014,052 A | 5/1991 | Obeck |
| 5,028,859 A | 7/1991 | Johnson et al. |
| 5,086,294 A | 2/1992 | Kasegi |
| 5,267,134 A | 11/1993 | Banayan |
| 5,293,494 A | 3/1994 | Saito et al. |
| 5,324,316 A | 6/1994 | Schulman et al. |
| 5,353,213 A | 10/1994 | Paulik et al. |
| 5,408,330 A | 4/1995 | Squicciarini et al. |
| 5,430,609 A | 7/1995 | Kikinis |
| 5,457,450 A | 10/1995 | Deese et al. |
| 5,463,280 A | 10/1995 | Johnson |
| 5,519,263 A | 5/1996 | Santana, Jr. |
| 5,521,652 A | 5/1996 | Shalvi |
| 5,532,641 A | 7/1996 | Balasubramanian et al. |
| 5,550,066 A | 8/1996 | Tang et al. |
| 5,562,240 A | 10/1996 | Campbell |
| 5,596,567 A | 1/1997 | DeMuro et al. |
| 5,621,225 A | 4/1997 | Shieh et al. |
| 5,652,609 A | 7/1997 | Scholler et al. |
| 5,657,054 A | 8/1997 | Files et al. |
| 5,661,645 A | 8/1997 | Hochstein |
| 5,663,719 A | 9/1997 | Deese et al. |
| 5,684,738 A | 11/1997 | Au et al. |
| 5,728,432 A | 3/1998 | Imashiro et al. |
| 5,739,639 A | 4/1998 | Johnson |
| 5,785,418 A | 7/1998 | Hochstein |
| 5,790,106 A | 8/1998 | Hirano et al. |
| 5,806,965 A | 9/1998 | Deese |
| 5,828,768 A | 10/1998 | Eatwell et al. |
| 5,847,507 A | 12/1998 | Butterworth et al. |
| 5,874,803 A | 2/1999 | Garbuzov et al. |
| 5,923,239 A | 7/1999 | Krueger et al. |
| 5,946,348 A | 8/1999 | Mizutani et al. |
| 5,963,012 A | 10/1999 | Garcia et al. |
| 5,965,907 A | 10/1999 | Huang et al. |
| 5,973,677 A | 10/1999 | Gibbons |
| 5,982,103 A | 11/1999 | Mosebrook et al. |
| 5,998,925 A | 12/1999 | Shimizu et al. |
| 6,016,038 A | 1/2000 | Mueller et al. |
| 6,019,493 A | 1/2000 | Kuo et al. |
| 6,023,073 A | 2/2000 | Strite |
| 6,061,259 A | 5/2000 | DeMichele |
| 6,078,148 A | 6/2000 | Hochstein |
| 6,164,368 A | 12/2000 | Furukawa et al. |
| 6,184,628 B1 | 2/2001 | Ruthenberg |
| 6,211,626 B1 | 4/2001 | Lys et al. |
| 6,227,679 B1 | 5/2001 | Zhang et al. |
| 6,246,169 B1 | 6/2001 | Pruvot |
| 6,246,862 B1 | 6/2001 | Grivas et al. |
| 6,265,984 B1 | 7/2001 | Molinaroli |
| 6,292,901 B1 | 9/2001 | Lys et al. |
| 6,300,725 B1 | 10/2001 | Zinkler et al. |
| 6,300,748 B1 | 10/2001 | Miller |
| 6,303,238 B1 | 10/2001 | Thompson et al. |
| 6,307,757 B1 | 10/2001 | Porter et al. |
| 6,319,778 B1 | 11/2001 | Chen et al. |
| 6,323,652 B1 | 11/2001 | Collier et al. |
| 6,324,082 B1 | 11/2001 | Keller |
| 6,329,694 B1 | 12/2001 | Lee et al. |
| 6,361,886 B2 | 3/2002 | Shi et al. |
| 6,362,789 B1 | 3/2002 | Trumbull et al. |
| 6,380,693 B1 | 4/2002 | Kastl |
| 6,396,001 B1 | 5/2002 | Nakamura |
| 6,396,801 B1 | 5/2002 | Upton et al. |
| 6,404,131 B1 | 6/2002 | Kawano et al. |
| 6,411,045 B1 | 6/2002 | Nerone |
| 6,412,971 B1 | 7/2002 | Wojnarowski et al. |
| 6,439,731 B1 | 8/2002 | Johnson et al. |
| 6,441,558 B1 | 8/2002 | Muthu et al. |
| 6,456,481 B1 | 9/2002 | Stevenson |
| 6,466,198 B1 | 10/2002 | Feinstein |
| 6,489,724 B1 | 12/2002 | Smith et al. |
| 6,489,754 B2 | 12/2002 | Blom |
| 6,501,100 B1 | 12/2002 | Srivastava et al. |
| 6,507,159 B2 | 1/2003 | Muthu |
| 6,510,995 B2 | 1/2003 | Muthu et al. |
| 6,529,126 B1 | 3/2003 | Henry |
| 6,541,800 B2 | 4/2003 | Barnett |
| 6,577,072 B2 | 6/2003 | Saito et al. |
| 6,580,228 B1 | 6/2003 | Chen et al. |
| 6,600,243 B1 | 7/2003 | Hara et al. |

(56) References Cited

U.S. PATENT DOCUMENTS

| | | |
|---|---|---|
| 6,618,042 B1 | 9/2003 | Powell |
| 6,633,120 B2 | 10/2003 | Salam |
| 6,636,005 B2 | 10/2003 | Wacyk et al. |
| 6,643,336 B1 | 11/2003 | Hsieh |
| 6,663,246 B2 | 12/2003 | Currens et al. |
| 6,664,744 B2 | 12/2003 | Dietz |
| 6,686,697 B2 | 2/2004 | Cho et al. |
| 6,689,626 B2 | 2/2004 | Krijin et al. |
| 6,717,353 B1 | 4/2004 | Mueller et al. |
| 6,722,771 B1 | 4/2004 | Stephens |
| 6,774,582 B1 | 8/2004 | Kwong et al. |
| 6,781,329 B2 | 8/2004 | Mueller et al. |
| 6,803,732 B2 | 10/2004 | Kraus et al. |
| 6,814,642 B2 | 11/2004 | Siwinski et al. |
| 6,832,729 B1 | 12/2004 | Perry et al. |
| 6,844,675 B2 | 1/2005 | Yang |
| 6,850,169 B2 | 2/2005 | Manavi et al. |
| 6,856,103 B1 | 2/2005 | Hudson et al. |
| 6,879,319 B2 | 4/2005 | Cok |
| 6,879,497 B2 | 4/2005 | Hua et al. |
| 6,882,128 B1 | 4/2005 | Rahmel et al. |
| 6,891,786 B2 | 5/2005 | Sato |
| 6,907,089 B2 | 6/2005 | Jensen et al. |
| 6,936,936 B2 | 8/2005 | Fischer et al. |
| 6,949,772 B2 | 9/2005 | Shimizu et al. |
| 6,965,205 B2 | 11/2005 | Piepgras et al. |
| 6,988,053 B2 | 1/2006 | Namaky |
| 7,019,662 B2 | 3/2006 | Shackle |
| 7,038,399 B2 | 5/2006 | Lys et al. |
| 7,044,627 B2 | 5/2006 | Mertz et al. |
| 7,161,590 B2 | 1/2007 | Daniels |
| 7,176,885 B2 | 2/2007 | Troxell et al. |
| 7,180,265 B2 | 2/2007 | Naskali et al. |
| 7,202,613 B2 | 4/2007 | Morgan et al. |
| 7,213,940 B1 | 5/2007 | Van De Ven et al. |
| 7,226,442 B2 | 6/2007 | Sheppard, Jr. et al. |
| 7,226,644 B2 | 6/2007 | Sheppard, Jr. et al. |
| 7,262,559 B2 | 8/2007 | Tripathi et al. |
| 7,264,378 B2 | 9/2007 | Loh |
| 7,271,568 B2 | 9/2007 | Purdy et al. |
| 7,348,957 B2 | 3/2008 | Cui et al. |
| 7,375,476 B2 | 5/2008 | Scott et al. |
| 7,489,086 B2 | 2/2009 | Miskin et al. |
| 7,583,901 B2 | 9/2009 | Nakagawa et al. |
| 7,852,009 B2 | 12/2010 | Coleman et al. |
| RE42,161 E | 2/2011 | Hochstein |
| 7,888,882 B2 | 2/2011 | Wang et al. |
| 3,055,310 A1 | 11/2011 | Beart et al. |
| 8,080,819 B2 | 12/2011 | Mueller et al. |
| 8,148,905 B2 | 4/2012 | Miskin et al. |
| 8,179,055 B2 | 5/2012 | Miskin et al. |
| 8,326,225 B2 | 12/2012 | Oba et al. |
| 8,362,695 B2 | 1/2013 | Aanegola et al. |
| 8,373,363 B2 | 2/2013 | Zdenko |
| 8,400,081 B2 | 3/2013 | Catalano et al. |
| 8,471,495 B2 | 6/2013 | Muguruma et al. |
| 8,587,205 B2 | 11/2013 | Ter Weeme et al. |
| 9,112,957 B2 | 9/2015 | Beart et al. |
| 9,198,237 B2 | 11/2015 | Miskin |
| 9,615,420 B2 | 4/2017 | Miskin |
| 9,644,828 B1* | 5/2017 | May ................ F21V 23/02 |
| 9,807,827 B2 | 10/2017 | Miskin et al. |
| 10,091,842 B2 | 10/2018 | Miskin et al. |
| 10,154,551 B2 | 12/2018 | Miskin et al. |
| 10,178,715 B2 | 1/2019 | Miskin et al. |
| 10,349,479 B2 | 7/2019 | Miskin et al. |
| 10,492,251 B2 | 11/2019 | Miskin et al. |
| 10,492,252 B2 | 11/2019 | Miskin et al. |
| 10,499,466 B1 | 12/2019 | Miskin et al. |
| 10,506,674 B2 | 12/2019 | Miskin et al. |
| 10,517,149 B2 | 12/2019 | Miskin et al. |
| 10,537,001 B2 | 1/2020 | Miskin et al. |
| 10,575,376 B2 | 2/2020 | Miskin et al. |
| 10,687,400 B2 | 6/2020 | Miskin et al. |
| 10,750,583 B2 | 8/2020 | Miskin |
| 10,757,783 B2 | 8/2020 | Miskin et al. |
| 10,914,890 B1* | 2/2021 | Schmidt ............. G02B 6/0063 |
| 10,932,341 B2 | 2/2021 | Miskin et al. |
| 10,966,298 B2 | 3/2021 | Miskin et al. |
| 11,019,697 B2 | 5/2021 | Miskin et al. |
| 11,079,077 B2* | 8/2021 | Miskin ................... F21S 2/00 |
| 2001/0005319 A1 | 6/2001 | Ohishi et al. |
| 2002/0014630 A1 | 2/2002 | Okazaki et al. |
| 2002/0021573 A1 | 2/2002 | Zhang |
| 2002/0030193 A1 | 3/2002 | Yamazaki et al. |
| 2002/0030194 A1 | 3/2002 | Camras et al. |
| 2002/0048169 A1 | 4/2002 | Dowling et al. |
| 2002/0048177 A1 | 4/2002 | Rahm et al. |
| 2002/0060530 A1 | 5/2002 | Sembhi et al. |
| 2002/0070914 A1 | 6/2002 | Bruning et al. |
| 2002/0072395 A1 | 6/2002 | Miramontes |
| 2002/0080010 A1 | 6/2002 | Zhang |
| 2002/0081982 A1 | 6/2002 | Schwartz et al. |
| 2002/0086702 A1 | 7/2002 | Lai et al. |
| 2002/0113244 A1 | 8/2002 | Barnett et al. |
| 2002/0113246 A1 | 8/2002 | Nagai et al. |
| 2002/0118557 A1 | 8/2002 | Ohlsson |
| 2002/0130627 A1 | 9/2002 | Morgan |
| 2002/0137258 A1 | 9/2002 | Akram |
| 2002/0145392 A1 | 10/2002 | Hair et al. |
| 2002/0149572 A1 | 10/2002 | Schulz et al. |
| 2002/0158590 A1 | 10/2002 | Saito et al. |
| 2002/0163006 A1 | 11/2002 | Sundar et al. |
| 2002/0167016 A1 | 11/2002 | Hoelen et al. |
| 2002/0175870 A1 | 11/2002 | Gleener |
| 2002/0176259 A1 | 11/2002 | Ducharme |
| 2002/0187675 A1 | 12/2002 | McMullin et al. |
| 2002/0191029 A1 | 12/2002 | Gillespie et al. |
| 2002/0195968 A1 | 12/2002 | Sanford et al. |
| 2003/0001657 A1 | 1/2003 | Worley, Sr. et al. |
| 2003/0011972 A1 | 1/2003 | Koo |
| 2003/0015968 A1 | 1/2003 | Allen |
| 2003/0020629 A1 | 1/2003 | Swartz et al. |
| 2003/0035075 A1 | 2/2003 | Butler et al. |
| 2003/0038291 A1 | 2/2003 | Cao |
| 2003/0043611 A1 | 3/2003 | Bockle et al. |
| 2003/0063462 A1 | 4/2003 | Shimuzu et al. |
| 2003/0072145 A1 | 4/2003 | Nolan et al. |
| 2003/0076306 A1 | 4/2003 | Zadesky et al. |
| 2003/0085621 A1 | 5/2003 | Potega |
| 2003/0085870 A1 | 5/2003 | Hinckley |
| 2003/0102810 A1 | 6/2003 | Cross et al. |
| 2003/0122502 A1 | 7/2003 | Clauberg et al. |
| 2003/0137258 A1 | 7/2003 | Piepgras et al. |
| 2003/0144034 A1 | 7/2003 | Hack et al. |
| 2003/0146897 A1 | 8/2003 | Hunter |
| 2003/0185005 A1 | 10/2003 | Sommers et al. |
| 2003/0230934 A1 | 12/2003 | Cordelli et al. |
| 2003/0231168 A1 | 12/2003 | Bell et al. |
| 2003/0234621 A1 | 12/2003 | Kriparos |
| 2004/0022058 A1 | 2/2004 | Birrell |
| 2004/0041620 A1 | 3/2004 | D'Angelo et al. |
| 2004/0108997 A1 | 6/2004 | Lee |
| 2004/0130909 A1 | 7/2004 | Mueller et al. |
| 2004/0150994 A1 | 8/2004 | Kazar et al. |
| 2004/0164948 A1 | 8/2004 | Kabel et al. |
| 2004/0206970 A1 | 10/2004 | Martin |
| 2004/0207484 A1 | 10/2004 | Forrester et al. |
| 2004/0212321 A1 | 10/2004 | Lys et al. |
| 2004/0263084 A1 | 12/2004 | Mor et al. |
| 2004/0266349 A1 | 12/2004 | Wang |
| 2005/0001225 A1 | 1/2005 | Koshimura et al. |
| 2005/0058852 A1 | 3/2005 | Tyan et al. |
| 2005/0078093 A1 | 4/2005 | Peterson et al. |
| 2005/0111234 A1 | 5/2005 | Martin et al. |
| 2005/0116235 A1 | 6/2005 | Schultz et al. |
| 2005/0116667 A1* | 6/2005 | Mueller ................ E04F 15/02 |
| | | 315/312 |
| 2005/0128751 A1 | 6/2005 | Roberge et al. |
| 2005/0158590 A1 | 7/2005 | Li |
| 2005/0185401 A1 | 8/2005 | Jiang et al. |
| 2005/0231133 A1 | 10/2005 | Lys |
| 2005/0276053 A1 | 12/2005 | Nortrup et al. |
| 2006/0091415 A1 | 5/2006 | Yan |

(56) References Cited

U.S. PATENT DOCUMENTS

| | | |
|---|---|---|
| 2006/0099994 A1 | 5/2006 | Yang et al. |
| 2006/0163589 A1 | 7/2006 | Fan et al. |
| 2006/0226795 A1 | 10/2006 | Walter et al. |
| 2007/0024213 A1 | 2/2007 | Shtenyberg et al. |
| 2007/0171145 A1 | 7/2007 | Coleman et al. |
| 2007/0273299 A1 | 11/2007 | Miskin et al. |
| 2007/0290625 A1 | 12/2007 | He |
| 2008/0218995 A1 | 9/2008 | Gilkey |
| 2009/0017433 A1 | 1/2009 | Belsky et al. |
| 2009/0160358 A1 | 6/2009 | Slava |
| 2009/0167202 A1 | 7/2009 | Miskin et al. |
| 2009/0174337 A1 | 7/2009 | Miskin et al. |
| 2010/0134038 A1 | 6/2010 | Shackle |
| 2010/0141177 A1 | 6/2010 | George |
| 2011/0193484 A1 | 8/2011 | Harbers et al. |
| 2011/0273098 A1 | 11/2011 | Grajcar |
| 2012/0069560 A1 | 3/2012 | Miskin et al. |
| 2012/0081009 A1 | 4/2012 | Shteynberg et al. |
| 2012/0293083 A1 | 11/2012 | Miskin et al. |
| 2013/0051001 A1 | 2/2013 | Miskin |
| 2014/0153232 A1 | 6/2014 | Miskin et al. |
| 2014/0361697 A1 | 12/2014 | Miskin et al. |
| 2016/0095180 A1 | 3/2016 | Miskin |
| 2016/0143097 A1 | 5/2016 | Miskin |
| 2016/0188426 A1 | 6/2016 | Kousha |
| 2017/0354005 A1 | 12/2017 | Miskin et al. |
| 2019/0045593 A1 | 2/2019 | Miskin et al. |
| 2019/0182919 A1 | 6/2019 | Miskin et al. |
| 2019/0268982 A1 | 8/2019 | Miskin et al. |
| 2019/0306940 A1 | 10/2019 | Miskin et al. |
| 2019/0313491 A1 | 10/2019 | Miskin et al. |
| 2019/0350053 A1 | 11/2019 | Miskin et al. |

FOREIGN PATENT DOCUMENTS

| | | |
|---|---|---|
| AU | 2003100206 | 7/2013 |
| CN | 1341966 A | 3/2002 |
| EP | 0515664 | 12/1992 |
| EP | 1160883 | 12/2001 |
| EP | 1502483 | 2/2005 |
| EP | 1 953 825 B1 | 8/2008 |
| EP | 1953825 | 8/2008 |
| EP | 1953825 B1 | 7/2013 |
| GB | 2202414 | 3/1987 |
| GB | 2202414 | 9/1988 |
| GB | 2202414 A | 9/1988 |
| GB | 2264555 | 9/1993 |
| GB | 2372609 | 8/2002 |
| IL | 123123 | 3/2004 |
| JP | H08149063 | 6/1996 |
| JP | 2000030877 | 1/2000 |
| JP | 200050512 | 2/2000 |
| JP | 2000278383 A | 10/2000 |
| JP | 2001004753 A | 1/2001 |
| JP | 2001176677 | 6/2001 |
| JP | 2001284065 | 12/2001 |
| JP | 2002050798 A | 2/2002 |
| JP | 2002208301 A | 7/2002 |
| JP | 2003047177 A | 2/2003 |
| JP | 2004-111104 | 4/2004 |
| JP | 2005-524960 | 8/2005 |
| JP | 2011-040701 | 2/2011 |
| JP | 2011159495 | 8/2011 |
| KR | 100367215 B1 | 1/2003 |
| KR | 20030073747 A | 9/2003 |
| WO | 9750168 | 12/1997 |
| WO | 1997050168 | 12/1997 |
| WO | 9939319 | 8/1999 |
| WO | 0101385 | 1/2001 |
| WO | 2001001385 | 1/2001 |
| WO | 0221741 A1 | 3/2002 |
| WO | 0223956 | 3/2002 |
| WO | 2002023956 | 3/2002 |
| WO | WO02/23956 | 3/2002 |
| WO | 0231406 | 4/2002 |
| WO | 02062623 | 8/2002 |
| WO | 03009535 A1 | 1/2003 |
| WO | 03/026358 | 3/2003 |
| WO | 2004055654 A2 | 7/2004 |
| WO | 2005084080 | 9/2005 |
| WO | 2006023149 | 3/2006 |
| WO | 2010016002 | 2/2010 |
| WO | 2010138211 | 2/2010 |
| WO | 2010035155 | 4/2010 |
| WO | 2010103480 | 9/2010 |
| WO | 2010126601 | 11/2010 |
| WO | 20101266011 | 11/2010 |
| WO | 2010138211 | 12/2010 |
| WO | 20100138211 | 12/2010 |
| WO | 2011082168 | 7/2011 |
| WO | 2011/143510 | 11/2011 |
| WO | 2011143510 | 11/2011 |
| WO | 20110143510 | 11/2011 |
| WO | 2013026053 | 2/2013 |
| WO | 2013082609 | 6/2013 |

OTHER PUBLICATIONS

Petitioners' Power of Attorney, *Home Depot USA, Inc.*, Petitioner, v. *Lynk Labs, Inc.*, Patent Owner, Case IPR2021-001368 U.S. Pat. No. 10,757,783, Issue Date Aug. 25, 2020, Title: "Color Temperature Controlled and Low THD LED Lighting Devices and Driving the Same," 2 pages dated Aug. 17, 2021.

Declaration of Dr. Lebby U.S. Pat. No. 10,757,783 dated Aug. 18, 2021, 187 pages—Ex 1002.

U.S. Appl. No. 16/440,884, filed Jun. 13, 2019, 341 pages—Ex 1003.

Institute of Transportation Engineers, Publication No. ST-017B 300/IG/102, ISBN 0-935403-16-7 (1998), 25 pages—Ex 1007.

Complaint for Patent Infringement *Lynk Labs, Inc.* v. *Home Depot USA Inc.*, The Home Depot Inc., and Home Depot Product Authority, LLC, Case No. 6:21-cv-00097, filed Jan. 29, 2021, 86 pages—Ex. 1010.

U.S. Appl. No. 61/630,025, filed Dec. 2, 2011, 39 pages—Ex 1012.

U.S. Appl. No. 61/570,200, filed Dec. 13, 2011, 51 pages—Ex 1013.

Plaintiff Lynk Labs, Inc.'s Amended Preliminary Infringement Contentions, Case No. 6:21-cv-00097-ADA, dated Jun. 23, 2021, 7 pages—Ex 1019.

Okon et al., "The First Practical LED", Received: Nov. 9, 2015, 14 pages—Ex 1020.

Scheduling Order, Case No. 6:21-cv-00097-ADA filed Aug. 13, 2021, 4 pages—Ex 1021.

U.S. Appl. No. 61/233,829, filed Aug. 14, 2009, 36 pages—Ex 1022.

*Samsung Electronics Co., Ltd.* v. *Lynk Labs, Inc.* U.S. Pat. No. 10,517,149 Petition for Inter Partes Review of U.S. Pat. No. 10,517,149, 98 pages.

*Samsung Electronics Co., Ltd.* v. *Lynk Labs, Inc.* U.S. Pat. No. 10,517,149 Power of Attorney for Petitioner Samsung Electronics Co., Ltd. 3 pages.

*Samsung Electronics Co., Ltd. et al.* v. *Lynk Labs, Inc.* Case IPR2022-00098, U.S. Pat. No. 10,4517,149 Notice of Filing Date Accorded to Petition, mailed Nov. 23, 2021, 6 pages.

*Samsung Electronics Co., Ltd.* v. *Lynk Labs, Inc.* Case: IPR2022-00098, U.S. Pat. No. 10,517,149 Patent Owner's Mandatory Notices Pursuant to 37 C.F.R. Section 42.8, 5 pages.

*Samsung Electronics Co., Ltd.* v. *Lynk Labs, Inc.*, U.S. Pat. No. 10,517,149 Declaration of R. Jacob Baker, Ph.D., P.E. In Support of Petition for Inter Partes Review of U.S. Pat. No. 10,517,149, 179 pages—Ex. 1002.

R. Jacob (Jake) Baker, Ph D., P.E. CV, 37 pages—Ex. 1003.

File History of U.S. Pat. No. 10,517,149, 359 pages—Ex. 1004.

Watson Mastering Electronics, Third Edition, pp. 1-151—Ex. 1018.

PCT File History US/2010/62235, filed Dec. 28, 2010—Ex. 1039.

PCT File History US/2010/001597, filed May 28, 2010—Ex. 1043.

PCT File History US/2010/001269, filed Apr. 30, 2010—Ex. 1044.

U.S. Appl. No. 61,333,963, filed May 12, 2010—Ex. 1046.

U.S. Appl. No. 61/284,927, filed Dec. 28, 2009—Ex. 1047.

(56) References Cited

OTHER PUBLICATIONS

U.S. Appl. No. 60/335,963, filed Dec. 31, 2009—Ex. 1048.
U.S. Appl. No. 60/997,771, filed Oct. 6, 2007—Ex. 1049.
U.S. Appl. No. 60/547,653, filed Feb. 25, 2004—Ex. 1050.
U.S. Appl. No. 60/559,867, filed Feb. 25, 2004—Ex. 1051.
U.S. Appl. No. 61/217,215, filed May 28, 2009—Ex. 1052.
U.S. Appl. No. 61/215,144, filed May 1, 2009—Ex. 1053.
Civil Docket for Case# 6:21-cv-02665, Northern District of Illinois, Samsung Electronics. Co., Ltd., filed May 17, 2021, 14 pages—Ex. 1061.
US District Court for the Northern District of Illinois, Estimated Patent Case Schedule, 2 pages—Ex. 1062.
*Samsung Electronics Co., Ltd. and Samsung Electronics America, Inc., v. Lynk Labs, Inc.*, Case No. 1:21-cv-02665—Defendant Lynk Labs, Inc.'s Amended Preliminary Infringement Contentions, Aug. 31, 2021 9 pages—Ex. 1066.
Sedra/Smith, "Microelectronic Circuits," Fourth Edition, Part 1 of 4, pp. 1-161—Ex. 1041, Ex. 1061, Ex. 1054.
Sedra/Smith, "Microelectronic Circuits," Fourth Edition, Part 2 of 4, pp. 162-1048 pages—Ex. 1041, Ex. 1061, Ex. 1054.
Sedra/Smith, "Microelectronic Circuits," Fourth Edition, Part 3 of 4, pp. 1049-1230 pages—Ex. 1041, Ex. 1061, Ex. 1054.
Sedra/Smith, "Microelectronic Circuits," Fourth Edition, Part 4 of 4, pp. 1231-1237 pages—Ex. 1041, Ex. 1061, Ex. 1054.
*Samsung Electronics Co., Ltd. and Samsung Electronics America, Inc., v. Lynk Labs, Inc.*, Case No. 1:21-cv-02665—Defendant Lynk Labs, Inc.'s Amended Preliminary Infringement Contentions, 9 pages—Ex. 1066.
U.S. Pat. No. 10,517,149 ("the '149 Patent") Exemplary Infringement Contention Claim Charts, Appendix A-5 through I-3—Ex. 1067.
*Samsung Electronics Co., Ltd. et al. v. Lynk Labs, Inc.* Case No. 1:21-cv-02665, Notification of Docket Entry Jul. 27, 2021, 1 page—Ex. 1068.
*Samsung Electronics Co., Ltd. et al. v. Lynk Labs, Inc.* Case No. 1:21-cv-02665, Scheduling Order dated Aug. 19, 2021, 2 pages—Ex. 1069.
Civil Docket for Case# 6:21-cv-00097-ADA, Western District of Texas (Waco)—Lynk Labs, Inc. filed Jan. 29, 2001, 9 pages—Ex. 1074.
*Samsung Electronics Co., Ltd. et al. v. Lynk Labs, Inc.* Case No. 1:21-cv-02665, Notification of Docket Entry Oct. 18, 2021, 1 page—Ex. 1070.
*Samsung Electronics Co., Ltd. and Samsung Electronics America, Inc., v. Lynk Labs, Inc.*, Case No. 1:21-cv-02665—Defendant Lynk Labs, Inc's Answer to Plaintiffs Samsung Electronics Co., Ltd. and Samsung Electronics America, Inc.'s First Amended Complaint and Counterclaims, filed Aug. 3, 2021, 67 pages—Ex. 1071.
*Lynk Labs, Inc., v. Home Dept USA, Inc., The Home Depot Inc., and Home Depot Product Authority, LLC*, Case. No. 6:21-cv-00097, Complaint for Patent Infringement dated Jan. 29, 2021, 88 page—Ex. 1072.
*Lynk Labs, Inc., v. Home Dept USA, Inc., The Home Depot Inc., and Home Depot Product Authority, LLC*, Case. No. 6:21-cv-00097-ADA, First Amended Complaint for Patent Infringement dated Mar. 17, 2021, 94 pages—Ex. 1073.
*Samsung Electronics Co., Ltd. and Samsung Electronics America, Inc., v. Lynk Labs, Inc.*, Case No. 1:21-cv-02665—Supplemental Report of Parties' Planning Meeting, filed Oct. 14, 2021, 11 pages—Ex. 1075.
Tim Williams, The Circuit Designer's Companion, First Published 1991, ISBN 0 7506 1142 1, 314 pages—Ex. 1094.
Petition for Inter Partes Review, *Home Depot USA, Inc.*, Petitioner, v. *Lynk Labs, Inc.*, Patent Owner, Case IPR2021-001367 U.S. Pat. No. 10,154,551, Issue Date Dec. 11, 2018, Title: "AC Light Emitting Diode and AC LED Drive Methods and Apparatus," 93 pages dated Aug. 18, 2021.
Petitioners' Power of Attorney, *Home Depot USA, Inc.*, Petitioner, v. *Lynk Labs, Inc.*, Patent Owner, Case IPR2021-001367 U.S. Pat. No. 10,154,551, Issue Date Dec. 11, 2018, Title: "AC Light Emitting Diode and AC LED Drive Methods and Apparatus," 2 pages dated Aug. 17, 2021.
Declaration of Dr. Dean Neikirk—U.S. Pat. No. 10,154,551, Claims 1, 3, 4, 5, 7, 8—141 pages—Ex 1002.
U.S. Appl. No. 15/797,806—Now U.S. Pat. No. 10154551—Ex 1003.
U.S. Appl. No. 11/066,414—Now U.S. Pat. No. 7,489,086 issued Feb. 10, 2009—Ex 1005.
IEEE 100, The Authoritative Dictionary of IEEE Standards Terms—Seventh Edition, 3 pages—Ex 1010.
Complaint for Patent Infringement *Lynk Labs, Inc.* Plaintiff v. *Home Depot USA, Inc., The Home Depot Inc., and Home Depot Product Authority, LLC* Defendants, Case No. 6:21-cv-00097, filed Jan. 20, 2021—Ex. 1011.
Azazi et al., "Review of Passive and Active Circuits for Power Factor Correction in Single Phase, Low Power AC-DC Converters," Proceedings of the 14th International Middle East Power Systems Conference (MEPCON'10) Cairo University, Egypt, Dec. 19-21, 2010, Paper ID 154, 8 pages—Ex 1016.
U.S. Appl. No. 60/547,653, filed Feb. 25, 2004—Ex 1017.
U.S. Appl. No. 60/559,867, filed Feb. 25, 2004—Ex 1018.
U.S. Appl. No. 60/997,771, filed Oct. 6, 2007—Ex 1019.
U.S. Appl. No. 61/215,144, filed May 1, 2009—Ex 1022.
U.S. Appl. No. 61/217,215, filed May 28, 2009—Ex 1023.
U.S. Appl. No. 61/284,927, filed Dec. 28, 2009—Ex 1024.
U.S. Appl. No. 61/335,069, filed Dec. 31, 2009—Ex 1025.
U.S. Appl. No. 61/333,963, filed May 12, 2010—Ex 1026.
Plaintiff Lynk Labs, Inc.'s Amended Preliminary Infringement Contentions, Case No. 6:21-cv-00097-ADA filed Jun. 23, 2021, 7 pages—Ex 1034.
U.S. Appl. No. 60/379,079, filed May 9, 2002—Ex 1035.
U.S. Appl. No. 60/391,627, filed Jun. 26, 2002—Ex 1036.
Institute of Transportation Engineers Publication No. ST-017B, 1997 ISBN: 0-935403-16-7, ITE Specification (183369415.1), Chapter 2 Vehicle Traffic Control Signal Heads, 25 pages—Ex 1038.
Osorno, "Fourier Analysis of a Single-Phase Full Bridge Rectifier Using Matlab," California State University Northridge, 2002-774, 9 pages—Ex 1039.
Scheduling Order *Lynk Labs, Inc.* Plaintiff v. *Home Depot USA, Inc., The Home Depot Inc., and Home Depot Product Authority, LLC* Defendants, Case No. 6:21-cv-00097, filed Aug. 13, 2021—Ex. 1040.
Vachak et al., "Power Factor Correction Circuits: Active Filters," International Journal of Engineering Research and General Science, vol. 2, Issue 5, Aug.-Sep. 2014, ISSAN 2091-2730, 9 pages—Ex 1041.
*Home Depot U.S.A., Inc., v. Lynk Labs, Inc.*, U.S. Pat. No. 10,932,341, Filing Date: Jan. 10, 2020, Issue Date: Feb. 23, 2021—PGR2022-00009; Declaration of Dr. Dean Neikirk U.S. Pat. No. 10,932,341, 140 pages—Ex. 1002.
*Home Depot U.S.A., Inc., v. Lynk Labs, Inc.*, U.S. Pat. No. 10,932,341, Filing Date: Jan. 10, 2020, Issue Date: Feb. 23, 2021—PGR2022-00009; Petition for Post Grant Review of U.S. Pat. No. 10,932,341, 94 pages.
U.S. Appl. No. 16/740,295, filed Jan. 10, 2020 (Part 1) 768 pages—Ex. 1003.
U.S. Appl. No. 16/740,295, filed Jan. 10, 2020 (Part 2) 466 pages—Ex. 1003.
*Lynk Labs, Inc., v. Home Depot USA, Inc., The Home Depot Inc., and Home Depot Product Authority, LLC*, Case No. 6:21-cv-00097, Complaint for Patent Infringement dated Jan. 29, 2021—Ex. 1011.
*Lynk Labs, Inc., v. Home Depot USA, Inc., The Home Depot Inc., and Home Depot Product Authority, LLC*, Case No. 6:21-cv-00097-ADA, Plaintiff Lynk Labs, Inc.'s Amended Preliminary Infringement Contentions, dated Jun. 23, 2021, 241 pages—Ex. 1012.
*Lynk Labs, Inc., v. Home Depot USA, Inc., The Home Depot Inc., and Home Depot Product Authority, LLC*, Case No. 6:21-cv-00097-ADA, Scheduling Order filed Aug. 13, 2021, 4 pages—Ex. 1013.
U.S. Appl. No. 61/217,215, filed May 28, 2009, 32 pages—Ex. 1014.
U.S. Appl. No. 60/997,771, filed Oct. 6, 2007, 24 pages—Ex. 1015.

(56) References Cited

OTHER PUBLICATIONS

*Lynk Labs, Inc., v. Home Depot USA, Inc., The Home Depot Inc., and Home Depot Product Authority, LLC*, Case No. 6:21-cv-00097-ADA, Defendants' Opening Claim Construction Brief on the Terms of U.S. Pat. Nos. 10,091,842, 10,154,551, 10,349,479, 10,492,251, 10,517,149, 10,537,001, 10,652,979, 10,757,783, and 10,932,341 filed Oct. 6, 2021, 38 pages—Ex. 1021.
*Lynk Labs, Inc., v. Home Depot USA, Inc., The Home Depot Inc., and Home Depot Product Authority, LLC*, Case No. 6:21-cv-00097-ADA, Plaintiff Lynk Labs, Inc.'s Responsive Claim Construction Brief filed Oct. 27, 2021, 47 pages—Ex. 1022.
Application Multi-Voltage and Multi-Brightness LED Lighting Devices and Methods of Using Same, Remarks filed Jun. 13, 2019 12 pages—Ex. 1023.
U.S. Appl. No. 15/369,218 Non-Final Office Action dated Oct. 2, 2018—Ex. 1024.
Response to Office Action U.S. Appl. No. 16/440,884, filed Aug. 22, 2019, 11 pages—Ex. 1026.
IEEE 100 The Authoritative Dictionary of IEEE Standards Terms Seventh Edition, Published by Standards Information Network IEEE Press, 3 pages—Ex. 1028.
Response to Office Action U.S. Appl. No. 16/440,884, filed Jun. 16, 2020, 8 pages—Ex. 1029.
*Home Depot USA, Inc., v. Lynk Labs, Inc.*, Case PGR2022-00009, U.S. Pat. No. 10,932,341, Patent Owner's Mandatory Notices Pursuant to 37 C.F.R. Section 42.8 dated Nov. 19, 2021, 5 pages.
*Home Depot USA, Inc., v. Lynk Labs, Inc.*, Case PGR2022-00009, U.S. Pat. No. 10,932,341, Issue Date Feb. 23, 2021, Petitioner's Power of Attorney dated Nov. 5, 2021, 2 pages.
*Home Depot U.S.A., Inc., v. Lynk Labs, Inc.*, U.S. Pat. No. 10,932,341, Filing Date: Jan. 10, 2020, Issue Date Feb. 23, 2021, IPR 2022-00143, Petition for Inter Partes Review of U.S. Pat. No. 10,932,341 dated Nov. 24, 2021, 81 pages.
Petition for Inter Partes Review, *Home Depot USA, Inc.*, Petitioner, v. *Lynk Labs, Inc.*, Patent Owner, Case IPR2021-01370 U.S. Pat. No. 10,349,479, Issue Date Jul. 9, 2019, Title: "Color Temperature Controlled and Low THD LED Lighting Devices and Systems and Methods of Driving the Same," 52 pages dated Aug. 18, 2021.
Petitioners' Power of Attorney, *Home Depot USA, Inc.*, Petitioner, v. *Lynk Labs, Inc.*, Patent Owner, Case IPR2021-01370 U.S. Pat. No. 10,349,479, Issue Date Jul. 9, 2019, Title: "Color Temperature Controlled and Low THD LED Lighting Devices and Systems and Methods of Driving the Same," 2 pages dated Aug. 17, 2021.
Declaration of Dr. Dean Neikirk U.S. Pat. No. 10,349,479, Inter Partes Review No. IPR2021-01370, 98 pages—Ex 1002.
U.S. Appl. No. 15/369,218, filed Dec. 5, 2016, 617 pages—Ex 1003.
U.S. Appl. No. 61/630,025, filed Dec. 2, 2011, 39 pages—Ex 1011.
U.S. Appl. No. 61/570,200, filed Dec. 13, 2011, 51 pages—Ex 1012.
Complaint for Patent Infringement, Case No. 6:21-cv-00097, *Lynk Labs, Inc. v. Home Depot USA, Inc., The Home Depot Inc., and Home Depot Product Authority, LLC*, dated Jan. 29, 2021, 88 pages—Ex 1014.
Plaintiff Amended Preliminary Infringement Contentions, Lynk Lab's, Inc.'s, Case No. 6:21-cv-00097-ADA, *Lynk Labs, Inc. v. Home Depot USA, Inc., The Home Depot Inc., and Home Depot Product Authority, LLC*, dated Jun. 23, 2021, 7 pages—Ex 1015.
Scheduling Order, Case No. 6:21-cv-00097-ADA, *Lynk Labs, Inc. v. Home Depot USA, Inc., The Home Depot Inc., and Home Depot Product Authority, LLC*, filed Aug. 13, 2021, 4 pages—Ex 1016.
U.S. Pat. No. 10,966,298 ('298 Patent)—Exhibit H-06—Mac Powerbook G3.
U.S. Pat. No. 10,966,298 ('298 Patent)—Exhibit H-07—iPod G3.
U.S. Pat. No. 10,966,298 ('298 Patent)—Exhibit H-08—iPAQ H5500.
U.S. Pat. No. 11,019,697 ('697 Patent)—Exhibit I-01—Piepgrass.
U.S. Pat. No. 11,019,697 ('697 Patent)—Exhibit I-02—Hitachi.
U.S. Pat. No. 11,019,697 ('697 Patent)—Exhibit I-03—Mueller.
U.S. Pat. No. 11,019,697 ('697 Patent)—Exhibit I-04—NEC.
U.S. Pat. No. 11,019,697 ('697 Patent)—Exhibit I-05—Miskin '299.
U.S. Pat. No. 11,019,697 ('697 Patent)—Exhibit I-06—Mac Powerbook G3.
U.S. Pat. No. 11,019,697 ('697 Patent)—Exhibit I-07—iPod G3.
U.S. Pat. No. 11,019,697 ('697 Patent)—Exhibit I-08—iPAQ H5500.
Macintosh PowerBook G3, 1999.
Apple iPod Third Generation User's Guide, released Apr. 29, 2003.
"HP iPAQ Pocket PC H5500," GadgetSpeak, published Nov. 6, 2003.
Light-Emitting Diodes by E. Fred Schubert, published in 2003 ("Schubert").
Fundamentals of LED Drivers by A. Hernandez et al., published in 2003 ("Hernandez").
Color System by Kinetics iColor MR Data Sheet.
WDS Wireless Dimming System Operator's Manual published in 2003 ("WDS-Manual").
AND8137/D—High Current LED—Isolated Low Voltage AC Drive—Application Note by Cari Walding, published in Oct. 2003 ("AND8137/D").
Characteristics of high-efficient InGaN-based white LED lighting by Yuji Uchida, published in 2011 ("Uchida").
*Home Depot U.S.A., Inc. v. Lynk Labs, Inc.* Case IPR 2022-00023 U.S. Pat. No. 10,517,149, Issue Date Dec. 24, 2019, Declaration of Dr. Lebby dated Oct. 20, 2021, 157 pages—Ex. 1002.
*Lynk Labs, Inc., v. Home Depot USA, Inc., The Home Dept Inc., and Home Depot Product Authority, LLC* Case No. 6:21-cv-00097-ADA Scheduling Order filed Aug. 13, 2021, 4 pages—Ex. 1003.
*Lynk Labs, Inc., v. Home Depot USA, Inc., The Home Dept Inc., and Home Depot Product Authority, LLC* Case No. 6:21-cv-00097 Complaint for Patent Infringement dated Jan. 29, 2021, 88 pages—Ex. 1004.
*Lynk Labs, Inc. v. Home Depot USA, Inc., The Home Dept Inc., and Home Depot Product Authority, LLC* Case No. 6:21-cv-00097-ADA Plaintiff Lynk Labs, Inc,'s Amended Preliminary Infringement Contentions '149 Patent dated Jun. 23, 2021, 154 pages—Ex. 1005.
U.S. Appl. No. 16/215,502, filed Dec. 10, 2018, 359 pages—Ex. 1006.
IEEE 100 The Authoritative Dictionary of IEEE Standards Terms, Seventh Edition, Published by Standards Informaiton Network IEEE Press, pp. 1-4—Ex. 1007.
*Lynk Labs, Inc. v. Home Depot USA, Inc., The Home Dept Inc., and Home Depot Product Authority, LLC* Case No. 6:21-cv-00097-ADA Defendants' Opening Claim Construction Brief on the Terms of U.S. Patent Nos. 10,091,842, 10,154,551, 10,349,479, 10,492,251, 10,517,149, 10,537,001, 10,652,979, 10,757,783 and 10,932,341 filed Oct. 6, 2021, 38 pages—Ex. 1015.
U.S. Appl. No. 16/274,164, filed Feb. 12, 2019, 543 pages—Ex. 1016.
Heat Sink, Merriam-Webster; Examples of heat sink in a sentence, http://wwwmerriam-webster.com/dictionary/heat%20sink, 7 pages—Ex. 1017.
Insulator, Britannica Online Encyclopedia Full Article, http://www.britannica.com/print/article/289459, 2 pages—Ex. 1018.
*Home Depot USA, Inc., v. Lynk Labs, Inc.* Case IPR2022-00023 U.S. Pat. No. 10,517,149 Issue Date Dec. 24, 2019, Petition for Inter Partes Review dated Oct. 20, 2021, 74 pages.
*Home Depot USA, Inc., v. Lynk Labs, Inc.* Case IPR2022-00023 U.S. Pat. No. 10,517,149 Issue Date Dec. 24, 2019, Petitioner's Power of Attorney dated Oct. 20, 2021, 2 pages.
*Home Depot USA, Inc., v. Lynk Labs, Inc.* Case IPR2022-00023 U.S. Pat. No. 10,517,149 Issue Date Dec. 24, 2019, Patent Owner's Mandatory Notices Pursuant to 37 C.F.R. Section 42.8 dated Nov. 10, 2021, 5 pages.
*Samsung Electronics Co., Ltd. and Samsung Electronics America, Inc. v. Lynk Labs, Inc.*, Case No. 1:21-cv-02665, Samsung's Final Unenforcebility and Invalidity Contentions, dated Apr. 1, 2022—52 pages.
*Home Depot USA, Inc., v. Lynk Labs, Inc.* Case IPR2021-01540, U.S. Pat. No. 10,091,842—Declaration of Dr. Lebby Bsue Date Oct. 2, 2018—158 pages—Ex. 1002.
U.S. Appl. No. 15/334,029, filed Oct. 25, 2016—646 pages—Ex. 1003.

(56) References Cited

OTHER PUBLICATIONS

*Lynk Labs, Inc.* v. *Home Depot USA, Inc., The Home Depot Inc. and Home Depot Product Authority, LLC*, Case No. 6:21-cv-00097-ADA, Complaint for Patent Infringement filed Jan. 29, 2021—88 pages—Ex. 1004.
*Lynk Labs, Inc.* v. *Home Depot USA, Inc., The Home Depot Inc. and Home Depot Product Authority, LLC*, Case No. 6:21-cv-00097-ADA, Scheduling Order filed Aug. 13, 2021—4 pages—Ex. 1006.
Signalized Intersection Safety in Europe, Dec. 2003, Publication No. FHWA-PL-02-020, Office of International Programs; International@fhwa.dot.gov; www.international.fhwa.dot.gov—126 pages—Ex. 1010.
Ohno et al., "Traffic Light Queues with Departure Headway Depending Upon Positions," Kyoto University, J. Operations Research So. of Japan, vol. 17, No. 3, Sep. 1974—pp. 146-169—Ex. 1011.
U.S. Appl. No. 61/333,963, filed May 12, 2010—52 pages—Ex. 1021.
U.S. Appl. No. 61/284,927, filed Dec. 28, 2009—26 pages—Ex. 1022.
U.S. Appl. No. 61/335,069, filed Dec. 31, 2009—36 pages—Ex. 1023.
U.S. Appl. No. 60/997,771, filed Oct. 6, 2007—24 pages—Ex. 1024.
U.S. Appl. No. 60/547,653, filed Feb. 25, 2004—83 pages—Ex. 1025.
U.S. Appl. No. 60/559,867, filed Feb. 25, 2004—89 pages—Ex. 1026.
U.S. Appl. No. 61/217,215, filed May 28, 2009—32 pages—Ex. 1027.
U.S. Appl. No. 61/215,144, filed May 1, 2009—11 pages—Ex. 1028.
E. Fred Schubert, "Light Emitting Diodes," Rensselaer Polytechnic Institute, Cambridge University Press, 2002—327 page—Ex. 1030.
IEEE 100 The Authoritative Dictionary of IEEE Standards Terms, Seventh Edition—4 pages—Ex. 1032.
*Lynk Labs, Inc.* v. *Home Depot USA, Inc., The Home Depot Inc. and Home Depot Product Authority, LLC*, Case No. 6:21-cv-00097-ADA, Preliminary Lynk Labs, Inc.'s Amended Preliminary Infringement Contentions filed Jun. 23, 2021, 264 pages—Ex. 1005 (excerpts).
*Lynk Labs, Inc.* v. *Home Depot USA, Inc., The Home Depot Inc. and Home Depot Product Authority, LLC*, Case No. 6:21-cv-00097-ADA, Preliminary Lynk Labs, Inc.'s Amended Preliminary Infringement Contentions filed Jun. 23, 2021, 100 pages—Ex. 1012 (Part 1).
*Lynk Labs, Inc.* v. *Home Depot USA, Inc., The Home Depot Inc. and Home Depot Product Authority, LLC*, Case No. 6:21-cv-00097-ADA, Preliminary Lynk Labs, Inc.'s Amended Preliminary Infringement Contentions filed Jun. 23, 2021, 102 pages—Ex. 1012 (Part 2).
*Lynk Labs, Inc.* v. *Home Depot USA, Inc., The Home Depot Inc. and Home Depot Product Authority, LLC*, Case No. 6:21-cv-00097-ADA, Preliminary Lynk Labs, Inc.'s Amended Preliminary Infringement Contentions filed Jun. 23, 2021, 102 pages—Ex. 1012 (Part 3).
*Lynk Labs, Inc.* v. *Home Depot USA, Inc., The Home Depot Inc. and Home Depot Product Authority, LLC*, Case No. 6:21-cv-00097-ADA, Preliminary Lynk Labs, Inc.'s Amended Preliminary Infringement Contentions filed Jun. 23, 2021, 142 pages—Ex. 1012 (Part 4).
*Home Depot USA, Inc.*, v. *Lynk Labs, Inc.*, Case No. IPR2021-01540, U.S. Pat. No. 10,091,842, Petition for Inter Partes Review, Issue Date Oct. 2, 2018—74 pages.
*Home Depot USA, Inc.*, v. *Lynk Labs, Inc.*, Case No. IPR2021-01540, U.S. Pat. No. 10,091,842, Notice of Filing Date Accorded to Petition and Time for Filing Patent Owner Preliminary Response—mailed Oct. 15, 2021—6 pages.
*Home Depot USA, Inc.*, v. *Lynk Labs, Inc.*, Case No. IPR2021-01540, U.S. Pat. No. 10,091,842, Petitioner's Power of Attorney, Issue Date Oct. 2, 2018—2 pages.
*Home Depot USA, Inc.*, v. *Lynk Labs, Inc.*, Case No. IPR2021-01540, U.S. Pat. No. 10,091,842, Patent Owner's Mandatory Notices Pursuant to 37 C.F.R. Section 42.8 filed Oct. 22, 2021—6 pages.

*Home Depot USA, Inc.*, v. *Lynk Labs, Inc.*, Case No. IPR2021-01541, U.S. Pat. No. 10,537,001, Declaration of Dr. Dena Neikirk, Filing Date Feb. 12, 2019, Issue Date Jan. 14, 2020.
U.S. Appl. No. 16/274,164, filed Feb. 12, 2019—543 pages—Ex. 1003.
*Lynk Labs, Inc.*, v. *Home Depot USA, Inc., The Home Depot Inc., and Home Depot Product Authority, LLC*, Case No. 6:21-cv-00097, Complaint for Patent Infringement Case dated Jan. 29, 2021—88 pages—Ex. 1011.
*Lynk Labs, Inc.*, v. *Home Depot USA, Inc., The Home Depot Inc., and Home Depot Product Authority, LLC*, Case No. 3:21-cv-00097-ADA, Scheduling Order filed Aug. 13, 2021—4 pages—Ex. 1013.
*Lynk Labs, Inc.*, v. *Home Depot USA, Inc., The Home Depot Inc., and Home Depot Product Authority, LLC*, Case No. 6:21-cv-00097-ADA, Defendants' Opening Claim Construction Brief on the Terms of U.S. Pat. Nos. 10,091,842, 10,154,551, 10,349,479, 10,492,251, 10,517,149, 10,537,001, 10,562,979, 10,757,783, and 10,932,341 filed Oct. 3, 2021—38 pages—Ex. 1019.
Response to Final Office Action U.S. Appl. No. 15/369,218, filed Jun. 13, 2018, 10 pages—Ex. 1020.
Non-Final Office Action U.S. Appl. No. 156/369,218 dated Oct. 2, 2018, 11 pages—Ex. 1021.
Non-Final Office Action U.S. Appl. No. 16/440,884 dated Jul. 23, 2019, 10 pages—Ex. 1023.
Continuation Application U.S. Appl. No. 16/369,218—original claims—Ex. 1024.
Response to Office Action U.S. Appl. No. 16/440,884, 11 pages—Ex. 1026.
*Home Depot USA, Inc.*, v. *Lynk Labs, Inc.*, Case No. IPR2021-01541, Filing Date Feb. 12, 2019, Issue Date Jan. 14, 2020, Petition for Inter Partes Review of U.S. Pat. No. 10,537,001 Under 35 U.S.C. Section 311-319 and 37 C.F.R. Section 42.1-100, Et Seq., 82 pages.
*Home Depot USA, Inc.*, v. *Lynk Labs, Inc.*, Case No. IPR2021-01541, U.S. Pat. No. 10,537,001, Petitioner's Power of Attorney, Issue Date Jan. 14, 2020—2 pages.
*Home Depot USA, Inc.*, v. *Lynk Labs, Inc.*, Case No. IPR2021-01541, U.S. Pat. No. 10,537,001, Patent Owner's Mandatory Notices Pursuant to 37 C.F.R. Section 42.8 filed Nov. 10, 2021—6 pages.
*Lynk Labs, Inc.*, v. *Home Depot USA, Inc. The Home Dept Inc., and Home Depot Product Authority, LLC*, Case No. 6:21-cv-00097-ADA, Home Depot's Preliminary Invalidity Contentions And Additional Disclosure Pursuant to Scheduling Order dated Aug. 18, 2021—22 pages.
U.S. Pat. No. 10,492,251 ('251 Patent)—Exhibit A-01—Takeo '301.
U.S. Pat. No. 10,492,251 ('251 Patent)—Exhibit A-02—Lynam '623.
U.S. Pat. No. 10,492,251 ('251 Patent)—Exhibit A-03—Filipovsky '319.
U.S. Pat. No. 10,492,251 ('251 Patent)—Exhibit A-04 Deese '719.
U.S. Pat. No. 10,492,251 ('251 Patent)—Exhibit A-05 Okuno.
U.S. Pat. No. 10,492,251 ('251 Patent)—Exhibit A-06—Ohishi '319.
U.S. Pat. No. 10,492,251 ('251 Patent)—Exhibit A-07 Teshima.
U.S. Pat. No. 10,349,479 ("'479 Patent")—Exhibit B-01 Dowling.
U.S. Pat. No. 10,349,479 ("'479 Patent")—B-02 Ter Weeme.
U.S. Pat. No. 10,349,479 ("'479 Patent")—Exhibit B-03 Lin.
U.S. Pat. No. 10,349,479 ("'479 Patent")—Exhibit B-04 Lys '483.
U.S. Pat. No. 10,349,479 ("'479 Patent")—Exhibit B-05 Leong '814.
U.S. Pat. No. 10,349,479 ("'479 Patent")—Exhibit B-06 Galon.
U.S. Pat. No. 10,349,479 ("'479 Patent")—Exhibit B-07 Nakagawara.
U.S. Pat. No. 10,757,783 ("'783 Patent")—Exhibit C-01 Grajcar.
U.S. Pat. No. 10,757,783 ("'783 Patent")—Exhibit C-02 Reymond.
U.S. Pat. No. 10,757,783 ("'783 Patent")—Exhibit C-03 Walter.
U.S. Pat. No. 10,757,783 ("'783 Patent")—Exhibit C-04 Lyos '901.
U.S. Pat. No. 10,757,783 ("'783 Patent")—Exhibit C-05 Hair.
U.S. Pat. No. 10,757,783 ("'783 Patent")—Exhibit C-06 Cho.
U.S. Pat. No. 10,757,783 ("'783 Patent")—Exhibit C-07 Coleman.
U.S. Pat. No. 10,757,783 ("'783 Patent")—Exhibit C-08 Shimizu.
U.S. Pat. No. 10,154,551 ("'551 Patent")—Exhibit D-01 Saito.

(56) References Cited

OTHER PUBLICATIONS

U.S. Pat. No. 10,154,551 ("'551 Patent")—Exhibit D-02 Hochstein '168.
U.S. Pat. No. 10,154,551 ("'551 Patent")—Exhibit D-03 Reymond.
U.S. Pat. No. 10,154,551 ("'551 Patent")—Exhibit D-04 Panagotacos.
U.S. Pat. No. 10,154,551 ("'551 Patent")—Exhibit D-05 Liu.
U.S. Pat. No. 10,154,551 ("'551 Patent")—Exhibit D-06 Deese 450.
U.S. Pat. No. 10,154,551 ("'551 Patent")—Exhibit D-07 Lys.
U.S. Pat. No. 10,154,551 ("'551 Patent")—Exhibit D-08 Shimizu.
U.S. Pat. No. 10,517,149 ("'149 Patent")—Exhibit E-01 Takahashi.
U.S. Pat. No. 10,517,149 ("'149 Patent")—Exhibit E-02 Saito '590.
U.S. Pat. No. 10,517,149 ("'149 Patent")—Exhibit E-03 Lys '399.
U.S. Pat. No. 10,517,149 ("'149 Patent")—Exhibit E-04 Catalano '081.
U.S. Pat. No. 10,517,149 ("'149 Patent")—Exhibit E-05 Deese '719.
U.S. Pat. No. 10,652,979 ("'979 Patent")—Exhibit F-01 Coats '555.
U.S. Pat. No. 10,652,979 ("'979 Patent")—Exhibit F-02 Birrell '406.
U.S. Pat. No. 10,652,979 ("'979 Patent")—Exhibit F-03 Muthu '159.
U.S. Pat. No. 10,652,979 ("'979 Patent")—Exhibit F-04 Teshima '408.
U.S. Pat. No. 10,652,979 ("'979 Patent")—Exhibit F-05 Takeo.
U.S. Pat. No. 10,652,979 ("'979 Patent")—Exhibit F-06 Deese 719.
U.S. Appl. No. 60/839,453, filed Aug. 23, 2006, entitled "Lighting Device and Lighting Method" to Van de Ven and Negley, ("453 Provisional").
U.S. Appl. No. 60/793,524, filed Apr. 20, 2006, entitled "Lighting Device and Lighting Method" to Van de Ven and Negley, ("524 Provisional").
U.S. Appl. No. 60/844,325, filed Sep. 13, 2006, entitled "Boost/Flyback Power Supply Topology With Low Side MOSFET Current Control" to Myers ("Myers").
Interim LED Purchase Specifications of the Institute of Transportation Engineers, Jul. 1998 ("1998 Specification").
"Comparison of Control Options in Private Offices in an Advanced Lighting Controls Testbed," by Judith D. Jennings et al., and published in Apr. 1999 ("Jennings").
Vehicle Detection Using a Magetic Field Sensor, by Stanely V. Marshall, and published in May 1978 ("Marshall").
*Samsung Electronics Co. Ltd. and Samsung Electronics America, Inc. v. Lynk Labs, Inc.* Case No. 1:21-cv-02665, Samsung's Initial Non-Infringement, Unenforceability, and Invalidity Contentions dated Sep. 21, 2021—85 pages.
U.S. Pat. No. 10,492,251 ('251 Patent)—Exhibit A-01—Lys '262.
U.S. Pat. No. 10,492,251 ('251 Patent)—Exhibit A-02—KR 747.
U.S. Pat. No. 10,492,251 ('251 Patent)—Exhibit A-03—KR '215.
U.S. Pat. No. 10,492,251 ('251 Patent)—Exhibit A-04—iColor System.
U.S. Pat. No. 10,492,251 ('251 Patent)—Exhibit A-05—Miskin '299.
U.S. Pat. No. 10,492,252 ('252 Patent)—Exhibit B-01—Piepgrass.
U.S. Pat. No. 10,492,252 ('252 Patent)—Exhibit B-02—Hitachi.
U.S. Pat. No. 10,492,252 ('252 Patent)—Exhibit B-03—Mueller.
U.S. Pat. No. 10,492,252 ('252 Patent)—Exhibit B-04—NEC.
U.S. Pat. No. 10,492,252 ('252 Patent)—Exhibit B-05—Miskin '299.
U.S. Pat. No. 10,492,252 ('252 Patent)—Exhibit B-06—Mac Powerbook G3.
U.S. Pat. No. 10,492,252 ('252 Patent)—Exhibit B-07—iPod G3.
U.S. Pat. No. 10,492,252 ('252 Patent)—Exhibit B-08—iPAQ H5500.
U.S. Pat. No. 10,499,466 ('466 Patent)—Exhibit C-01—Piepgrass.
U.S. Pat. No. 10,499,466 ('466 Patent)—Exhibit C-02—Hitachi.
U.S. Pat. No. 10,499,466 ('466 Patent)—Exhibit C-03—Mueller.
U.S. Pat. No. 10,499,466 ('466 Patent)—Exhibit C-04—NEC.
U.S. Pat. No. 10,499,466 ('466 Patent)—Exhibit C-05—Miskin '299.
U.S. Pat. No. 10,499,466 ('466 Patent)—Exhibit C-06—Mac Powerbook G3.
U.S. Pat. No. 10,499,466 ('466 Patent)—Exhibit C-07—iPod G3.
U.S. Pat. No. 10,499,466 ('466 Patent)—Exhibit C-08—iPAQ H5500.
U.S. Pat. No. 10,506,674 ('674 Patent)—Exhibit D-01—Piepgrass.
U.S. Pat. No. 10,506,674 ('674 Patent)—Exhibit D-02—Hitachi.
U.S. Pat. No. 10,506,674 ('674 Patent)—Exhibit D-03—Mueller.
U.S. Pat. No. 10,506,674 ('674 Patent)—Exhibit D-04—NEC.
U.S. Pat. No. 10,506,674 ('674 Patent)—Exhibit D-05—Miskin '299.
U.S. Pat. No. 10,506,674 ('674 Patent)—Exhibit D-06—Mac Powerbook G3.
U.S. Pat. No. 10,506,674 ('674 Patent)—Exhibit D-07—iPod G3.
U.S. Pat. No. 10,506,674 ('674 Patent)—Exhibit D-08—iPAQ H5500.
U.S. Pat. No. 10,517,149 ('149 Patent)—Exhibit E-01—Lys '626.
U.S. Pat. No. 10,517,149 ('149 Patent)—Exhibit E-02—KR 747.
U.S. Pat. No. 10,517,149 ('149 Patent)—Exhibit E-03—KR '215.
U.S. Pat. No. 10,517,149 ('149 Patent)—Exhibit E-04—iColor System.
U.S. Pat. No. 10,517,149 ('149 Patent)—Exhibit E-05—Miskin '299.
U.S. Pat. No. 10,687,400 ('400 Patent)—Exhibit F-01—Lys '626.
U.S. Pat. No. 10,687,400 ('400 Patent)—Exhibit F-02—KR 747.
U.S. Pat. No. 10,687,400 ('400 Patent)—Exhibit F-03—CK LEDs.
U.S. Pat. No. 10,687,400 ('400 Patent)—Exhibit F-04—Miskin '299.
U.S. Pat. No. 10,750,583 ('583 Patent)—Exhibit G-01—Lys '626.
U.S. Pat. No. 10,750,583 ('583 Patent)—Exhibit G-02—KR 747.
U.S. Pat. No. 10,750,583 ('583 Patent)—Exhibit G-03—KR 215.
U.S. Pat. No. 10,750,583 ('583 Patent)—Exhibit G-04—iColor System.
U.S. Pat. No. 10,750,583 ('583 Patent)—Exhibit G-05—Piepgrass.
U.S. Pat. No. 10,750,583 ('583 Patent)—Exhibit G-06—Miskin '299.
U.S. Pat. No. 10,966,298 ('298 Patent)—Exhibit H-01—Piepgrass.
U.S. Pat. No. 10,966,298 ('298 Patent)—Exhibit H-02—Hitachi.
U.S. Pat. No. 10,966,298 ('298 Patent)—Exhibit H-03—Mueller.
U.S. Pat. No. 10,966,298 ('298 Patent)—Exhibit H-04—NEC.
U.S. Pat. No. 10,966,298 ('298 Patent)—Exhibit H-05—Miskin '299.
*Lynk Labs, Inc. v. Home Depot USA, Inc. The Home Depot, Inc., and Home Depot Product Authority, LLC*, Case No. 6:21-cv-00097-ADA, Defendants' Corrected Reply Claim Construction Brief on the Terms of U.S. Pat. Nos. 10,091,842, 10,154,551, 10,349,479, 10,492,251, 10,517,149, 10,537,001, 10,652,979, 10,757,783, and 10,932,341 filed Nov. 10, 2021—60 pages.
*Lynk Labs, Inc. v. Home Depot USA, Inc. The Home Depot, Inc., and Home Depot Product Authority, LLC*, Case No. 6:21-cv-00097-ADA, Plaintiff Lynk Labs, Inc.'s Responsive Claim Construction Brief filed Oct. 27, 2021, Part 1.
*Lynk Labs, Inc. v. Home Depot USA, Inc. The Home Depot, Inc., and Home Depot Product Authority, LLC*, Case No. 6:21-cv-00097-ADA, Plaintiff Lynk Labs, Inc.'s Responsive Claim Construction Brief filed Oct. 27, 2021, Part 2.
*Samsung Electronics Co., Ltd. v. Lynk Labs, Inc.* U.S. Pat. No. 10,750,583, Petition for Inter Partes Review of U.S. Pat. No. 10,750,583 dated Oct. 28, 2021—79 pages.
*Samsung Electronics Co., Ltd., v. Lynk Labs, Inc.* U.S. Pat. No. 10,750,583, Power of Attorney for Petitioner Samsung Electronics Co., Ltd.,—3 pages.
*Samsung Electronics Co., Ltd., v. Lynk Labs, Inc.* U.S. Pat. No. 10,750,583, Petitioner's Notice Regarding Multiple Petitions—8 pages.
*Samsung Electronics Co., Ltd., v. Lynk Labs, Inc.* Case: IPR2022-00100, U.S. Pat. No. 10,750,583, Patent Owner's Mandatory Notices Pursuant to 37 C.F.R Section 42.8—5 pages.
*Samsung Electronics Co., Ltd., v. Lynk Labs, Inc.* U.S. Pat. No. 10,750,583, Declaration of R. Jacob Baker, PH.D., P.E. in Support of Petition for Inter Partes Review of U.S. Pat. No. 10,750,583 Ex. 1002.
Baker CV, 37 pages—Ex. 1003.
U.S. Appl. No. 16/449,273, filed Jun. 21, 2019 Ex. 1004.
Sedra/Smith, "Microelectronic Circuits," Fourth Edition, Parts 1-4, pp.—Exs. 1041, 1061, 1054, 1034.

(56) References Cited

OTHER PUBLICATIONS

Watson Mastering Electronics, Third Edition, pp. 1-151—Exs. 1012, 1018, 1031.
Tim Williams, The Circuit Designer's Companion, First Published 1991, ISBN 0 7506 1142 1, 314 pages—Ex. 1042, 1094.
Chamber Dictionary of Science and Technology, General Editor Professor Peter MB Walker, CBE, FRSE, Chambers Harrap Published Ltd. 1999 ISBN 0 550 14110 3, 4 pages—Ex. 1047, 1024.
McGraw-Hill Dictionary of Scientific and Technical Terms, Sixth Edition, Library of Congress Cataloging in Publication Data , ISBN 0-07-042313-X, pp. 4—Ex. 1048, 1018.
U.S. Appl. No. 61/333,963, filed May 12, 2010 Ex. 1063.
U.S. Appl. No. 61/284,927, filed Dec. 28, 2009 Ex. 1064.
U.S. Appl. No. 61/335,069, filed Dec. 31, 2009 Ex. 1065.
U.S. Appl. No. 60/997,771, filed Oct. 6, 2007 Ex. 1066.
U.S. Appl. No. 60/547,653, filed Mar. 2, 2004 Ex. 1067.
U.S. Appl. No. 60/559,867, filed Apr. 8, 2004 Ex. 1068.
U.S. Appl. No. 61/217,215, filed May 28, 2009 Ex. 1069.
U.S. Appl. No. 61/215,144, filed May 1, 2009 Ex. 1070.
"Supplemental Report of Parties' Planning Meeting", from *Samsung Electronics Co. Ltd. et al. v. Lynk Labs, Inc.*, Case No. 1:21-cv-02665, filed Oct. 14, 2021—11 pages Ex. 1075, Ex. 1080.
Docket from Samsung Electronics Co. Ltd. et al. v. Lynk Labs, Inc., Case No. 1:21-cv-02665 printed Oct. 25, 2021—14 pages Ex. 1076, Ex. 1061.
Estimated Patent Case Schedule in Northern District of Illinois—2 pages Ex. 1079, Ex. 1062.
"Defendant Lynk Labs, Inc.'s Answer to Plaintiffs Samsung Electronics Co., Ltd. and Samsung Electronics America, Inc.'s First Amended Complaint and Counterclaims" from Samsung Electronics Co. Ltd. et al v. Lynk Labs, Inc., Case No. 1:21-cv-02665, filed Aug. 3, 2021—67 pages Ex. 1082, Ex. 1071.
"Defendant Lynk Labs, Inc.'s Amended Preliminary Infringement Contentions" from *Samsung Electronics Co. Ltd. et al v. Lynk Labs, Inc.*, Case No. 1:21-cv-02665, filed Aug. 31, 2021—9 pages Ex. 1083, Ex. 1066.
U.S. Pat. No. 10,750,583 Exemplary Infringement Chart Samsung SmartThings Hub (as Appendix J-2)—11 pages Ex. 1084.
"Notification of Docket Entry" from *Samsung Electronics Co. Ltd. et al v. Lynk Labs, Inc.*, Case No. 1:21-cv-02665, filed Jul. 27, 2021—1 page Ex. 1085, Ex. 1068.
"Order" as scheduling order from *Samsung Electronics Co. Ltd. et al v. Lynk Labs, Inc.*, Case No. 1:21-cv-02665, filed Aug. 19, 2021—2 pages Ex. 1086.
"Notification of Docket Entry" from *Samsung Electronics Co. Ltd. et al v. Lynk Labs, Inc.*, Case No. 1:21-cv-02665, filed Oct. 18, 2021—1 page Ex. 1087, Ex. 1070.
"Defendant Lynk Labs, Inc.'s Supplement to Second Amended Preliminary Infringement Contentions ('551 Patent and 979 Patent)" from *Samsung Electronics Co. Ltd. et al v. Lynk Labs, Inc.*, Case No. 1:21-cv-02665, filed Sep. 22, 2021—20 pages Ex. 1072.
*Samsung Electronics Co., Ltd. v. Lynk Labs, Inc.* Patent Owner—U.S. Pat. No. 10,154,551 Petition for Inter Partes Review of U.S. Pat. No. 10,154,551—90 pages.
*Samsung Electronics Co., Ltd. v. Lynk Labs, Inc.* Patent Owner—U.S. Pat. No. 10,154,551 Power of Attorney for Petitioner Samsung Electronics, Co., Ltd. U.S. Pat. No. 10,154,551—3 pages.
*Samsung Electronics Co., Ltd. v. Lynk Labs, Inc.* Patent Owner—U.S. Pat. No. 10,652,979 Petition for Inter Partes Review of U.S. Pat. No. 10,652,979—84 pages.
*Samsung Electronics Co., Ltd. v. Lynk Labs, Inc.* Patent Owner—U.S. Pat. No. 10,652,979 Power of Attorney for Petitioner Samsung Electronics, Co., Ltd. U.S. Pat. No. 10,652,979—3 pages.
*Samsung Electronics Co., Ltd. v. Lynk Labs, Inc.* Patent Owner—U.S. Pat. No. 10,154,551 Declaration of R. Jacob Baker, PH.D., P.E. In support of Petition For Inter Partes Review of U.S. Pat. No. 10,154,551—175 pages—Ex. 1002.
R. Jacob (Jake) Baker, Ph D., P.E. CV—36 pages, Patents '252, '298, '466, '551, '674, '697, '979—Ex-1003.

File History US10154551 U.S. Appl. No. 15/797,806 dated Oct. 30, 2017—Ex. 1004.
Williams, Tim, "The Circuit Designer's Companion," 2021, 314 pages—(Parts 1 and 2), '551 Ex. 1013.
Chambers, Dictionary of Science and Technology, published Chambers Harrap Publishers Ltd 1999, 8 pages, '551—Ex. 1024.
*Samsung Electronics Co. Ltd. and Samsung Electronics America, Inc. v. Lynk Labs, Inc.* Defendant Lynk Labs, Inc.'s Supplement to Second Amended Preliminary Infringement Contentions ('551 Patent and '979 Patent), Case No. 1:21-cv-02665, filed Sep. 22, 2021, 14 pages—Ex. 1072.
*Lynk Labs, Inc. v. Samsung Electronics Co. Ltd. and Samsung Electronics America, Inc.* Case No. 6:21-cv-00526 Complaint for Patent Infringement filed May 25, 2021, '551 12 pages—Ex. 1074.
*Lynk Labs, Inc. v. Samsung Electronics Co. Ltd. and Samsung Electronics America, Inc.* Case No. 6:21-cv-00526 First Amended Complaint for Patent Infringement filed Jun. 9, 2021, 18 pages—Ex. 1075.
*Samsung Electronics Co. Ltd. and Samsung Electronics America, Inc. v. Lynk Labs, Inc.* Samsung Electronics Co., Ltd. and Samsung Electronics America, Inc.'s Second Amended Complaint for Declaratory Judgment of Non-Infringement, Case No. 1:21-cv-02665, filed Sep. 8, 2021, 44 pages—Ex. 1076.
*Samsung Electronics Co. Ltd. et al. v. Lynk Labs, Inc.* Civil Docket for Case #1:21-cv-02665 dated Sep. 27, 2021 '551 12 pages—Ex. 1077.
*Lynk Labs, Inc. v. Samsung Electronics Co. Ltd. et al.* Civil Docket for Case #6:21-cv-00526-ADA dated Sep. 27, 2021 '551 8 pages—Ex. 1078.
*Lynk Labs, Inc. v. Samsung Electronics Co. Ltd. et al.* Civil Docket for Case #1:21-cv-05126 dated Sep. 29, 2021 '551 8 pages—Ex 1079.
*Lynk Labs, Inc. v. Samsung Electronics Co. Ltd. et al.* Case No. 6:21-cv-00526-ADS Order Granting Plaintiff Lynk Labs, Inc.'s Stipulation to Transfer '551 2 pages—Ex. 1080.
*Samsung Electronics Co., Ltd. v. Lynk Labs, Inc.* Patent Owner—U.S. Pat. No. 10,652,979 Declaration of R. Jacob Baker, PH.D., P.E. In support of Petition for Inter Partes Review of U.S. Pat. No. 10,652,979—174 pages—Ex. 1002.
McGraw-Hill Dictionary of Scientific and Technical Term, Sixth Edition, '979—9 pages—Ex. 1018.
Declaration of R. Jacob Baker. Ph.D., P.E. U.S. Pat. No. 10,154,551, Inter Partes Review of U.S. Pat. No. 10,154,551, 176 pages—Ex 1002.
Petition for Inter Partes Review, *Home Depot USA, Inc.*, Petitioner, v. *Lynk Labs, Inc.*, Patent Owner, Case IPR2021-01369 U.S. Pat. No. 10,492,251, Issue Date Nov. 26, 2019, Title: "AC Light Emitting Diode and AC LED Drive Methods and Apparatus," 53 pages dated Aug. 18, 2021.
Petitioners' Power of Attorney, *Home Depot USA, Inc.*, Petitioner, v. *Lynk Labs, Inc.*, Patent Owner, Case IPR2021-01369 U.S. Pat. No. 10,492,251, Issue Date Nov. 26, 2019, Title: "AC Light Emitting Diode and AC LED Drive Methods and Apparatus," 53 pages dated Aug. 17, 2021.
Declaration of Dr. Lebby U.S. Pat. No. 10,492,251dated Aug. 18, 2021, 134 pages—Ex 1002.
U.S. Appl. No. 16/148,945, filed Oct. 1, 2018—Ex. 1003.
Complaint for Patent Infringement, *Lynk Labs, Inc. v. Home Depot USA, Inc., The Home Depot Inc., and Home Depot Product Authority, LLC*, Case No. 6:21-cv-00097 dated Jan. 29, 2021, 88 pages—Ex. 1010.
Plaintiff Lynk Labs, Inc.'s Amended Preliminary Infringement Contentions, *Lynk Labs, Inc. v. Home Depot USA, Inc., The Home Depot Inc., and Home Depot Product Authority, LLC*, Case No. 6:21-cv-00097-ADA, dated Jun. 23, 2021, 7 pages—Ex. 1011.
Scheduling Order, *Lynk Labs, Inc. v. Home Depot USA, Inc., The Home Depot Inc., and Home Depot Product Authority, LLC*, Case No. 6:21-cv-00097-ADA, filed Aug. 13, 2021, 4 pages—Ex. 1012.
*Samsung Electronics Co., Ltd. v. Lynk Labs, Inc.* U.S. Pat. No. 10,687,400, Declaration of R. Jacob Baker Ph.D., P.E. In Support of Petition for Inter Partes Review of U.S. Pat. No. 10,687,400 dated Nov. 5, 2021—177 pages Ex. 1002.

(56) References Cited

OTHER PUBLICATIONS

File History of U.S. Pat. No. 10,687,400 Parts 1-4 1181 pages Ex. 1004.
Watson Mastering Electronics, Third Edition, pp. 1-151—Ex. 1030, Ex. 1012, Ex. 1018, Ex. 1031.
Sedra/Smith, "Microelectronic Circuits," Fourth Edition, Parts 1-4, 515 pages Ex. 1034, Ex. 1041, Ex. 1061, Ex. 1054.
Chamber Dictionary of Science and Technology, General Editor Professor Peter MB Walker, CBE, FRSE, Chambers Harrap Published Ltd. 1999 ISBN 0 550 14110 3,4 pages Ex. 1047, Ex. 1024.
McGraw-Hill Dictionary of Scientific and Technical Terms, Sixth Edition, Library of Congress Cataloging in Publication Data, ISBN 0-07-042313-X, pp. 4 Ex. 1048, Ex. 1018.
Docket from *Samsung Electronics Co., Ltd. et al v. Lynk Labs, Inc.* No. 1:21-cv-02665 printed Nov. 5, 2021—14 pages Ex. 1076.
"Defendant Lynk Labs, Inc.'s Preliminary Infringement Contentions" from *Samsung Electronics Co. Ltd. et al v. Lynk Labs, Inc.*, Case No. 1:21-cv-02665 filed Jul. 21, 2021—9 pages Ex. 1080.
U.S. Pat. No. 10,687,400 ("the '400 Patent") Exemplary Infringement Chart ACOM Round (US) as Appendix K-1—9 pages Exs. 1081, 1084.
"Order" from *Samsung Electronics Co. Ltd. et al v. Lynk Labs, Inc.*, Case No. 1:21-cv-02665, filed Aug. 19, 2021—2 pages Ex. 1086.
"Supplemental Report of Parties' Planning Meeting" from *Samsung Electronics Co. Ltd. et al v. Lynk Labs, Inc.*, Case No. 1:21-cv-02665, filed Oct. 14, 2021—11 pages Ex. 1087, Ex. 1075, Ex. 1080.
"Order" from *Samsung Electronics Co. Ltd. et al v. Lynk Labs, Inc.*, Case No. 1:21-cv-02665, filed Oct. 18, 2021—1 page Ex. 1088.
Tim Williams, The Circuit Designer's Companion, First Published 1991, ISBN 0 7506 1142 1, 314 pages—Ex. 1089, Ex. 1094.
*Samsung Electronics Co., Ltd. v. Lynk Labs, Inc.* U.S. Pat. No. 10,687,400, Petition for Inter Partes Review of U.S. Pat. No. 10,687,400 dated Nov. 12, 2021—96 pages.
*Samsung Electronics Co., Ltd. v. Lynk Labs, Inc.* U.S. Pat. No. 10,687,400, Power of Attorney for Petitioner Samsung Electronics Co., Ltd. dated Oct. 8, 2021—3 pages.
*Samsung Electronics Co., Ltd. v. Lynk Labs, Inc.* U.S. Pat. No. 10,687,400, Petitioner's Notice Regarding Multiple Petitions dated Nov. 12, 2021—9 pages.
*Samsung Electronics Co., Ltd. v. Lynk Labs, Inc.* U.S. Pat. No. 10,687,400, Patent Owner's Mandatory Notices Pursuant to 37 C.F.R. § 42.8 dated Nov. 19, 2021—5 pages.
U.S. Appl. No. 61/333,963, filed May 12, 2010, 52 pages—IPR2021-01299 Ex 1036; IPR2021-10347 Ex 1055 IPR2021-01346 Ex 1036, IPR2021-01345 Ex 1037; IPR2021-01300 Ex 1036.
U.S. Appl. No. 61/284,927, filed Dec. 28, 2009, 54 pages—IPR2021-01299 Ex 1037; IPR2021-10347 Ex 1056; IPR2021-01346 Ex 1037, IPR2021-01345 Ex 1037; IPR2021-01300 Ex 1037.
U.S. Appl. No. 61/335,069, filed Dec. 31, 2009, 65 pages—IPR2021-01299 Ex 1038; IPR2021-10347 Ex 1057; IPR2021-01346 Ex 1038, IPR2021-01345 Ex 1038, IPR2021-01300 Ex 1038.
U.S. Appl. No. 60/997,771, filed Oct. 6, 2007, 26 pages—IPR2021-01299 Ex 1039; IPR2021-10347 Ex 1058; IPR2021-01346 Ex 1039, IPR2021-01345 Ex 1039; IPR2021-01300 Ex 1039.
U.S. Appl. No. 60/547,653, filed Feb. 25, 2004, 84 pages—IPR2021-01299 Ex 1040; IPR2021-10347 Ex 1059; IPR2021-01346 Ex 1040, IPR2021-01345 Ex 1040; IPR2021-01300 Ex 1040.
U.S. Appl. No. 60/559,867, filed Feb. 25, 2004, 90 pages—IPR2021-01299 Ex 1041; IPR2021-10347 Ex 1060; IPR2021-01346 Ex 1041, IPR2021-01345 Ex 1041; IPR2021-01300 Ex 1041.
U.S. Appl. No. 61/217,215, filed May 28, 2008,47 pages—IPR2021-01299 Ex 1042; IPR2021-10347 Ex 1061; IPR2021-01346 Ex 1042, IPR2021-01345 Ex 1042; IPR2021-01300 Ex 1042.
U.S. Appl. No. 61/215,144, filed May 1, 2009, 11 pages—IPR2021-01299 Ex 1043; IPR2021-10347 Ex 1062; IPR2021-01346 Ex 1043, IPR2021-01345 Ex 1043; IPR2021-01300 Ex 1043.
Watson, John, Mastering Electonics, Third Ed., McGraw Hill Inc., published in 1990—IPR2021-01299 Ex 1080; IPR2021-10347 Ex 1026; IPR2021-01346 Ex 1062; IPR2021-01345 Ex 1060; IPR2021-01300 Ex 1006.

Sedra, A., et al., Microelectronic Circuits, Fourth Ed., Oxford University Press, published in 1998—IPR2021-01299 Ex 1081; IPR2021-10347 Ex 1027; IPR2021-01346 Ex 1063; IPR2021-01345 Ex 1061 (4 parts); IPR2021-01300 Ex 1007.
Compaq Comp. Corp. et al., Universal Serial Bus Specification Revision 2.0 published in 2000, 650 pages—IPR2021-01299 Ex 1091; IPR2021-10347 Ex 1095; IPR2021-01346 Ex 1069; IPR2021-01345 Ex 1072; IPR2021-01300 Ex 1055.
Declaration of R. Jacob Baker. Ph.D., P.E. U.S. Pat. No. 10,966,298, Inter Partes Review No. IPR2021-01347, 152 pages—Ex 1002.
Gilbisco, Stan, Handbook of Radio & Wireless Technology, published in 1999, 188 pages, McGraw-Hill—IPR2021-10347 Ex 1013.
Petition for Inter Partes Review, *Samsung Electronics Co., Ltd.*, Petitioner, v. *Lynk Labs, Inc.*, Patent Owner, Case IPR2021-01347 U.S. Pat. No. 10,966,298, Issue Date Dec. 3, 2019, Title: "AC Light Emitting Diode and AC LED Drive Methods and Apparatus," 70 pages dated Sep. 7, 2021.
Petition for Inter Partes Review, *Samsung Electronics Co., Ltd.*, Petitioner, v. *Lynk Labs, Inc.*, Patent Owner, Case IPR2021-01346 U.S. Pat. No. 10,499,466, Issue Date Dec. 10, 2019, Title: "AC Light Emitting Diode and AC LED Drive Methods and Apparatus," 70 pages dated Sep. 7, 2021.
Petition for Inter Partes Review, *Samsung Electronics Co., Ltd.*, Petitioner, v. *Lynk Labs, Inc.*, Patent Owner, Case IPR2021-01345 U.S. Pat. No. 10,492,252, Issue Date Nov. 26, 2019, Title: "AC Light Emitting Diode and AC LED Drive Methods and Apparatus," 65 pages dated Sep. 7, 2021.
Petition for Inter Partes Review, *Samsung Electronics Co., Ltd.*, Petitioner, v. *Lynk Labs, Inc.*, Patent Owner, Case IPR2021-01300 U.S. Pat. No. 11,019,697, Issue Date May 25, 2019, Title: "AC Light Emitting Diode and AC LED Drive Methods and Apparatus," 71 pages dated Sep. 7, 2021.
Petition for Inter Partes Review, *Samsung Electronics Co., Ltd.*, Petitioner, v. *Lynk Labs, Inc.*, Patent Owner, Case IPR2021-01299 U.S. Pat. No. 10,506,674, Issue Date Dec. 10, 2019, Title: "AC Light Emitting Diode and AC LED Drive Methods and Apparatus," 70 pages dated Sep. 7, 2021.
Plaintiff's First Amended Complaint for Patent Infringement, Case No. 6:21-cv-00526-ADA, *Lynk Labs, Inc. v. Samsung ElectronicsCo., Ltd. and Samsung Electronics America, Inc.* dated Jun. 9, 2021, 18 pages—IPR2021-01346 Ex 1080, IPR2021-01345 Ex 1056; IPR2021-01300 Ex 1086.
Defendant's Preliminary Infringement Contentions, Case No. 1:21-cv-2655, *Samsung Electronics Co., Ltd. and Samsung Electronics America, Inc. v. Lynk Labs, Inc.*, dated Jul. 21, 2021, 9 pages—IPR2021-01346 Ex 1081, IPR2021-01345 Ex 1057, IPR2021-01300 Ex 1080.
Defendant's Answer and Counterclaims, Case No. 1:21-cv-2665, *Samsung Electronics Co., Ltd. and Samsung Electronics America, Inc. v. Lynk Labs, Inc.*, dated Aug. 3, 2021, 67 pages—IPR2021-01346 Ex 1083, IPR2021-01345 Ex 1077, IPR2021-01300 Ex 1082.
Defendant's Amended Preliminary Infringement Contentions, Case No. 1:21-cv-2665, *Samsung Electronics Co., Ltd. and Samsung Electronics America, Inc. v. Lynk Labs, Inc.*, dated Aug. 31, 2021, 9 pages—IPR2021-01346 Ex 1086 IPR2021-01345 Ex 1086; IPR2021-01300 Ex 1087.
Scheduling Order, Case No. 1:21-cv-2665, *Samsung Electronics Co., Ltd. and Samsung Electronics America, Inc. v. Lynk Labs, Inc.*, dated Aug. 19, 2021—IPR2021-01346 Ex 1085, IPR2021-01345 Ex 1085, IPR2021-01300 Ex 1084.
Notification of Docket Entry, Case No. 1:21-cv-2665, *Samsung Electronics Co., Ltd. and Samsung Electronics America, Inc. v. Lynk Labs, Inc.*, dated Jul. 27, 2021, 1 page—IPR2021-01346 Ex 1084, IPR2021-01345 Ex 1084, IPR2021-01300 Ex 1083.
Declaration of R. Jacob Baker. Ph.D., P.E. U.S. Pat. No. 10,499,466, 187 pages, Inter Partes Review No. IPR2021-01346—Ex 1002.
Declaration of R. Jacob Baker. Ph.D., P.E. U.S. Pat. No. 10,492,252, 148 pages, Inter Partes Review No. IPR2021-01345—Ex 1002.
Declaration of R. Jacob Baker. Ph.D., P.E. U.S. Pat. No. 11,019,697, 261 pages, Inter Partes Review No. IPR2021-01300—Ex 1002.
Declaration of R. Jacob Baker. Ph.D., P.E. U.S. Pat. No. 10,506,674, 172 pages, Inter Partes Review No. IPR2021-01299—Ex 1002.

(56) References Cited

OTHER PUBLICATIONS

Declaration of R. Jacob Baker. Ph.D., P.E. U.S. Pat. No. 10,999,298, 152 pages, Inter Partes Review No. IPR2021-01347—Ex 1002.
Plaintiff's Complaint, Case No. 1:21-cv-2665, *Lynk Labs, Inc.* v. *Samsung Electronics Co., Ltd. and Samsung Electronics America, Inc.*, dated May 25, 2021, 12 pages—IPR2021-01300 Ex 1074.
Plaintiffs First Amended Complaint, Case No. 1:21-cv-2665, *Samsung Electronics Co., Ltd. and Samsung Electronics America, Inc.* v. *Lynk Labs, Inc.*, dated May 25, 2021, 33 pages—IPR2021-01300 Ex 1075.
Plaintiff's Complaint, Case No. 1:21-cv-2665, *Samsung Electronics Co., Ltd. and Samsung Electronics America, Inc.* v. *Lynk Labs, Inc.*, dated May 17, 2021, 30 pages—IPR2021-01300 Ex 1076.
The Microarchitecture of the Pentium 4 Processor by Hinton et al., published in 2001, 13 pages—IPR2021-01300 Ex 1017.
Wireless Medium Access Control (MAC) and Physical Layer (PHY) Specifications for Wireless Personal Area Networks (WPANs) by IEEE Computer Society, 1018 IEEE 812.15.1, published in 2002, 1168 pages—IPR2021-01300 Ex 1018.
*Samsung Electronics Co., Ltd.*, v. *Lynk Labs, Inc.* Patent Owner—Power of Attorney for Petitioner Samsung Electronics Co., Ltd. U.S. Pat. No. 10,492,252, dated Jul. 21, 2021—3 pages.
*Samsung Electronics Co., Ltd.*, v. *Lynk Labs, Inc.*, Case IPR2021-01345, U.S. Pat. No. 10,492,252—Notice of Filing Date Accorded to Petition and Time for Filing Patent Owner Preliminary Response filed Sep. 7, 2021—5 pages.
*Samsung Electronics Co., Ltd.*, v. *Lynk Labs, Inc.*, Case IPR2021-01345, U.S. Pat. No. 10,492,252—Patent Owner's Mandatory Notices Pursuant to 37 C.F.R. Section 42.8—dated Sep. 28, 2021—5 pages.
*Samsung Electronics Co., Ltd.*, v. *Lynk Labs, Inc.* Patent Owner—Power of Attorney for Petitioner Samsung Electronics Co., Ltd. U.S. Pat. No. 10,966,298 dated Jul. 21, 2021—3 pages.
*Samsung Electronics Co., Ltd.*, v. *Lynk Labs, Inc.*, Case IPR2021-01347, U.S. Pat. No. 10,966,298—Notice of Filing Date Accorded to Petition and Time for Filing Patent Owner Preliminary Response filed Sep. 7, 2021—5 pages.
*Samsung Electronics Co., Ltd.*, v. *Lynk Labs, Inc.*, Case IPR2021-01347, U.S. Pat. No. 10,966,298—Patent Owner's Mandatory Notices Pursuant to 37 C.F.R. Section 42.8—dated Sep. 28, 2021—5 pages.
*Samsung Electronics Co., Ltd.*, v. *Lynk Labs, Inc.* Patent Owner—Power of Attorney for Petitioner Samsung Electronics Co., Ltd. U.S. Pat. No. 10,499,466 dated Jul. 21, 2021—3 pages.
*Samsung Electronics Co., Ltd.*, v. *Lynk Labs, Inc.*, Case IPR2021-01346, U.S. Pat. No. 10,499,466—Notice of Filing Date Accorded to Petition and Time for Filing Patent Owner Preliminary Response filed Sep. 7, 2021—5 pages.
*Samsung Electronics Co., Ltd.*, v. *Lynk Labs, Inc.*, Case IPR2021-01346, U.S. Pat. No. 10,499,466—Patent Owner's Mandatory Notices Pursuant to 37 C.F.R. Section 42.8—dated Sep. 28, 2021—5 pages.
*Samsung Electronics Co., Ltd.*, v. *Lynk Labs, Inc.* Patent Owner—Power of Attorney for Petitioner Samsung Electronics Co., Ltd. U.S. Pat. No. 11,019,697 dated Jul. 21, 2021—3 pages.
*Samsung Electronics Co., Ltd.*, v. *Lynk Labs, Inc.*, Case IPR2021-01300, U.S. Pat. No. 11,019,697—Notice of Filing Date Accorded to Petition and Time for Filing Patent Owner Preliminary Response filed Sep. 7, 2021—6 pages.
*Samsung Electronics Co., Ltd.*, v. *Lynk Labs, Inc.*, Case IPR2021-01300, U.S. Pat. No. 11,019,697—Patent Owner's Mandatory Notices Pursuant to 37 C.F.R. Section 42.8—dated Sep. 28, 2021—5 pages.
*Samsung Electronics Co., Ltd.*, v. *Lynk Labs, Inc.*, Case IPR2021-01300, U.S. Pat. No. 11,019,697—Petitioner's Response to Notice of Filing Date Accorded to Petition and Time for Filing Patent Owner Preliminary Response (Paper No. 3) dated Sep. 20, 2021—3 pages.

*Samsung Electronics Co., Ltd.*, v. *Lynk Labs, Inc.*, Case IPR2021-01300, U.S. Pat. No. 11,019,697—Notice of Accepting Corrected Petition filed Sep. 20, 2021—2 pages.
*Samsung Electronics Co., Ltd.*, v. *Lynk Labs, Inc.* Patent Owner—Power of Attorney for Petitioner Samsung Electronics Co., Ltd. U.S. Pat. No. 10,506,674 dated Jul. 21, 2021—3 pages.
*Samsung Electronics Co., Ltd.*, v. *Lynk Labs, Inc.*, Case IPR2021-01299, U.S. Pat. No. 10,506,674—Notice of Filing Date Accorded to Petition and Time for Filing Patent Owner Preliminary Response filed Sep. 7, 2021—6 pages.
*Samsung Electronics Co., Ltd.* v. *Lynk Labs, Inc.* U.S. Pat. No. 10,492,251 Petition for Inter Partes Review of U.S. Pat. No. 10,492,251, 95 pages.
*Samsung Electronics Co., Ltd.* v. *Lynk Labs, Inc.* U.S. Pat. No. 10,492,251 Power of Attorney for Petitioner Samsung Electronics Co., Ltd. 3 pages.
*Samsung Electronics Co., Ltd.* v. *Lynk Labs, Inc.* U.S. Pat. No. 10,492,251 Petitioner's Notice Regarding Multiple Petitions, 9 pages.
*Samsung Electronics Co., Ltd.* v. *Lynk Labs, Inc.* Case: IPR2022-00051, U.S. Pat. No. 10,492,251 Patent Owner's Mandatory Notices Pursuant to 37 C.F.R. Section 42.8, 5 pages.
*Samsung Electronics Co., Ltd.* v. *Lynk Labs, Inc.*, U.S. Pat. No. 10,492,251 Declaration of R. Jacob Baker, Ph.D., P.E. In Support of Petition for Inter Partes Review of U.S. Pat. No. 10,492,251, 173 pages—Ex. 1002.
U.S. Appl. No. 16/148,945, filed Feb. 15, 2019, 309 pages—Ex. 1004.
U.S. Appl. No. 61/331,225, filed May 4, 2010, 63 pages—Ex. 1010.
Watson Mastering Electronics, Third Edition, pp. 1-151—Ex. 1012 and Ex. 1018.
Stan Gibilisco, Handbook of Radio & Wireless Technology, pp. 1-188—Ex. 1013.
Defendant Lynk Labs, Inc.'s Response to Plaintiffs' Initial Non-Infringement, Unenforceability, and Invalidity Contentions, 51 pages—Ex. 1038.
File History for U.S. Pat. No. 9,198,237 Issued May 18, 2011—Part 2, 321 pages—Ex. 1039.
Tim Williams, The Circuit Designer's Companion, First Published 1991, ISBN 0 7506 1142 1, 314 pages—Ex. 1042, Ex. 1094.
PCT File History US/2011/36359, filed May 12, 2011—Ex. 1050.
PCT File History US/2010/62235, filed Dec. 28, 2010—Ex. 1052, Ex. 1039.
U.S. Provisional Application filed May 12, 2010—Ex. 1063.
U.S. Provisional Application filed Dec. 28, 2009—Ex. 1064.
U.S. Provisional Application filed Dec. 31, 2009—Ex. 1065.
U.S. Appl. No. 60/547,653, filed Feb. 25, 2004—Ex. 1067.
U.S. Appl. No. 60/559,867, filed Feb. 25, 2004—Ex. 1068.
Civil Docket for Case# 6:21-cv-02665, Northern District of Illinois, Samsung Electronics. Co., Ltd., filed May 17, 2021, 14 pages—Ex. 1076, Ex. 1061.
Civil Docket for Case# 6:21-cv-00097-ADA, Western District of Texas (Waco)—Lynk Labs, Inc. filed Jan. 29, 2001, 9 pages—Ex. 1077, Ex. 1074.
US District Court for the Northern District of Illinois, Estimated Patent Case Schedule, 2 pages—Ex. 1079, Ex. 1062.
*Samsung Electronics Co., Ltd. and Samsung Electronics America, Inc.*, v. *Lynk Labs, Inc.*, Case No. 1:21-cv-02665—Supplemental Report of Parties' Planning Meeting, filed Oct. 14, 2021, 11 pages—Ex. 1080, Ex. 1075.
*Samsung Electronics Co., Ltd. and Samsung Electronics America, Inc.*, v. *Lynk Labs, Inc.*, Case No. 1:21-cv-02665—Defendant Lynk Labs, Inc's Answer to Plaintiffs Samsung Electronics Co., Ltd. and Samsung Electronics America, Inc.'s First Amended Complaint and Counterclaims, filed Aug. 3, 2021, 67 pages—Ex. 1082, Ex. 1071.
*Samsung Electronics Co., Ltd. and Samsung Electronics America, Inc.*, v. *Lynk Labs, Inc.*, Case No. 1:21-cv-02665—Defendant Lynk Labs, Inc.'s Amended Preliminary Infringement Contentions, 9 pages—Ex. 1083, Ex. 1066.
U.S. Pat. No. 10,492,251 ("the '251 Patent") Exemplary Infringement Contention Claim Charts, Appendix A-1 through J-1—Ex. 1084.

(56) References Cited

OTHER PUBLICATIONS

*Samsung Electronics Co., Ltd. et al.* v. *Lynk Labs, Inc.* Case No. 1:21-cv-02665, Notification of Docket Entry Jul. 27, 2021, 1 page—Ex. 1085, Ex. 1068.
*Samsung Electronics Co., Ltd., and Samsung Electronics America, Inc.* v. *Lynk Labs, Inc.*, No. 21 C 2665, Order dated Aug. 19, 2021—Ex. 1086.
*Samsung Electronics Co., Ltd. et al.* v. *Lynk Labs, Inc.* Case No. 1:21-cv-02665, Notification of Docket Entry Oct. 18, 2021, 1 page—Ex. 1087, Ex. 1070.
*Lynk Labs, Inc.*, v. *Home Dept USA, Inc., The Home Depot Inc., and Home Depot Product Authority, LLC*, Case. No. 6:21-cv-00097, Complaint for Patent Infringement dated Jan. 29, 2021, 88 page—Ex. 1088, Ex. 1072.
*Lynk Labs, Inc.*, v. *Home Dept USA, Inc., The Home Depot Inc., and Home Depot Product Authority, LLC*, Case. No. 6:21-cv-00097-ADA, First Amended Complaint for Patent Infringement dated Mar. 17, 2021, 94 pages—Ex. 1089, Ex. 1073.
*Samsung Electronics Co., Ltd. et al.* v. *Lynk Labs, Inc.* Case IPR2022-00051, U.S. Pat. No. 10,492,251 Notice of Filing Date Accorded to Petition, mailed Dec. 9, 2021, 5 pages.
U.S. Pat. No. 10,091,842 ("'842 Patent")—Exhibit G-01 Bruning.
U.S. Pat. No. 10,091,842 ("'842 Patent")—Exhibit G-02 Ohishi '319.
U.S. Pat. No. 10,091,842 ("'842 Patent")—Exhibit G-03 Ruxton.
U.S. Pat. No. 10,091,842 ("'842 Patent")—Exhibit G-04 Walding.
U.S. Pat. No. 10,091,842 ("'842 Patent")—Exhibit G-05 Bohn.
U.S. Pat. No. 10,091,842 ("'842 Patent")—Exhibit G-06 Dowling.
U.S. Pat. No. 10,537,001 ("'001 Patent")—Exhibit H-01 Dowling.
U.S. Pat. No. 10,537,001 ("'001 Patent")—Exhibit H-02 Lys '321.
U.S. Pat. No. 10,537,001 ("'001 Patent")—Exhibit H-03 Miskin.
U.S. Pat. No. 10,537,001 ("'001 Patent")—Exhibit H-04 Leong '003.
U.S. Pat. No. 10,537,001 ("'001 Patent")—Exhibit H-05 Konno.
U.S. Pat. No. 10,932,341 ("'341 Patent")—Exhibit I-01 Ohishi '009.
U.S. Pat. No. 10,932,341 ("'341 Patent")—Exhibit I-02 Muthu '558.
U.S. Pat. No. 10,932,341 ("'341 Patent")—Exhibit I-03 Dowling.
U.S. Pat. No. 10,932,341 ("'341 Patent")—Exhibit I-04 Konno.
U.S. Pat. No. 10,932,341 ("'341 Patent")—Exhibit I-05 Leong '003.
U.S. Pat. No. 10,932,341 ("'341 Patent")—Exhibit I-06 Reymond.
"White Light Emitting Diode Development for General Illumination Applications" to James Ibbetson, published on May 1, 2006 ("Ibbetson").

\* cited by examiner

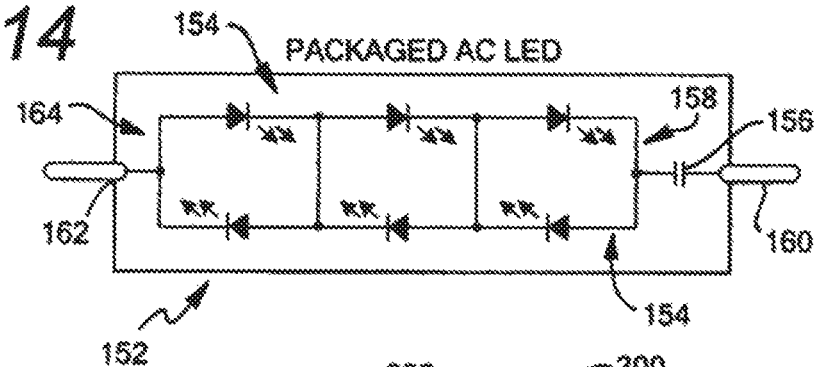
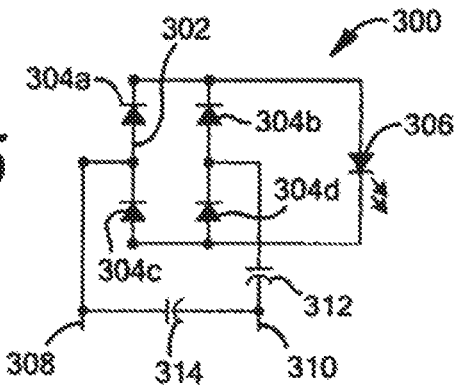
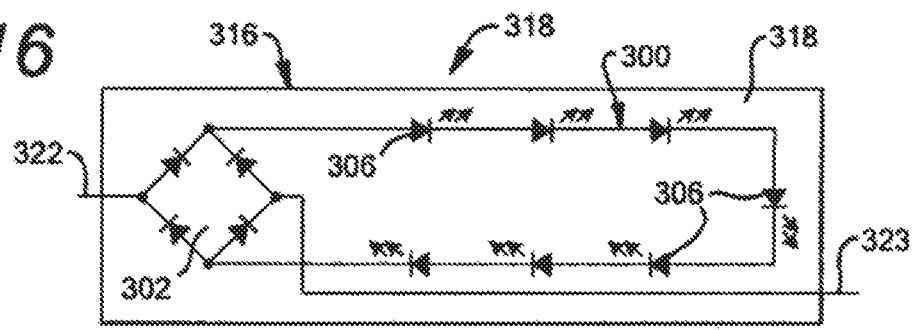
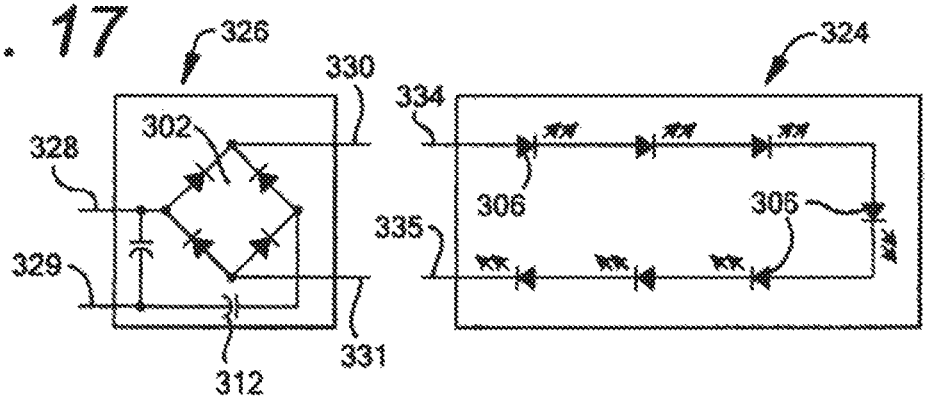

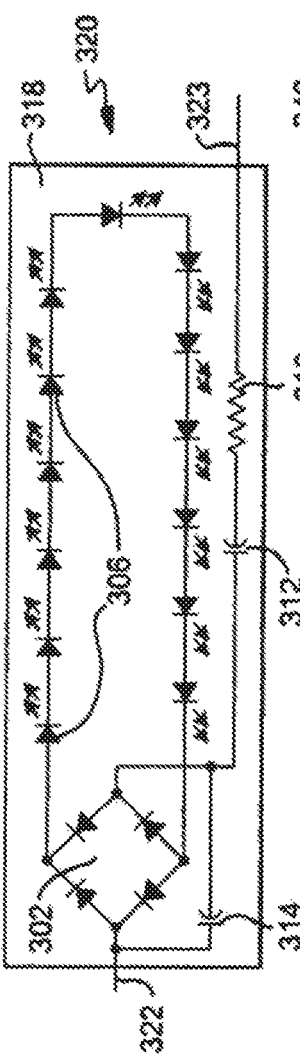
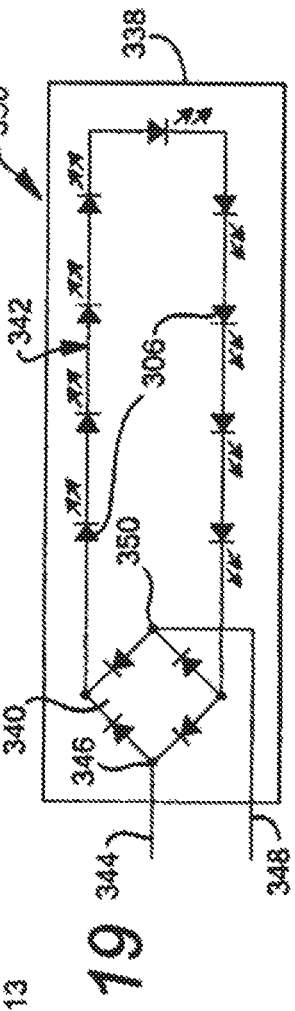
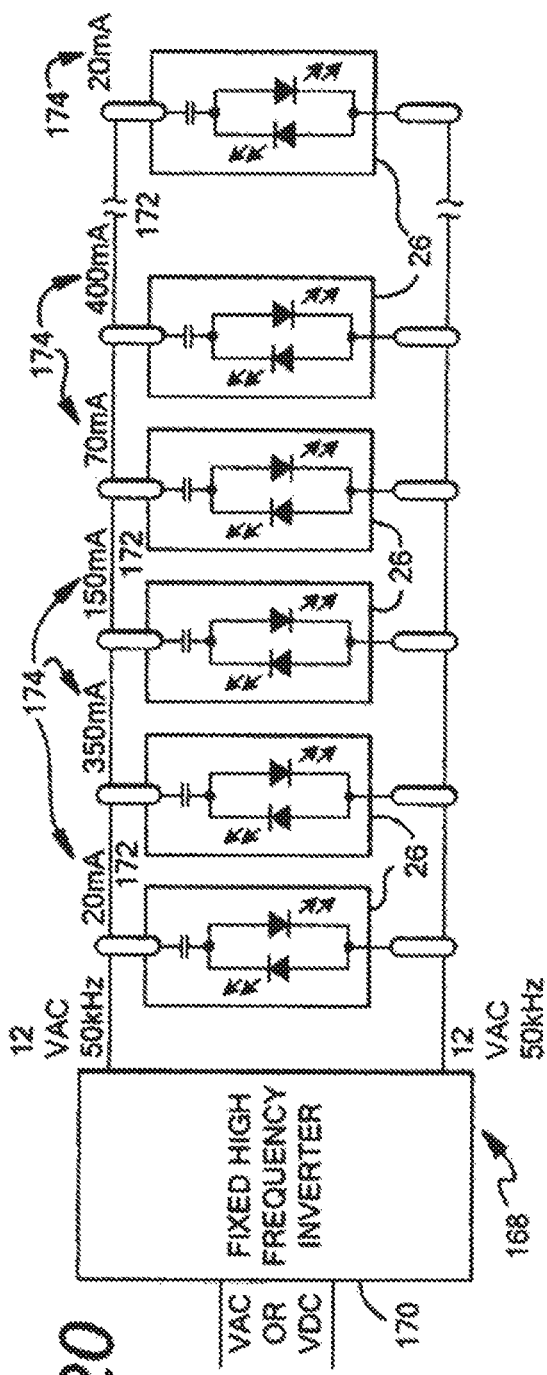
FIG. 18
FIG. 19
FIG. 20

AC VOLTAGE REGULATOR WITH VOLTAGE MEASUREMENT

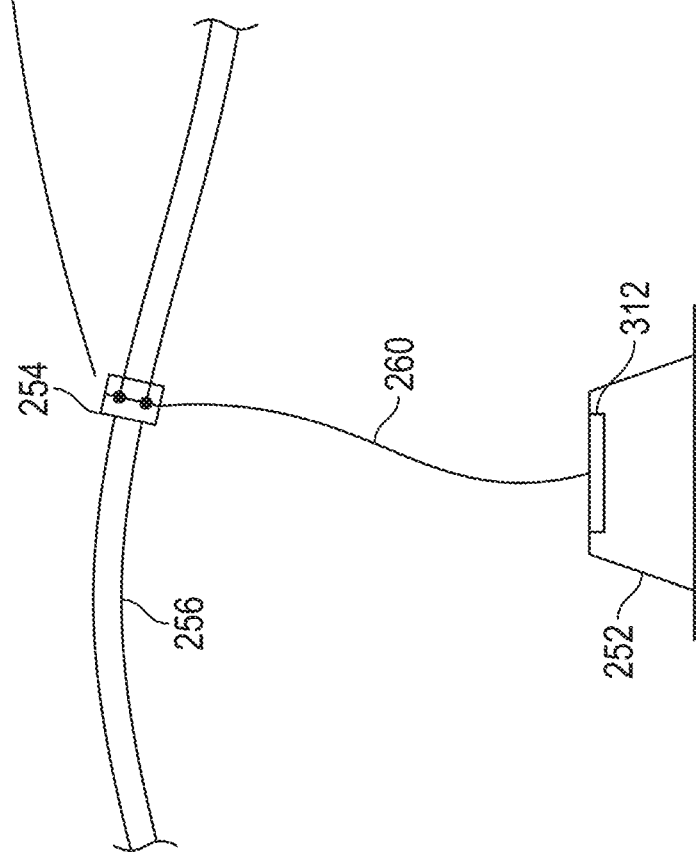

LED LIGHTING SYSTEM AND INSTALLATION METHODS

PRIORITY CLAIM

The present application claims priority to and the benefit of U.S. patent application Ser. No. 16/120,003, filed on Aug. 31, 2018 (now U.S. Pat. No. 11,079,077 issued on Aug. 3, 2021), which claims priority to U.S. Provisional Patent Application No. 62/605,890, filed on Aug. 31, 2017, the entirety of which are incorporated by reference in their entirety.

CROSS-REFERENCE TO RELATED APPLICATIONS

The present application is related to U.S. patent application Ser. No. 11/066,414 filed on Feb. 25, 2005 (now U.S. Pat. No. 7,489,086 issued on Feb. 10, 2009), U.S. patent application Ser. No. 12/364,890 filed on Feb. 3, 2009 (now U.S. Pat. No. 8,148,905 issued on Apr. 3, 2012), U.S. patent application Ser. No. 13/437,832 filed on Apr. 2, 2012 (now U.S. Pat. No. 8,531,118 issued on Sep. 10, 2013), U.S. patent application Ser. No. 15/334,020 filed on Oct. 25, 2016 (now U.S. Pat. No. 9,807,827 issued on Oct. 31, 2017), U.S. patent application Ser. No. 15/334,029 filed on Oct. 25, 2016 (published as U.S. Patent Application Publication No. 2017/0208656 A1 on Jul. 20, 2012 and published as U.S. Patent Application Publication No. 2018/0146522 A9 on May 24, 2018), U.S. patent application Ser. No. 10/505,909 filed on Apr. 19, 2005 (now U.S. Pat. No. 8,742,630 issued on Jun. 3, 2014), U.S. patent application Ser. No. 12/287,267 filed on Oct. 6, 2008 (now U.S. Pat. No. 8,179,055 issued on May 15, 2012), U.S. patent application Ser. No. 13/450,938 filed on Apr. 9, 2012 (now U.S. Pat. No. 8,841,855 issued on Sep. 23, 2014), U.S. patent application Ser. No. 13/322,796 filed on Nov. 28, 2011 (now U.S. Pat. No. 8,648,539 issued on Feb. 11, 2014), U.S. patent application Ser. No. 14/172,644 filed on Feb. 4, 2014 (now U.S. Pat. No. 9,750,098 issued on Aug. 29, 2017), U.S. patent application Ser. No. 15/685,429 filed on Aug. 24, 2017 (published as U.S. Patent Application Publication No. 2017/0354005 A1 on Dec. 7, 2017), U.S. patent application Ser. No. 14/519,487 filed on Jun. 27, 2012 (published as U.S. Patent Application Publication No. 2012/0293083 A1 on Nov. 22, 2012), U.S. patent application Ser. No. 13/697,646 filed on Nov. 13, 2012 (now U.S. Pat. No. 9,198,237 issued on Nov. 24, 2015), U.S. patent application Ser. No. 14/948,635 filed on Nov. 23, 2015 (now U.S. Pat. No. 9,615,420 issued on Apr. 4, 2017), U.S. patent application Ser. No. 15/477,702 filed on Apr. 3, 2017 (now U.S. Pat. No. 10,051,703 issued on Aug. 14, 2018), U.S. patent application Ser. No. 14/886,252 filed on Oct. 19, 2015 (now U.S. Pat. No. 9,693,405 issued on Jun. 27, 2017), U.S. patent application Ser. No. 14/362,173 filed on Jun. 2, 2014 (now U.S. Pat. No. 9,247,597 issued on Jan. 26, 2016), U.S. patent application Ser. No. 15/005,108 filed on Jan. 25, 2016 (now U.S. Pat. No. 9,516,716 issued on Dec. 6, 2016), U.S. patent application Ser. No. 15/369,218 filed on Dec. 5, 2016 (published as U.S. Patent Application Publication No. 2017/0188426 A1 on Jun. 29, 2017), and U.S. patent application Ser. No. 15/564,830 filed on Oct. 6, 2017 (published as U.S. Patent Application Publication No. 2018/0110101 A1 on Apr. 19, 2018), all of which are incorporated by reference in their entirety.

BACKGROUND

1. Technical Field

This disclosure generally relates to light emitting diodes ("LEDs") and LED lighting systems. More particularly, this disclosure specifically relates to LED downlighting systems and methods of installing such LED downlighting systems.

2. Description of the Related Art

LEDs are semiconductor devices that produce light when a current is supplied to them. LEDs are intrinsically DC devices that only pass current in one polarity and historically have been driven by DC voltage sources using resistors, current regulators and voltage regulators to limit the voltage and current delivered to the LED. Some LEDs have resistors built into the LED package providing a higher voltage LED typically driven with 5V DC or 12V DC.

With proper design considerations LEDs may be driven more efficiently with AC than with DC drive schemes. LED based lighting may be used for general lighting, specialty lighting, signs and decoration such as for Christmas tree lighting. For example, U.S. Pat. No. 5,495,147 entitled LED LIGHT STRING SYSTEM to Lanzisera (hereinafter "Lanzisera") and U.S. Pat. No. 4,984,999 entitled STRING OF LIGHTS SPECIFICATION to Leake (hereinafter "Leake") describe different forms of LED based light strings. In both Lanzisera and Leake, exemplary light strings are described employing purely parallel wiring of discrete LED lamps using a step-down transformer and rectifier power conversion scheme. This type of LED light string converts input electrical power, usually assumed to be the common U.S. household power of 110 VAC, to a low voltage, rectified to nearly DC input.

U.S. Patent Publication No. 2003/0015968A1 entitled PREFERRED EMBODIMENT TO LED LIGHT STRING to Allen (hereinafter "Allen") discloses AC powered LED-based light strings. Allen describes LED light strings employing series parallel blocks with a voltage matching requirement for direct AC drive placing fundamental restrictions on the number of diodes (LEDs) on each diode series block, depending on the types of diodes used. Allen discloses that for the forward voltage to be "matched," in each series block, the peak input voltage must be less than or equal to the sum of the maximum forward voltages for each series block in order to prevent over-driving.

LEDs can be operated from an AC source more efficiently if they are connected in an "opposing parallel" configuration as shown by WO98/02020 and JP11/330561. More efficient LED lighting systems can be designed using high frequency AC drivers as shown by Patent Publication Number 20030122502 entitled Light Emitting Diode Driver ("Clauberg et. al.") Clauberg et. al. discloses that higher frequency inverters may be used to drive an opposing parallel LED pair, an opposing parallel LED string and/or an opposing parallel LED matrix by coupling the LEDs to a high frequency inverter through a resonant impedance circuit that includes a first capacitor coupled in series to one or more inductors with the impedance circuit coupled in series to opposing parallel LEDs with each set of LEDs having a second series capacitor in series to the impedance circuit. In this system additional opposing parallel configurations of LEDs with capacitors may not be added to or removed from the output of the driver without effecting the lumens output of the previously connected LED circuits unless the driver or components at the driver and/or the opposing parallel LED capacitors were replaced with proper values. By adding or removing the opposing parallel LED circuits the voltage would increase or drop at the inductor and the current would increase or drop through the first series capacitor as the load changed therefore the inductor and all capacitors or entire driver would need to be replaced or adjusted each time additional LEDs were added to or removed from the system.

U.S. Patent Publication No. 2004/0080941 entitled Light Emitting Diodes For High AC Voltage Operation And General Lighting discloses that a plurality of opposing parallel series strings of LEDs can be integrated into a single chip and driven with high voltage low frequency mains AC power sources as long as there are enough LEDs in each opposing parallel series string of LEDs to drop the total source voltage across the series LEDs within the chip. Patent numbers WO2004023568 and JP2004006582 disclose that a plurality of opposing parallel series strings or opposing parallel series matrix of LEDs can be integrated into a single chip and mounted on an insulating substrate and driven with a high drive voltage and low drive current as long as there are enough LEDs in each opposing parallel series string of LEDs to drop the total source voltage across the series LEDs within the chip. These patents and application disclose that for single chip or packaged LED circuits a plurality of opposing parallel series strings are required with the total number of LEDs in each series string needing to be equal to or greater than the AC voltage source in order to drop the total forward voltage and provide the required drive current when driven direct with low frequency AC mains power sources.

LED downlighting systems come in many shapes and sizes and deliver various levels of light at different distribution patterns of light. These systems generally are designed to a) recess into ceilings, mount flush to ceilings or hang from ceilings by post or cable connections. In any of these cases, downlighting are designed to be hard wired into either high voltage or low voltage sources for the electrical installation requirement. These voltage sources can be AC or DC depending on the system design and technology implemented in the system.

In AC powered LED downlighting systems each individual downlight is generally connected direct to mains high voltage. In most cases the electrical connection method will be to hard wire the downlights into the high voltage mains within an electrical junction box using wire nuts, crimps or other connecters appropriate to connect together the spliced wires from the mains, and the spliced wires from the LED downlight. Typically this will require splicing and connecting 6 wires which include the line, neutral and ground wires from each end, the mains and the LED downlight each having one of these three—line, neutral and ground. Typically this can also require a professional electrician adding more cost to installation. Specifically in cases where multiple downlights are required, this cost can get expensive.

In some low voltage LED downlight design, the low voltage AC or DC power supply and/or driver "driver" is an integral part of the LED downlight and only requires the wiring to the mains voltage. In other cases, it is not and is provided as a remote, non-integrated power supply for the downlights.

In some low voltage AC or DC powered LED downlighting systems the downlight system electrical connection requirement is more complex and requires more wire connections and multiple steps to connect the low voltage driver to a mains power source and then to the LED downlight. First, the low voltage driver requires a mains AC or DC voltage input connection, which is generally mains AC, and it requires a DC voltage output connection to the LED downlight.

In most cases for downlight system using remote low voltage driver/power supplies, the driver must be hard wired to the high voltage mains within an electrical junction box using wire nuts, crimps or other connecters appropriate to connect together the spliced wires from the mains, and the spliced wires from the low voltage driver input voltage connection a as first step, then the output of the low voltage driver is wired to the LED downlight fixture. This requires even more wires to be spliced and connected together with using wire nuts, crimping wire connectors, or other connecters appropriate to connect together the spliced wires from the low voltage driver output wires to the input wires of the LED downlights.

In all of these LED downlight system designs weather using AC direct or low voltage drivers, integrated or remote drivers, the electrical installation is somewhat complicated and similar for conventional lighting installations and requires splicing at multiple pairs of wires, connecting multiple pairs of wires together using wire nuts, crimp connectors and or other connectors from multiple input and output voltage sources.

SUMMARY

In one example embodiment, an LED lighting system includes an LED downlight that is mountable to a ceiling, an LED driver, and an insulation displacement connector. The LED downlight includes an LED circuit. Light from the LED downlight is capable of facing downward relative to the ceiling to project light or facing upward relative to the ceiling to reflect light off of the ceiling. The LED driver has an input with a first voltage and an output with a second voltage, with the second voltage being lower than the first voltage and being provided through a wire system extending from the LED driver. The insulation displacement connector is for connecting the LED downlight to the wire system extending from the LED driver. The LED lighting system is configured to allow changing the LED lighting system from a first configuration to a second configuration by at least one of adding one or more additional LED downlights to the LED lighting system using one or more corresponding insulation displacement connectors or removing one or more existing LED downlights from the LED lighting system using one or more corresponding insulation displacement connectors. The second configuration for the LED lighting system does not significantly affect a predetermined desired output range of light from any LED downlight in the LED lighting system or from any LED circuit of any LED downlight in the LED lighting system that remains from or is preexisting from the first configuration. If one or more existing LED downlights are removed from the LED lighting system to form the second configuration, at least one LED downlight remains in the second configuration of the LED lighting system. Further, a method of installing the above-described LED lighting system is also provided.

In another example embodiment, the lighting system comprises an LED circuit, a driver, and insulation displacement connector. The LED circuit includes at least one LED. The LED circuit is integrated in a lighting fixture of the lighting system, and the LED circuit is capable of emitting light during both a positive phase and a negative phase of a mains AC power source. The driver is connected to the LED circuit. The driver has an input for receiving an input voltage from a mains voltage source and an output for providing an output voltage and an output current to the LED circuit through a wire system extending from the driver, the output voltage and output current being relatively constant when connected to the LED circuit. The insulation displacement connector is for connecting the lighting fixture to the wire system extending from the driver. The lighting system is configured to allow changing the lighting system from a first configuration to a second configuration by at least one of adding one or more additional lighting fixtures to the lighting system using one or more corresponding insulation displacement connectors or removing one or more existing lighting fixtures from the lighting system using one or more corresponding insulation displacement connectors. The second configuration for the lighting system does not significantly affect a predetermined desired output range of light from any lighting fixture in the lighting system or from any LED circuit of any lighting fixture in the lighting system that remains from or is preexisting from the first configuration. If one or more existing lighting fixtures are removed from the lighting system to form the second configuration, at least one lighting fixture remains in the second configuration of the lighting system. Further, a method of installing the above-described lighting system is also provided.

The foregoing forms as well as other forms, features and advantages of the present invention will become further apparent from the following detailed description of the presently preferred embodiments, read in conjunction with the accompanying drawings. The detailed description and drawings are merely illustrative of the present invention rather than limiting, the scope of the present invention being defined by the appended claims and equivalents thereof.

BRIEF DESCRIPTION OF THE DRAWINGS

FIG. 14 shows a schematic view in accordance with an example embodiment;
FIG. 15 shows a schematic view in accordance with an example embodiment;
FIG. 16 shows a shows a schematic view in accordance with an example embodiment;
FIG. 17 shows a schematic view in accordance with an example embodiment;
FIG. 18 shows a schematic view in accordance with an example embodiment;
FIG. 19 shows a schematic view in accordance with an example embodiment;
FIG. 20 shows a schematic view in accordance with an example embodiment;
FIG. 39 shows a schematic view of an enlarged portion of an LED downlighting system from FIG. 37 in accordance with an example embodiment;
FIG. 40 shows a schematic view of an enlarged portion of an insulating displacement connector from FIG. 39 in accordance with an example embodiment.

DETAILED DESCRIPTION

Figure 1:
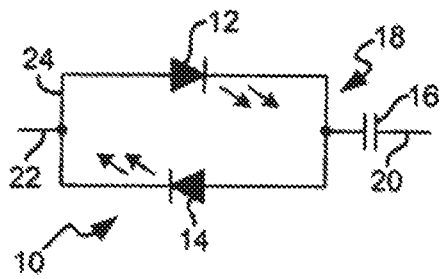
FIG. 1 shows a schematic view in accordance with an example embodiment.

While this invention is susceptible to embodiments in many different forms, there is described in detail herein, preferred embodiments of the invention with the understanding that the present disclosures are to be considered as exemplifications of the principles of the invention and are not intended to limit the broad aspects of the invention to the embodiments illustrated.

The present invention proposes that low voltage downlight systems that include downlights and remote drivers, can be installed similar to low voltage garden pathway lights, thereby providing a much simpler installation process with less work, reduced and simplified electrical wiring and lower cost to the end user by connecting downlights in parallel using insulation displacement "IDC" connectors across a low voltage pair of wires (similar to garden lighting) that are treated like a power buss that is coming from the output of the low voltage LED downlight driver. The driver may also be integrated into a junction box and then provide at least one pair of wires out that can be laced across a ceiling for installation of downlights at desired locations within the ceiling.

In most cases the present invention may also substantially reduce and or eliminate the need to pay for the expense of a professional electrician and allows an installer of these downlights to make the final electrical connections using only a simple tool such as pliers or the like. In the case of DC power supplier that require polarity, it is contemplated the IDC connector could be keyed and/or marked and that the wire could be keyed and or marked as one option, and another option is to have polarity sensing capability and circuitry in the LED downlight that would prevent and correct for any improper polarity connections to the IDC connectors.

Some illustrative embodiments are directed to an LED light emitting device and LED light system capable of operating during both the positive and negative phase of an AC power supply. In order to operate during both phases provided by an AC power, as is shown herein, the circuit must allow current to flow during both the positive and negative phases and LED light emitting devices may be configured such that at least one LED is capable of emitting light during one or both of the positive or negative phases. In order to accomplish this, the LED circuit itself may be configured so as to allow current to pass during both phases, or the device may include a bridge rectifier to rectify AC power for use by single LEDs, series strings of LEDs, and parallel series strings of LEDs. Rectification may be accomplished within the light emitting device, or prior to any power being provided to the same. Once integrated into a light system, the present invention further contemplates a driver having the ability to provide a substantially constant voltage at a substantially constant frequency, and that the driver be configured in a manner which will allow LED light emitting devices to be added to or subtracted from the system, regardless of configuration, without having to add, subtract, or change the values of discrete circuit components and without affecting the light output of any individual LED.

FIG. 1 discloses a schematic diagram of a light emitting device 10 for an AC driver according to one embodiment of the invention. The device 10 includes a first LED 12 connected to a second LED 14 in opposing parallel configuration, a capacitor 16 connected in series between a first junction 18 of the two opposing parallel LEDs, a first power connection 20 connected to the two opposing parallel LEDs, and a second power connection 22 connected to a second junction 24 of the two opposing parallel connected LEDs. A diode may be used in place of LED 12 or LED 14.

Figure 2:
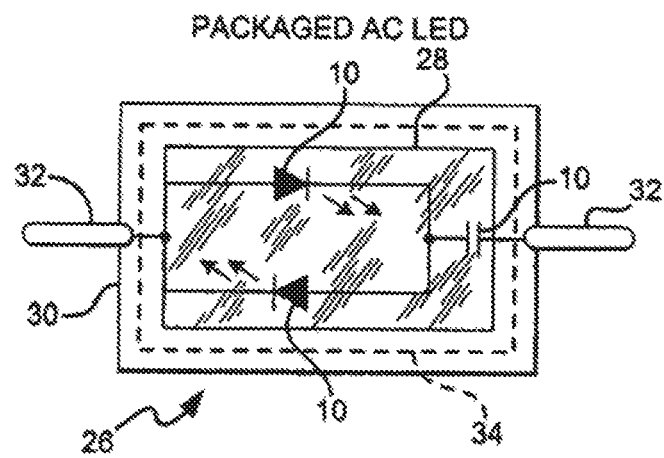
FIG. 2 shows a schematic view in accordance with an example embodiment.

FIG. 2 discloses a schematic diagram of a light emitting device 26 for an LED circuit driver according to an embodiment of the invention. The device 26 includes the device 10 as disclosed in FIG. 1 mounted on an insulating substrate 28 such as, but not necessarily, ceramic or sapphire, and integrated into an LED package 30 that may be various LED package sizes; materials and designs based of product specifications or on printed circuit board material. The device 26 provides power connection leads 32 and may have a first or additional lens 34 that may be made of a plastic, polymer or other material used for light dispersion and the lens may be coated or doped with a phosphor or nano-particle that would produce a change in the color or quality of light emitted from the device 10 through the lens 34.

Figure 3:
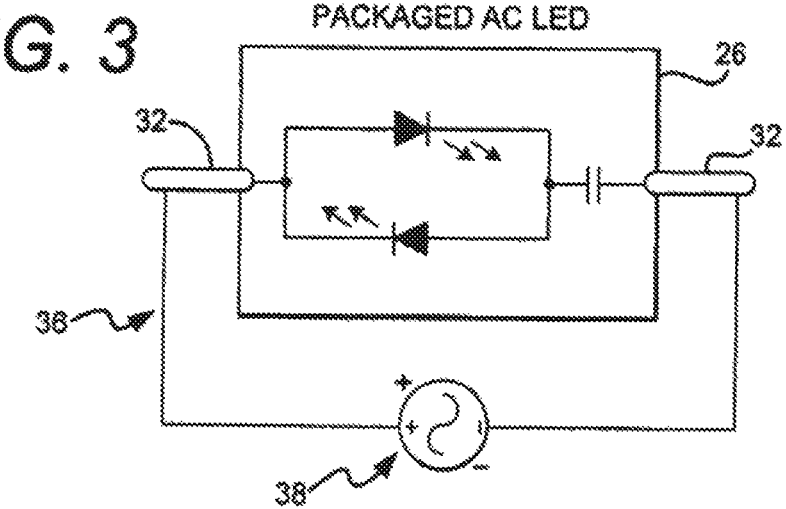
FIG. 3 shows a schematic view in accordance with an example embodiment.

FIG. 3 discloses a schematic diagram of a device 36 having a schematic diagram of the embodiment shown as light emitting device 26 driven directly by an AC driver 38 that is connected to the power connections 32 of the device 26 without any additional components in series between the AC driver 38 and the device 26 such as a capacitor, inductor or resistor. The AC driver 38 provides a relatively constant AC voltage and frequency output to the device 26 no matter what the total load of the device 26 may be, or the number of devices 26 added or subtracted as long as the load does not exceed the wattage limitation of the AC driver 38. The AC driver 38 may be a generator, a mains power source, or an inverter capable of providing a relatively fixed voltage and relatively fixed frequency output to different size loads. The AC driver may provide a low or high voltage and a low or high frequency to the device 26 according to the invention as long as the capacitor 16 is the proper value for the desired operation of the device 26.

Figure 4:
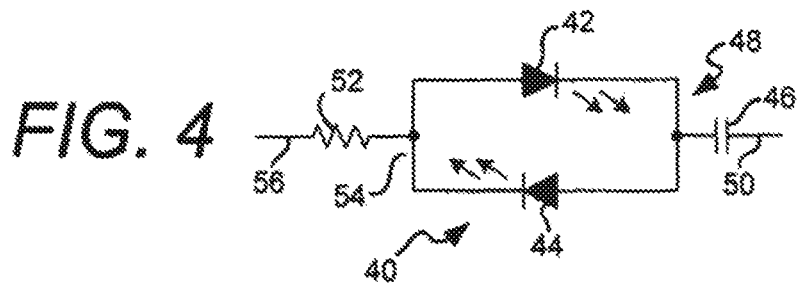
FIG. 4 shows a schematic view in accordance with an example embodiment.

FIG. 4 discloses a schematic diagram of a light emitting device 40 for coupling to an LED circuit driver according to an embodiment of the invention. The device 40 includes a first LED 42 connected to a second LED 44 in opposing parallel configuration. A capacitor 46 is connected in series between a first junction 48 of the two opposing parallel LEDs and a first power connection 50. A resistor 52 is connected in series between a second junction 54 of the two opposing parallel LEDs and a second power connection 56. A diode may be used in place of LED 42 or LED 44 and the resistor 52 may be put in series on either end of the capacitor 46 as an alternate location.

Figure 5:
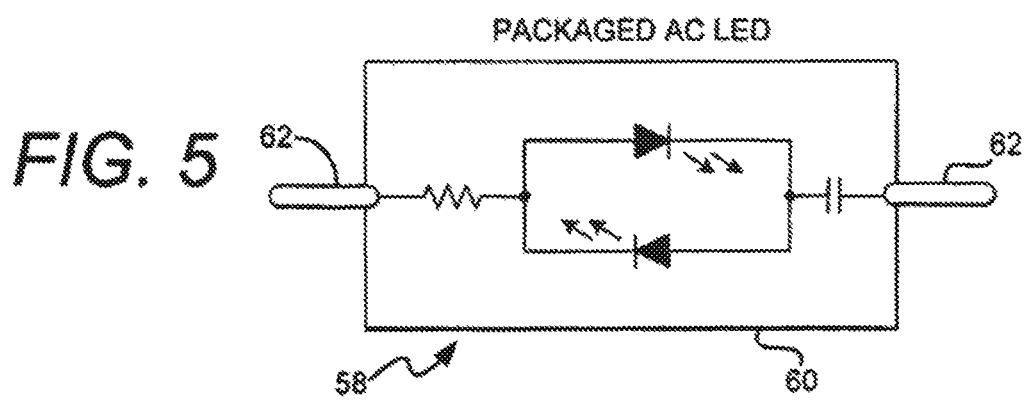
FIG. 5 shows a schematic view in accordance with an example embodiment.

FIG. 5 discloses a schematic diagram of a light emitting device 58 for LED circuit drivers according to an embodiment of the invention. The device 58 includes the device 40 as disclosed in FIG. 4 integrated into a package as disclosed in the device 26 in FIG. 2. The device 58 provides power connection leads for connecting to an AC driver 38 as disclosed in FIG. 3.

Figure 6:
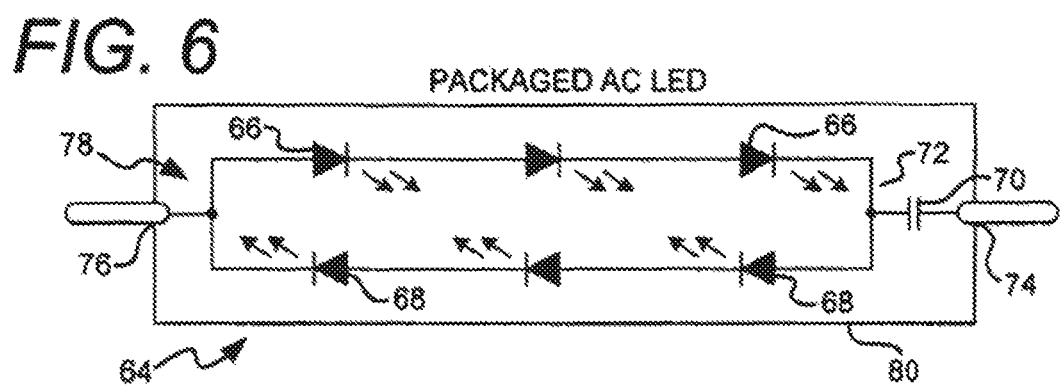
FIG. 6 shows a schematic view in accordance with an example embodiment.

FIG. 6 discloses a diagram of a light emitting device 64 for coupling to an LED circuit driver according to an embodiment of the invention. The device 64 includes a first series string of LEDs 66 connected to a second series string of LEDs 68 in opposing parallel configuration, a capacitor 70 connected in series between a first junction 72 of the opposing parallel series string of LEDs and a first power connection 74, and a second power connection 76 connected to a second junction 78 of the opposing parallel series string of LEDs. A diode may be used in place of one or more LEDs 66 and one or more of LEDs 68 and the LEDs 66 and 68 are integrated into a package 80 as described in the package 30 disclosed in FIG. 2 along with capacitor 70.

Figure 7:
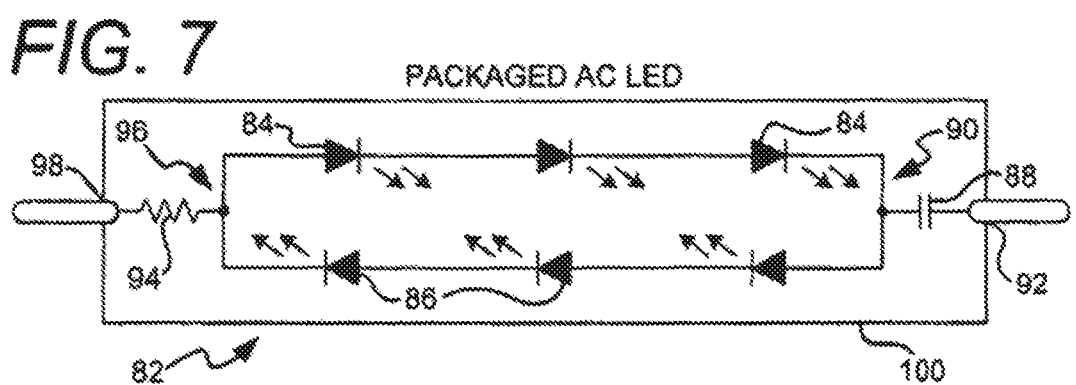
FIG. 7 shows a schematic view in accordance with an example embodiment.

FIG. 7 discloses a diagram of a light emitting device 82 for AC drive according to an embodiment of the invention. The device 82 includes a first series string of LEDs 84 connected to a second series string of LEDs 86 in opposing parallel configuration, a capacitor 88 connected in series between a first junction 90 of the opposing parallel series string of LEDs and a first power connection 92, and a resistor 94 connected in series between a second junction 96 of the opposing parallel series string of LEDs and a second power connection 98. A diode may be used in place of one or more LEDs 84 and one or more of LEDs 86 and the LEDs 84 and 86 are integrated into a package 100 as described in the package 30 disclosed in FIG. 2 along with capacitor 88 and resistor 94. The resistor 94 may be put in series on either end of the capacitor 88 as an alternate location.

Figure 8:
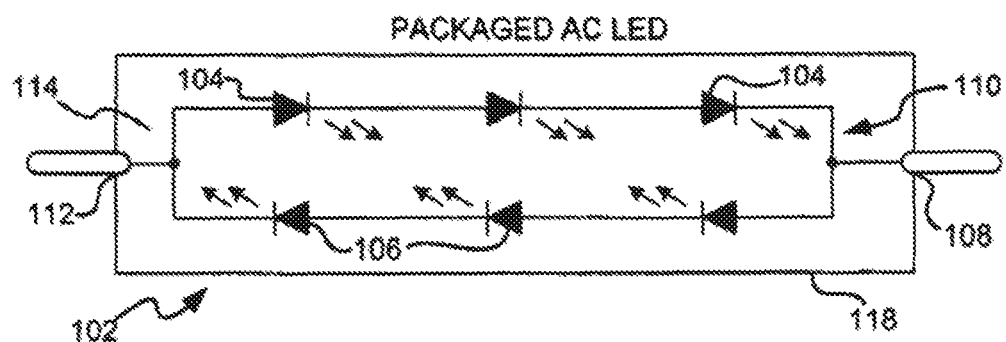
FIG. 8 shows a schematic view in accordance with an example embodiment.

FIG. 8 discloses a diagram of a light emitting device 102 according to an embodiment of the invention. The device 102 includes a first series string of LEDs 104 connected to a second series string of LEDs 106 in opposing parallel configuration. A first power connection 108 is connected to a first junction 110 of the opposing parallel series string of LEDs and a second power connection 112 is connected to a second junction 114 of the opposing parallel series string of LEDs. A diode may be used in place of one or more LEDs 104 and one or more of LEDs 106 and the LEDs 104 and 106 are integrated into a package 118 as described in the package 30 disclosed in FIG. 2.

Figure 9:
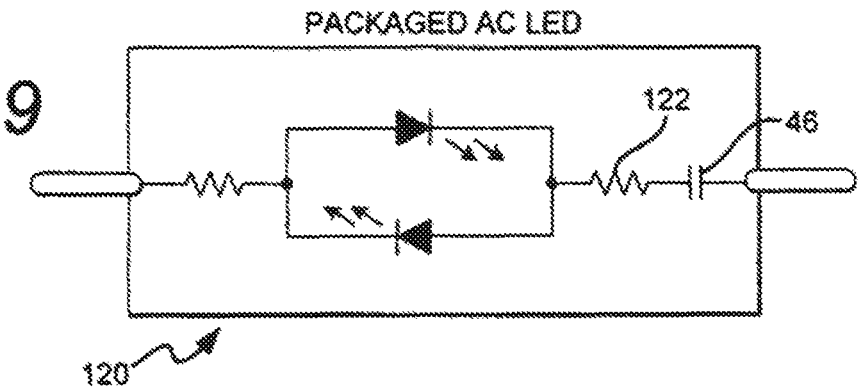
FIG. 9 shows a schematic view in accordance with an example embodiment.

FIG. 9 discloses a circuit diagram of a light emitting device 120 according to an embodiment of the invention. The device 120 is similar to the device disclosed in FIG. 5 and includes a second series resistor 122 that can be placed in series on either side of the first capacitor 46.

Figure 10:
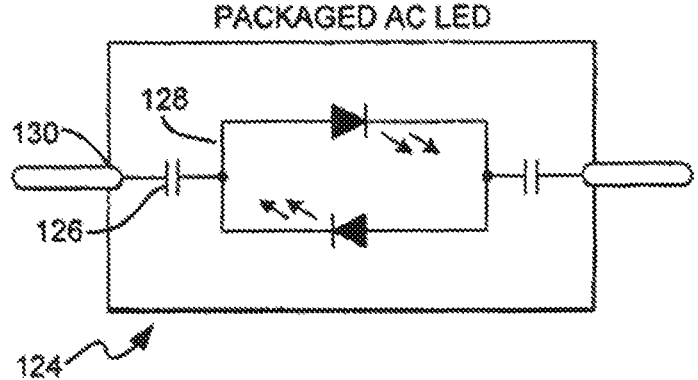
FIG. 10 shows a schematic view in accordance with an example embodiment.

FIG. 10 discloses a diagram of a light emitting device 124 according to an embodiment of the invention. The device 124 is similar to the device disclosed in FIG. 2 and includes a second series capacitor 126 connected in series between the junction 128 of the opposing parallel LEDs and a power connection 130.

Figure 11:
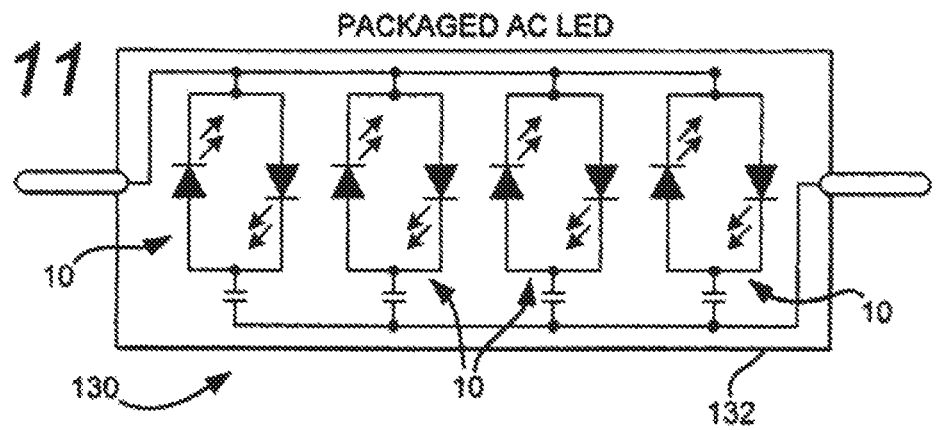
FIG. 11 shows a schematic view in accordance with an example embodiment.

FIG. 11 discloses a diagram of a light emitting device 130 according to an embodiment of the invention. The device 130 has a matrix of individual light emitting devices 10 as described in FIG. 1 integrated into a package 132 similar to package 30 as described in FIG. 2.

Figure 12:
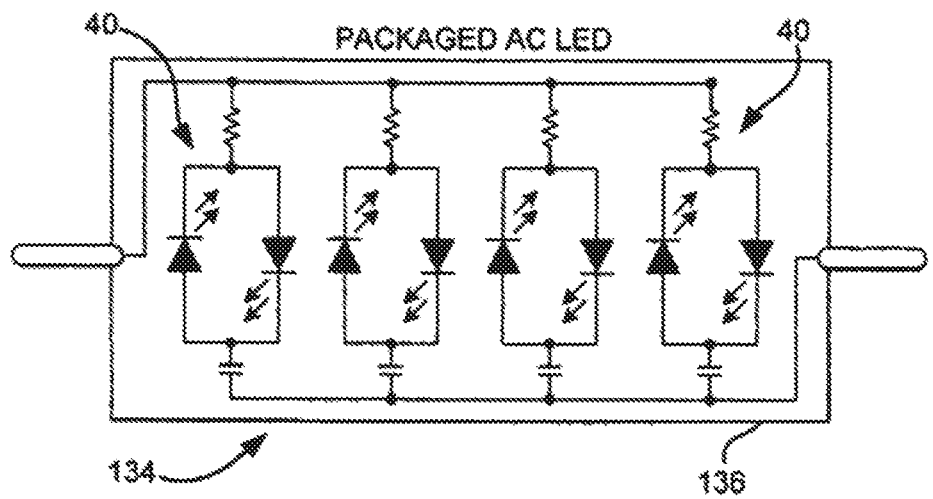
FIG. 12 shows a schematic view in accordance with an example embodiment.

FIG. 12 discloses a diagram of a light emitting device 134 according to an embodiment of the invention. The device 134 has a matrix of individual light emitting devices 40 as described in FIG. 4 integrated into a package 136 similar to package 30 as described in FIG. 2.

Figure 13:
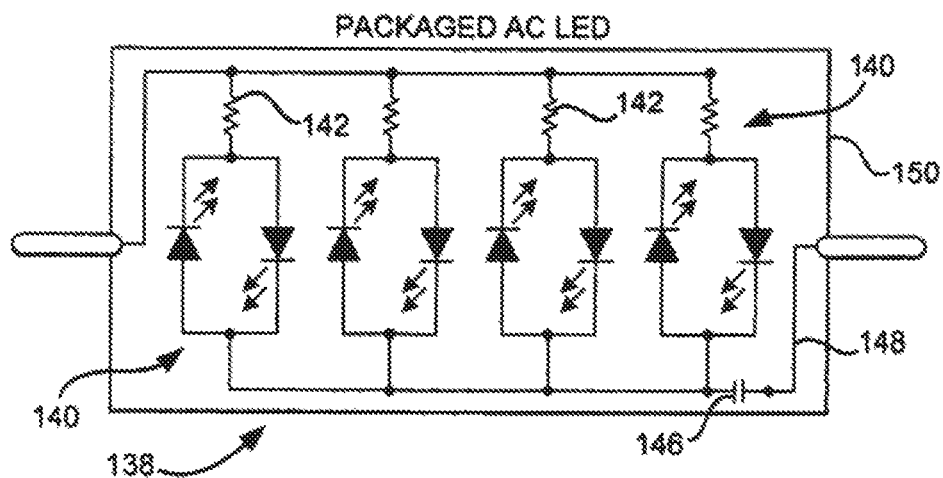
FIG. 13 shows a schematic view in accordance with an example embodiment.

FIG. 13 discloses a diagram of a light emitting device 138 according to an embodiment of the invention. The device 138 has a matrix of individual sets of 2 opposing parallel light emitting devices 140 with each set having an individual series resistor to connect to a first power connection 140 and a capacitor 146 connected in series between a second power connection and the matrix of devices 140. The capacitor 146 may alternately be in series between the first power connection 144 and all resistors 142. The matrix of devices 140, resistors 142 and capacitor 146 are integrated into a package 150 similar to package 30 as described in FIG. 2.

FIG. 14 discloses a diagram of a light emitting device 152 according to an embodiment of the invention. The device 152 includes another version of a series opposing parallel LED matrix 154 and a capacitor 156 connected in series between a first junction 158 of the opposing parallel LED matrix 154 and a first power connection, and a second power connection 162 connected to a second junction 164 of the opposing parallel LED matrix. A first power connection 108 is connected to a first junction 110 of the opposing parallel series string of LEDs and a second power connection 112 is connected to a second junction 114 of the opposing parallel series string of LEDs. A diode may be used in place of one or more LEDs 104 and one or more of LEDs 106 and the LEDs 104 and 106 are integrated into a package 118 as described in the package 30 disclosed in FIG. 2.

FIG. 15 discloses a schematic diagram of a light emitting device 300 according to an embodiment of the invention. Device 300 includes bridge rectifier circuit 302 having diodes 304a-304d with at least one LED connected across the output of the rectifier circuit, shown as LED 306. While inputs 308 and 310 of the bridge rectifier may be provided for direct connection to an AC power supply, it is contemplated by the invention that one input, shown as input 310, may have a capacitor (shown as capacitor 312) or a resistor (shown in FIG. 18 as resistor 313) connected in series in order to control and limit the current passing through the at least one LED. Additionally, capacitor 314 may be connected across the rectifier inputs to protect against voltage spikes.

FIGS. 16 and 18 each disclose a schematic diagram of a light emitting device 316 and 332 for an LED circuit driver according to an embodiment of the invention. The device 316 includes the device 300 as disclosed in FIG. 15 (with additional LEDs 306 added in series) mounted on an insulating substrate 318 such as, but not necessarily, ceramic or sapphire, and forming an LED package 320 that may be various sizes; materials and designs based of product specifications or on printed circuit board material. As shown in FIG. 16, The device 316, 332 provides power connection leads 322 and 323 and may have a first or additional lens that may be made of a plastic, polymer or other material used for light dispersion and the lens may be coated or doped with a phosphor or nano-particle that would produce a change in the color or quality of light emitted from device 300 through the lens. LED package 320 may include rectifier 302 to drive LEDs 306. Rectifier 306 may be mounted on insulating substrate 318 along with any LEDs. As should be appreciated by those having ordinary skill in the art, it is contemplated by the invention that any diode or LED may be swapped for the other within the package so long as the package includes at least one LED to emit light when in operation. Any capacitors 312, 314 or resistors 313 included in the light emitting devices may likewise be mounted on substrate 318 and included in LED package 320.

Rather than be packaged together and mounted on a single substrate, and no matter whether the LEDs and diodes are integrated into a single package or are discrete individual LEDs and/or diodes wire-bonded together, as disclosed in FIG. 17 rectifier 302 may be discretely packaged separate from any discrete LED packages 324 where discrete LED package 324 includes one LED 306 or multiple LEDs connected in series or parallel. Rectifier 302 may be packaged into rectifier package 326 for plug and use into a light system, or alternatively may be included as part of a driver used to drive the series LEDs. When packaged separate, package 326 may be provided with input power connections 328 and 329 which to connect the inputs of the rectifier to an AC power supply. In order to connect to one (or more) single or series LEDs and provide power thereto, package 326 may also be provided with output power connections 330 and 331 which may connect to LED package inputs 334 and 335. Any capacitors 312, 314 or resistors 313 included in the light emitting devices may likewise be mounted on substrate 316 and included in rectifier package 326.

Regardless of whether rectifier 302 and LEDs 306 are integrated or mounted in a single package or are discretely packaged and connected, in order to drop higher voltages any number of LEDs may be connected in series or parallel in a device to match a desired voltage and light output. For example, in a lighting device that is run off of a 120 V source and contains LEDs having a forward operating voltage of 3V each connected to a bridge rectifier having diodes also having a forward operating voltage of 3V each, approximately 38 LEDs may be placed in series to drop the required voltage.

FIG. 19 discloses an embodiment of an LED lighting device encapsulated in a housing. As shown in FIG. 19, LED device 336 may include a housing 338 encapsulating at least one bridge rectifier 340, at least one LED circuit 342 connected across the output of the bridge rectifier. Device 334 includes first power connection lead connected 344 to a first input of the rectifier 346 and a second power connection lead 348 connected to a second input of the rectifier 350. At least a portion of each power connection is contained within the housing while at least a portion of each power connection extends beyond the housing to allow device 336 to connect to an AC power source. Rectifier 340 and LED circuit 342 may be connected, assembled, and/or packaged within housing 336 using any of the methods described in conjunction with FIGS. 15-18 or any other means known in the art. It should be appreciated by those having ordinary skill in the art that the devices and packages described in FIGS. 2, 3, and 5-14 may likewise incorporate a housing to encapsulate any device and/or package therein.

FIG. 20 discloses a schematic diagram of a lighting system 168 according to an embodiment of the invention. The device 168 includes a plurality of devices 26 as described in FIG. 2 connected to a high frequency inverter AC drive Method 170 as described in FIG. 3 which in this example provides a relatively constant 12V AC source at a relatively constant frequency of 50 Khz to the devices 26. Each or some of the devices 26 may have integrated capacitors 172 of equal or different values enabling the devices 26 to operate at different drive currents 174 from a single source AC drive Method.

Figure 21:
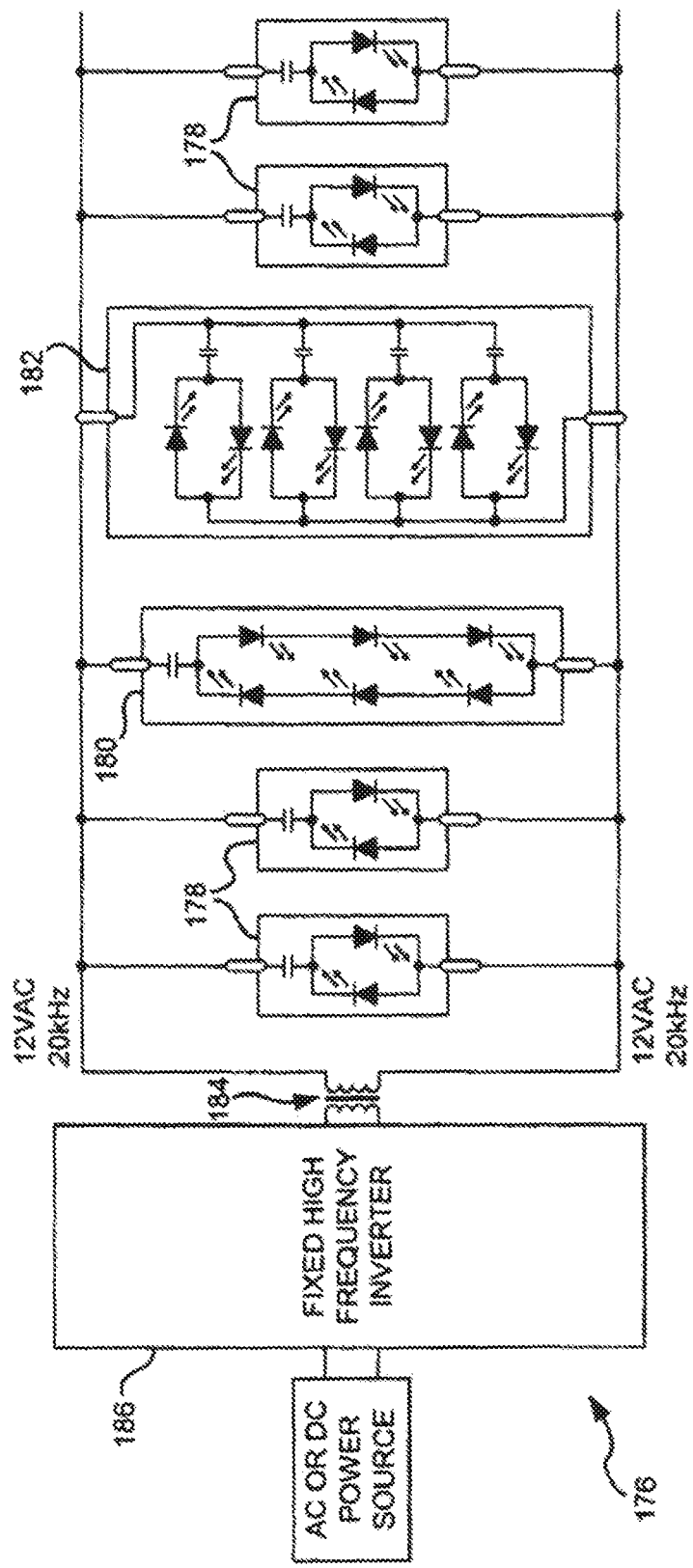
FIG. 21 shows a schematic view in accordance with an example embodiment.

FIG. 21 discloses a schematic diagram of a lighting system 176 according to an embodiment of the invention. The lighting system 176 includes a plurality of devices 178, 180 and 182 each able to have operate at different currents and lumens output while connected directly to the transformer 184 output of a fixed high frequency AC drive Method 186.

Any of the aforementioned AC drive methods may likewise be used with the devices embodied in FIGS. 15-19.

Figure 22:
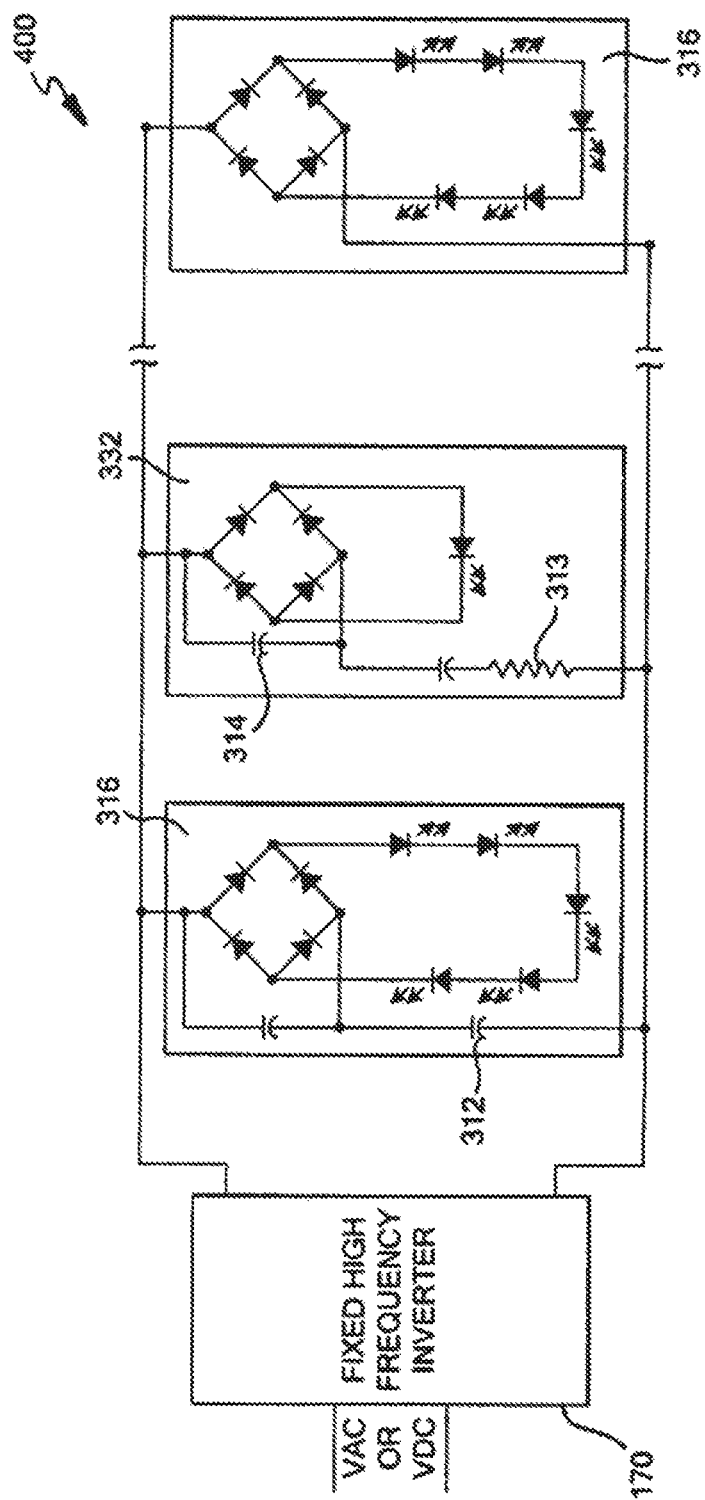
FIG. 22 shows a schematic view in accordance with an example embodiment.

For example, FIG. 22 discloses a schematic diagram of a lighting system 400 according to an embodiment of the invention. System 400 includes a plurality of devices 316, 332 as described in FIGS. 16 and 18 connected to a high frequency inverter AC drive Method 170 similar to that described in FIGS. 3 and 20 which provides a relatively constant 12V AC source at a relatively constant frequency of 50 Khz to the devices 316, 332. Each or some of the devices 316, 332 may have integrated capacitors 312, 314 and resistors 313 of equal or different values enabling the devices 300 to operate at different drive currents from a single source AC drive Method. As should be appreciated by those having ordinary skill in the art, while the example of 12V AC at 50 Khz is given herein, it is contemplated by the invention that any voltage at substantially any frequency may be provided by the driver by utilizing a proper transformer and/or inverter circuit.

Figure 23:
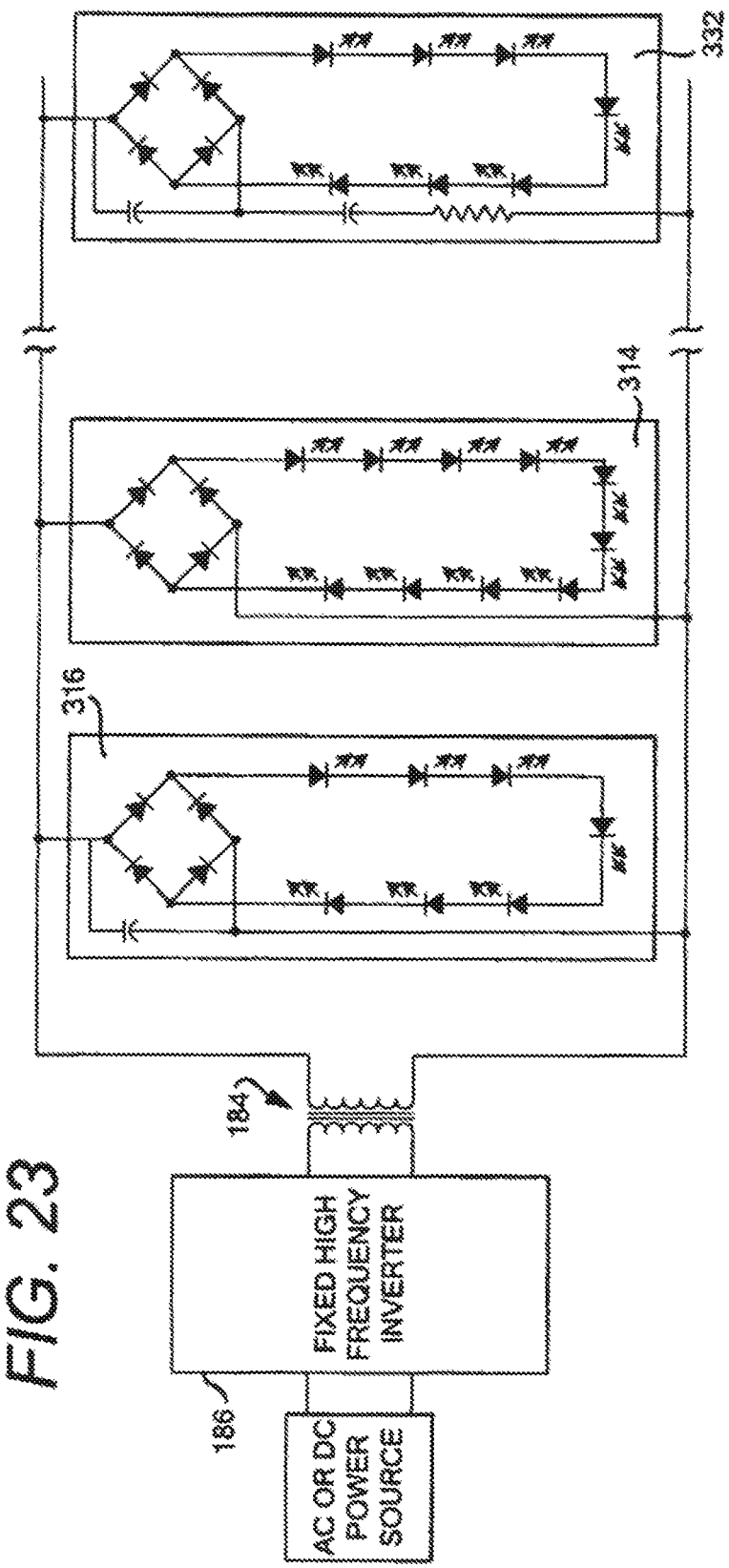
FIG. 23 shows a schematic view in accordance with an example embodiment.

Similarly, AC drive Method 186 may be utilized may be used with a single or plurality of devices 214 as disclosed in FIG. 23. As with the embodiment shown in FIG. 21, each device 316, 332 may be connected directly to transformer 184 output to receive a substantially fixed frequency voltage.

Figure 24:
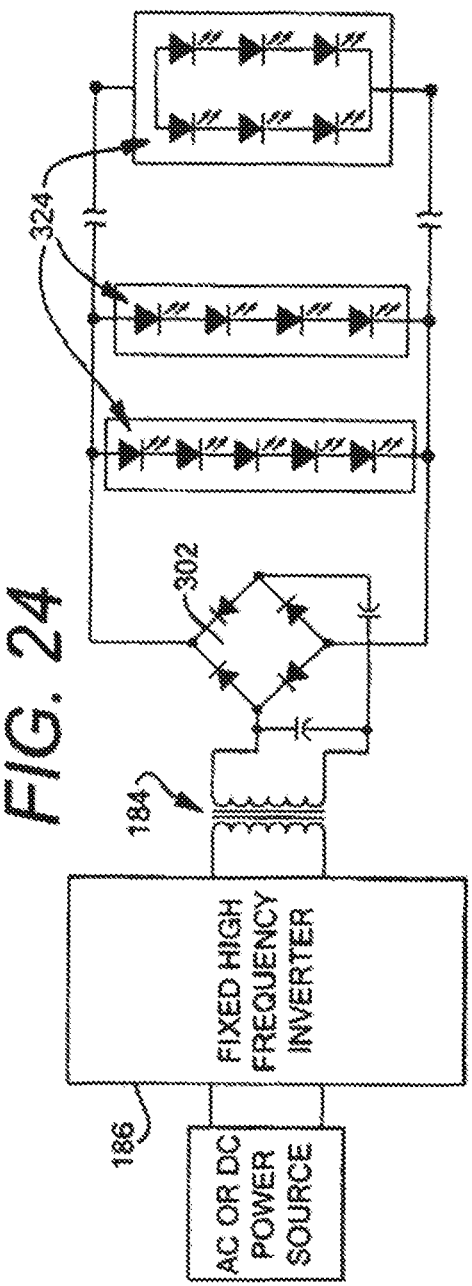
FIG. 24 shows a schematic view in accordance with an example embodiment.

FIG. 24 discloses an embodiment of the invention where AC drive Method 186 is provided to a rectifier and LED series strings are discretely packaged. As previously disclosed, rectifier 302 may be discretely packaged in a rectifier package 326, separate from both AC drive Method 186 (or alternatively AC drive Method 170) and discrete LED packages 324, or alternatively may be included in AC drive Method 186.

Figure 25:
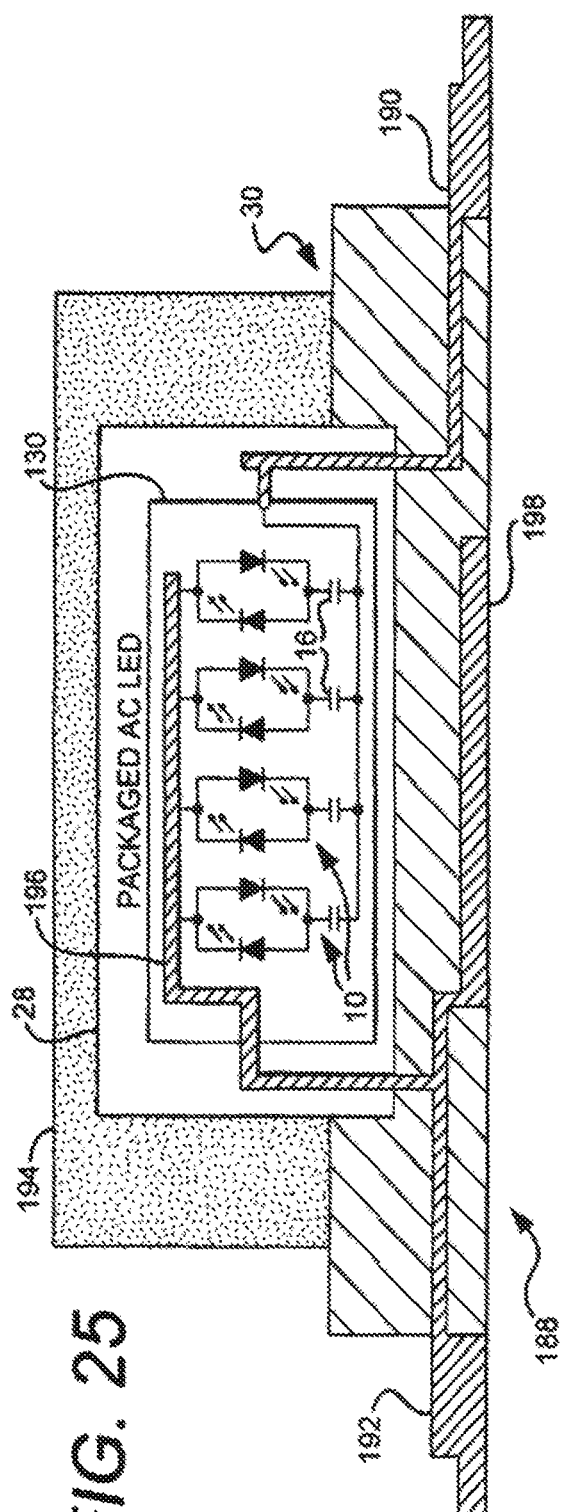
FIG. 25 shows a schematic view in accordance with an example embodiment.

FIG. 25 discloses another schematic view diagram of a light emitting device 188 identical to the device 130 disclosed in FIG. 11 and integrated into a package 30 as described in FIG. 2 for an AC drive Method according to an embodiment of the invention. The device 188 includes the device 130 as disclosed in FIG. 11 mounted on an insulating substrate 28 such as but not necessarily ceramic or sapphire and integrated into an LED package 30 that may be various LED package sizes; materials and designs based of product specifications or on printed circuit board material. The device 188 provides power connection leads 190 and 192 and may have a first or additional lens 194 that may be made of a plastic, polymer or other material used for light dispersion and the lens may be coated or doped with a phosphor or nano-crystals that would produce a change in the color or quality of light emitted from the device 130 through the lens 194. The device 130 has a matrix of devices 10. The power connection opposite the capacitors 16 within the device 130 and part of each device 10 is connected to a power connection 196 that is connected to a solderable heat sinking material 198 and integrated into the package 30. The power connection 196 connected to the heat sink 198 may be of a heavier gauge within the device 130 or 188 than other conductors. The schematic view of the device 188 provides a side view of the package 30 and an overhead view of the device 130 in this FIG. 25.

Figure 26:
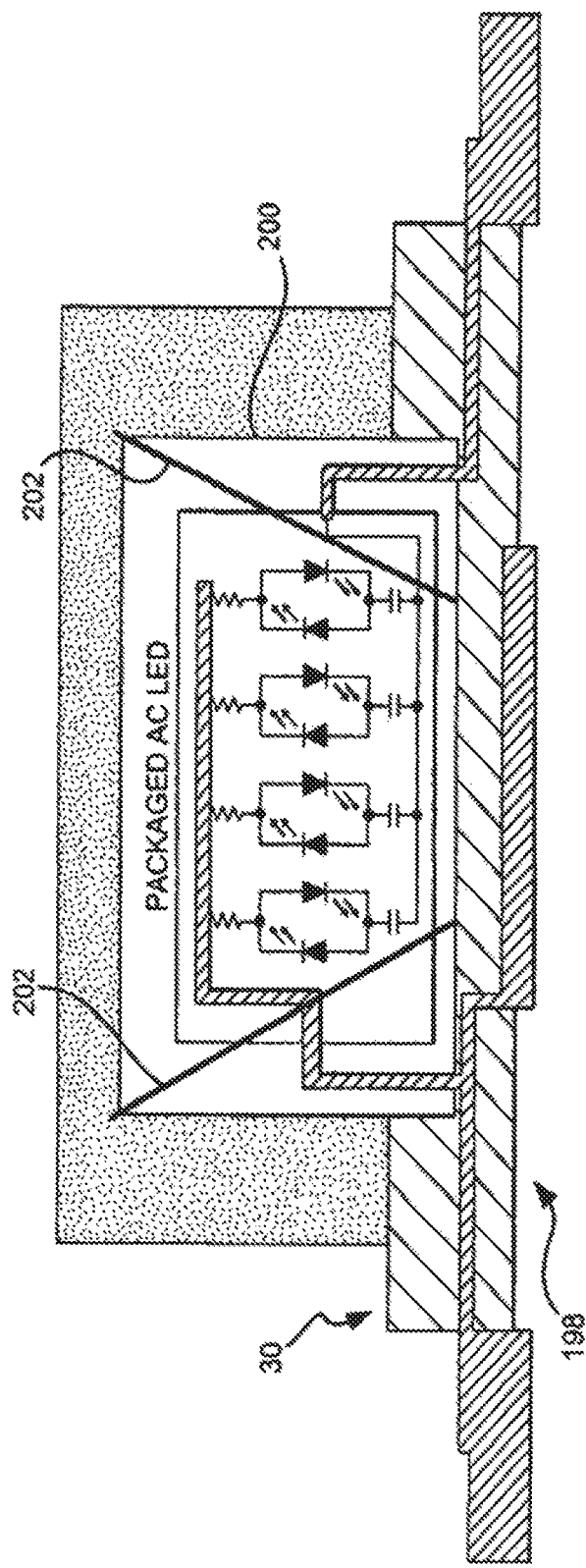
FIG. 26 shows a schematic view in accordance with an example embodiment.

FIG. 26 discloses another schematic view diagram of a light emitting device 198 similar to the device 188 described in FIG. 25 with a different light emitting device 200 identical to the device 136 disclosed in FIG. 12 and integrated into a package 30 as described in FIG. 2 for an AC drive Method according to an embodiment of the invention. The device 198 includes a reflective device integrated into the package 30 for optimized light dispersion. The light emitting device 200 may be facing down towards the reflector 202 and opposite direction of light output from the lens 194 if the reflector 202 is integrated into the package 30 properly for such a design.

Figure 27:
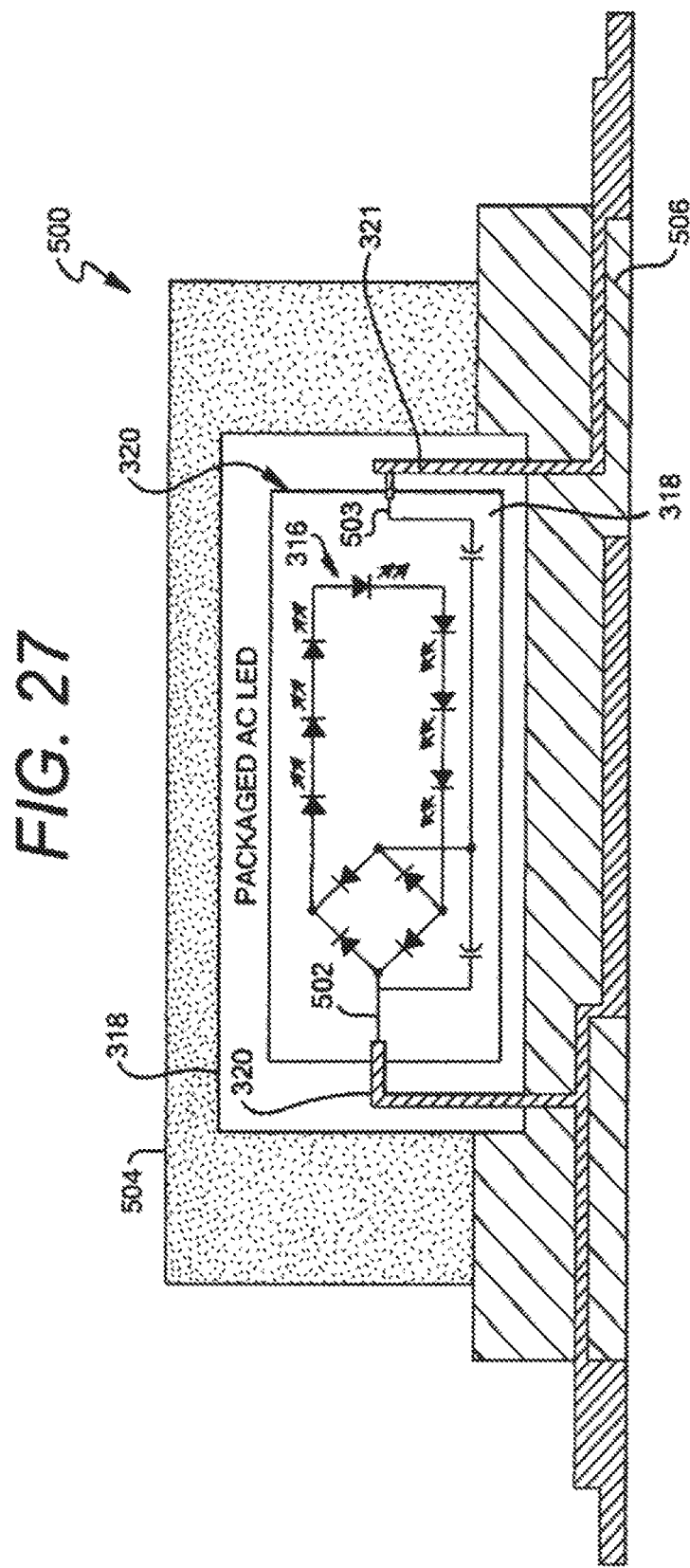
FIG. 27 shows a schematic view in accordance with an example embodiment.

FIG. 27 discloses another schematic view diagram of a light emitting device 500 similar to that shown in FIG. 24 according to an embodiment of the invention. The device 500 includes the devices 316, 332 similar to those disclosed in FIGS. 16 and 18, mounted on an insulating substrate 318 such as but not necessarily ceramic or sapphire and integrated into an LED package 320 that may be various LED package sizes; materials and designs based of product specifications or on printed circuit board material. The device 500 provides power connection leads 502 and 503 which connect to package power connect leads 322 and 323 and may have a first or additional lens 504 that may be made of a plastic, polymer or other material used for light dispersion and the lens may be coated or doped with a phosphor or nano-crystals that would produce a change in the color or quality of light emitted from the device through the lens 504. Power connection 322 may be connected to heat sink 506 and may be of a heavier gauge within the device than other conductors.

Figure 28:
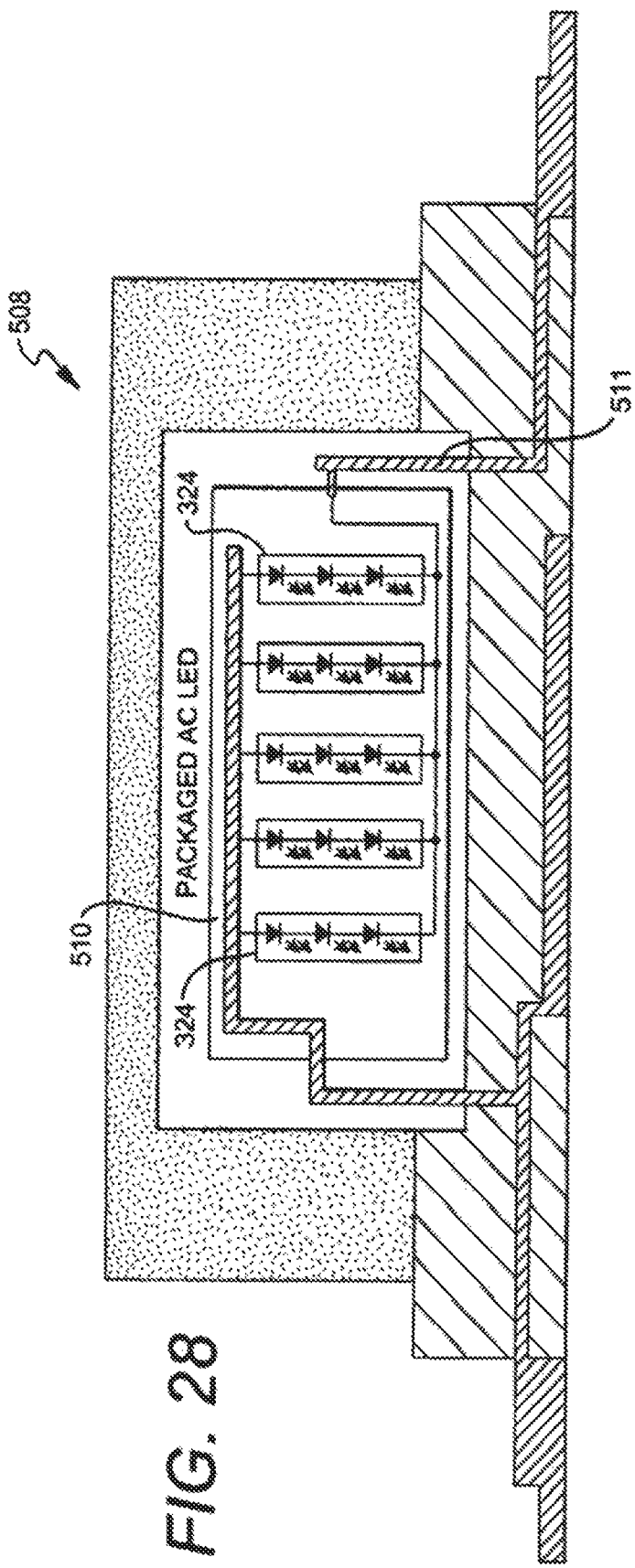
FIG. 28 shows a schematic view in accordance with an example embodiment.

FIG. 28 discloses another schematic view diagram of a light emitting device 508 similar to that shown in FIG. 26.

Device 508 is contemplated for use in embodiments where the rectifier is discretely packaged or included as part of AC drive Method 170 or 186. In device 508, power connection leads 510 and 511 connect to the outputs of rectifier 302 (not shown) to provide power to LED packages 324.

Figure 29:
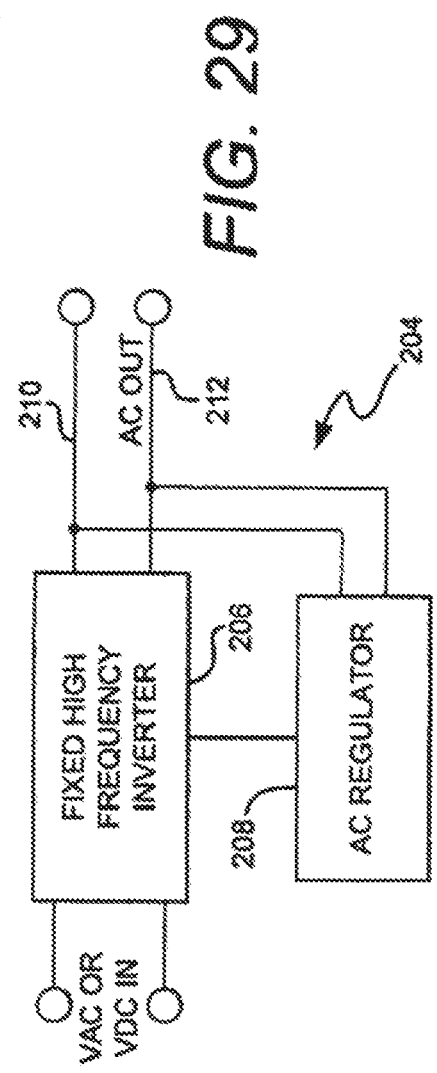
FIG. 29 shows a schematic view in accordance with an example embodiment.
Figure 30A:
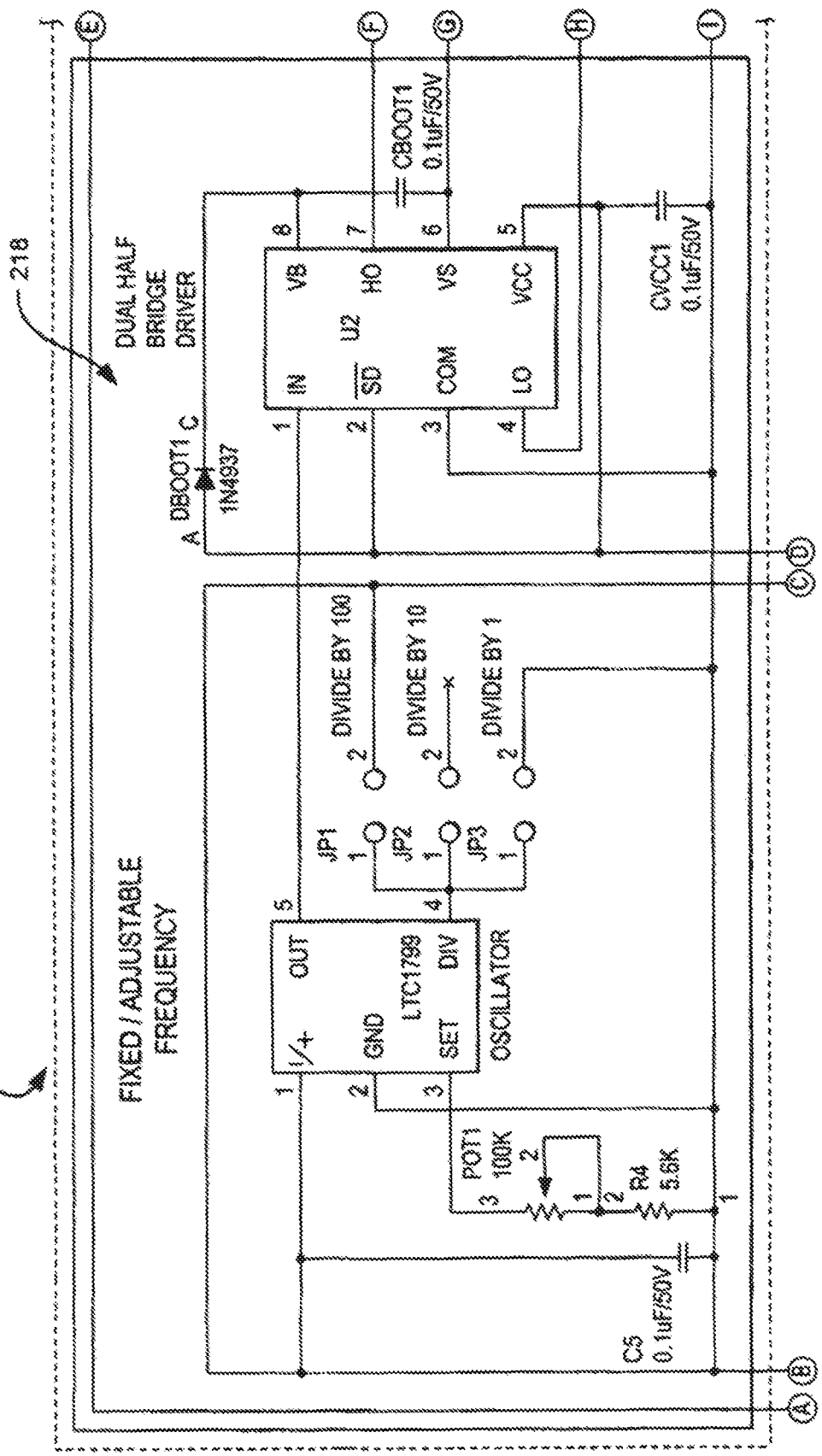
FIG. 30A shows a schematic view in accordance with an example embodiment.
Figure 30B:
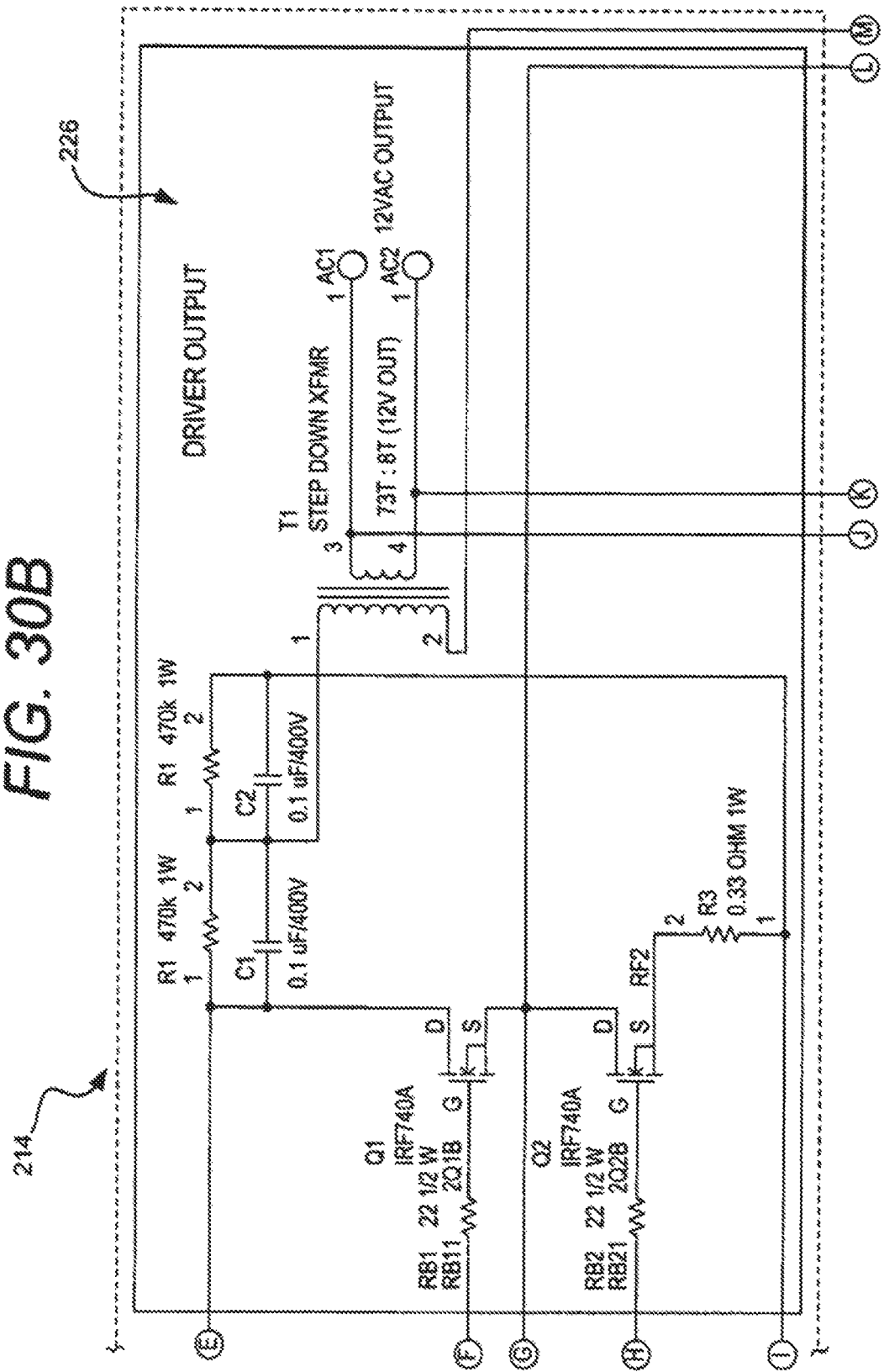
FIG. 30B shows a schematic view in accordance with an example embodiment.
Figure 30C:
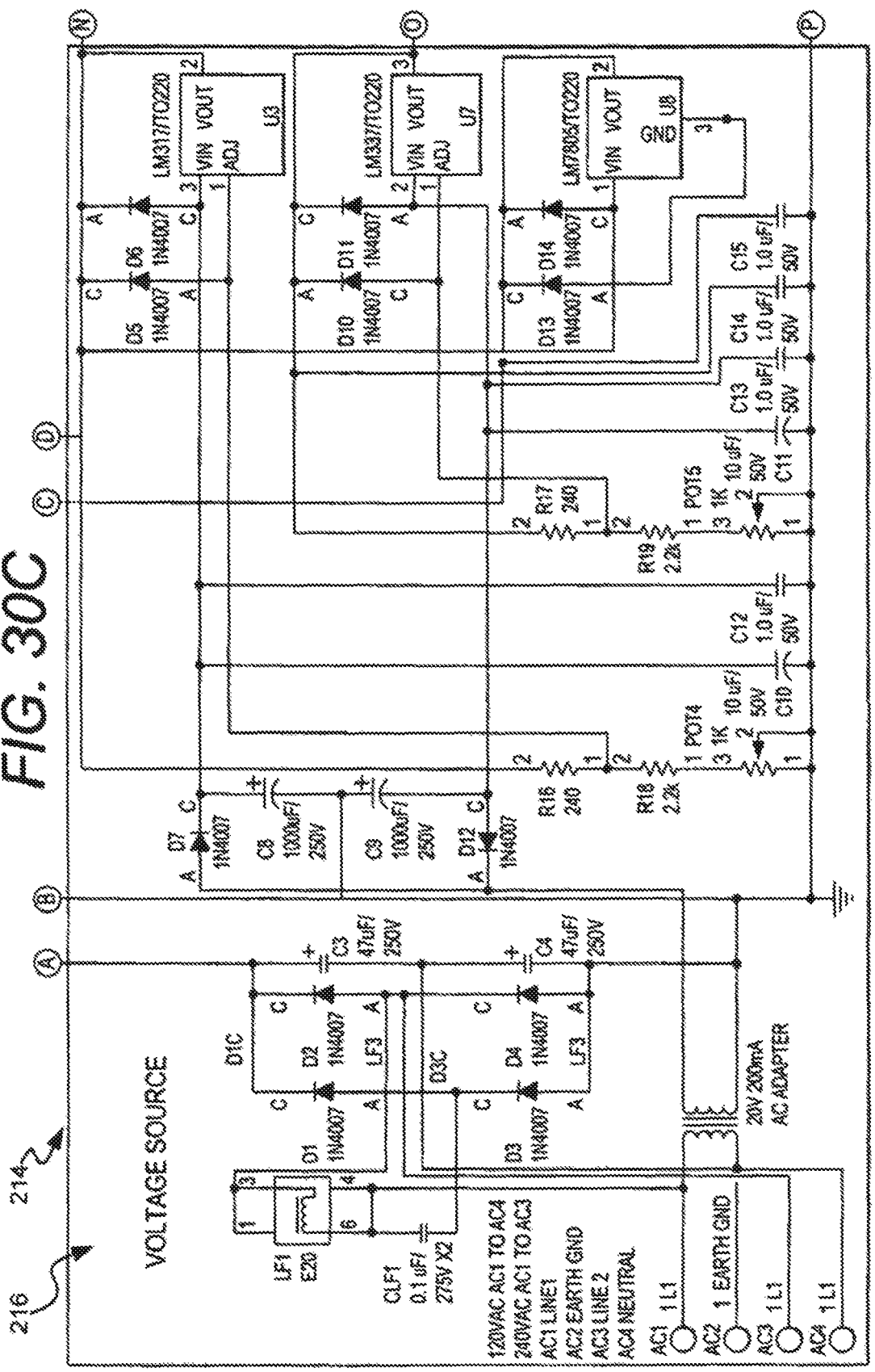
FIG. 30C shows a schematic view in accordance with an example embodiment.
Figure 30D:
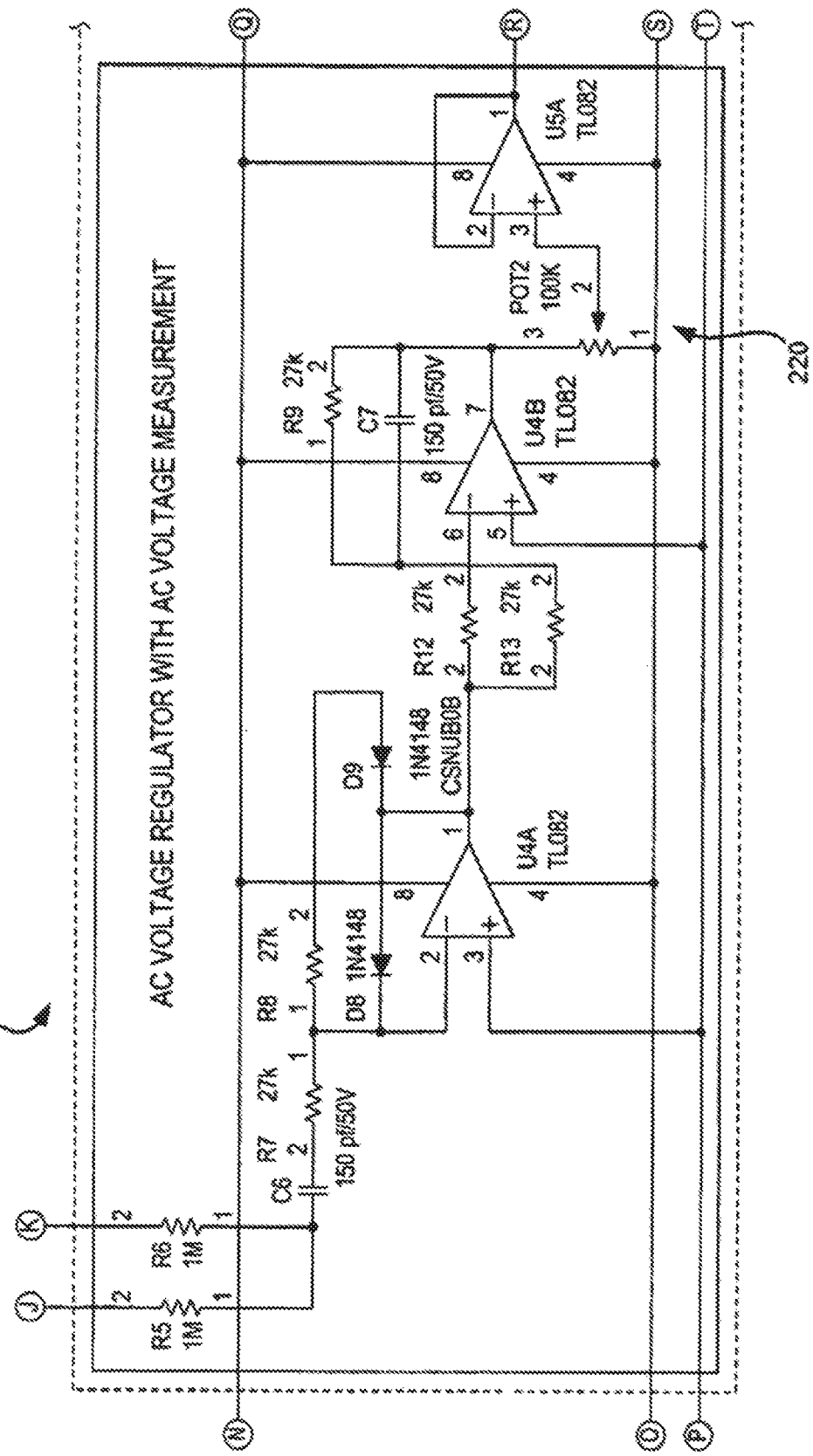
FIG. 30D shows a schematic view in accordance with an example embodiment.
Figure 30E:
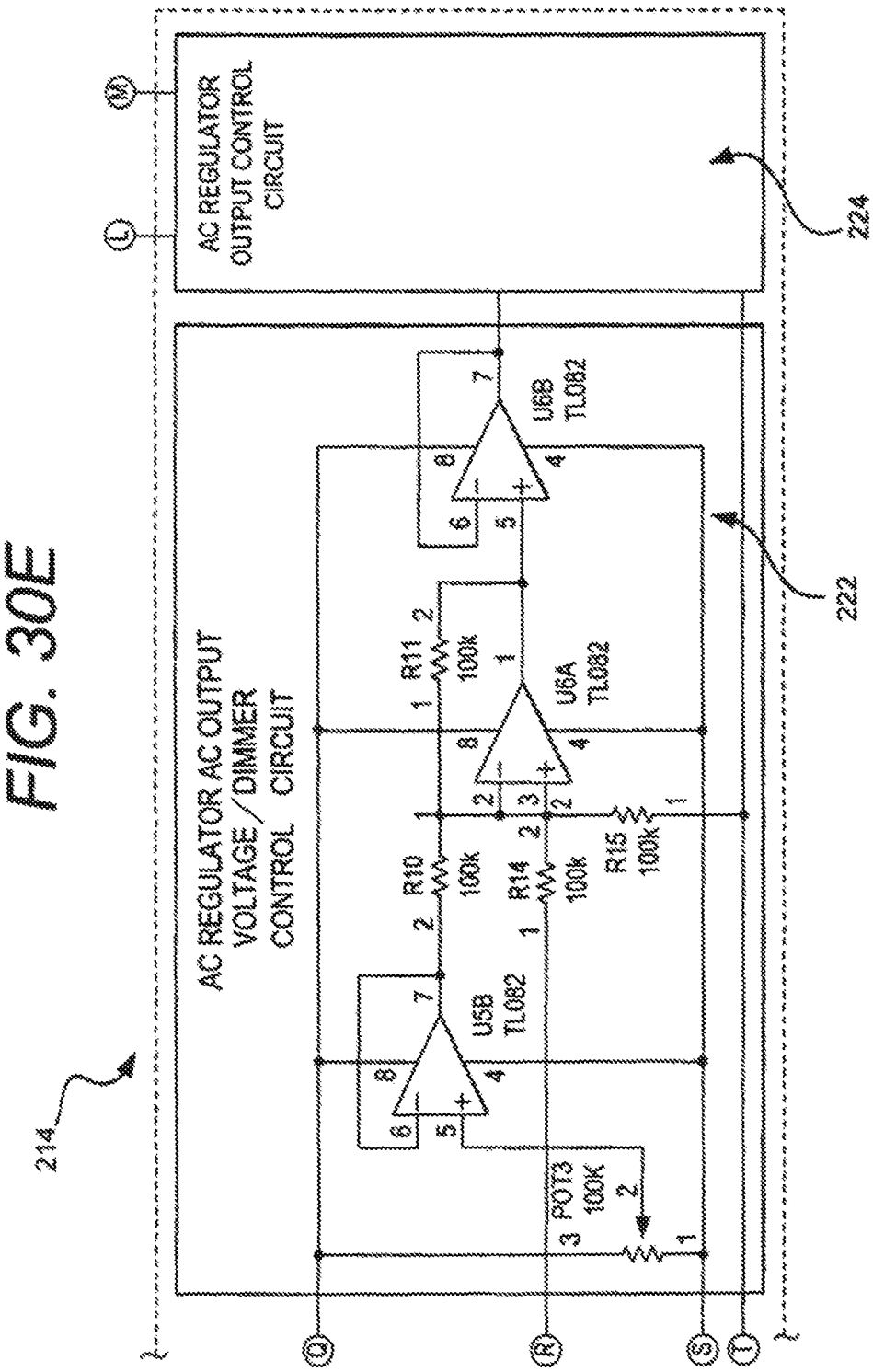
FIG. 30E shows a schematic view in accordance with an example embodiment.

FIG. 29 shows a block diagram of an LED circuit driver 204 having a high frequency inverter 206 stage that provides a relatively constant voltage and relatively constant frequency output. The high frequency inverter 206 stage has an internal dual half bridge driver with an internal or external voltage controlled oscillator that can be set to a voltage that fixes the frequency. A resistor or center tapped series resistor diode network within the high frequency inverter 206 stage feeds back a voltage signal to the set terminal input of the oscillator. An AC regulator 208 senses changes to the load at the output lines 210 and 212 of the inverter 206 and feeds back a voltage signal to the inverter 208 in response changes in the load which makes adjustments accordingly to maintain a relatively constant voltage output with the relatively constant frequency output.

FIGS. 30A, 30B, 30C, 30D, and 30E show a schematic diagram of an LED circuit driver 214 having a voltage source stage 216, a fixed/adjustable frequency stage 218, an AC voltage regulator and measurement stage 220, an AC level response control stage 222, an AC regulator output control stage 224 and a driver output stage 226.

Figure 31:
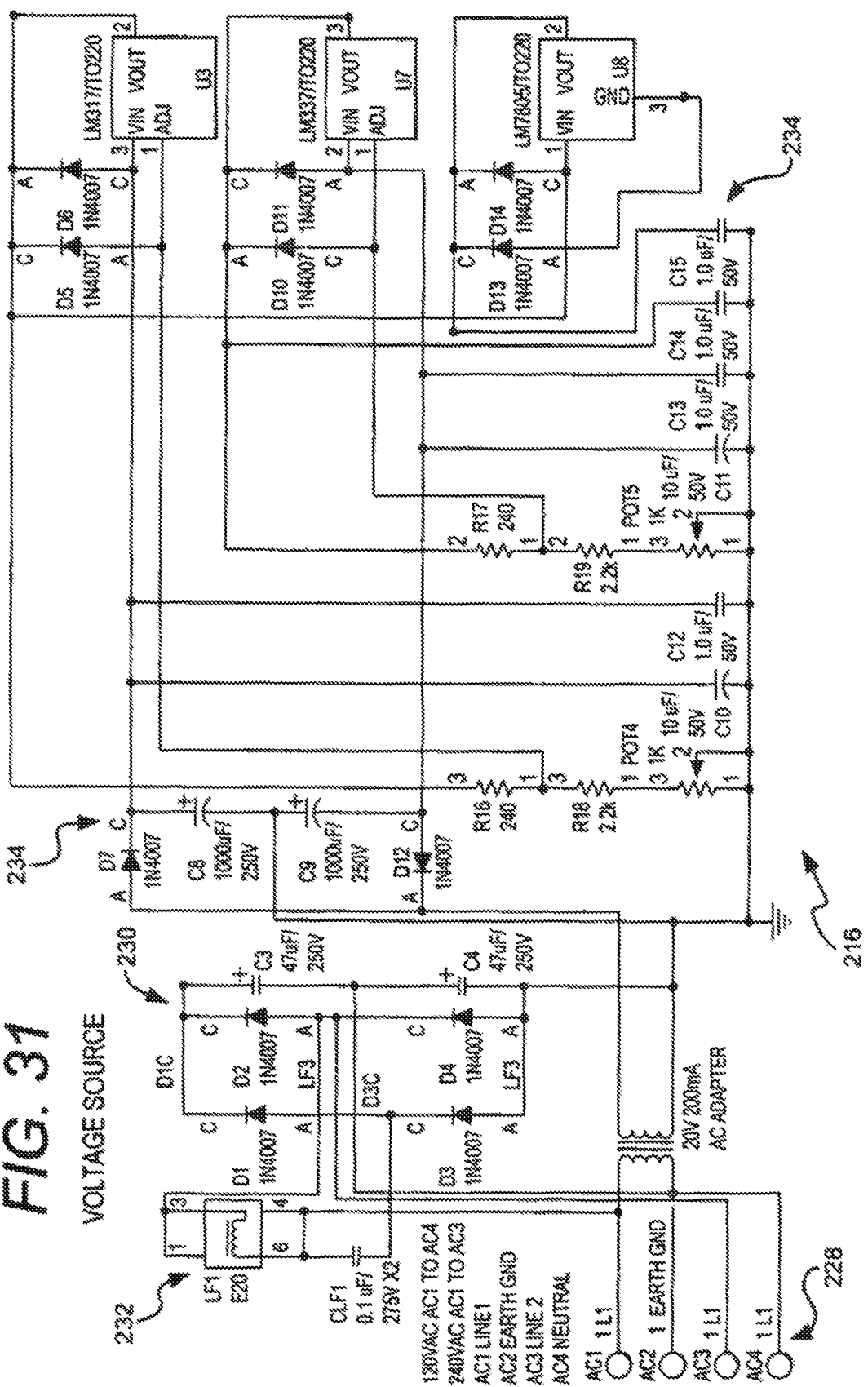
FIG. 31 shows a schematic view in accordance with an example embodiment.

FIG. 31 shows a schematic diagram of the voltage source stage 216 described in FIG. 20. The voltage source stage 216 provides universal AC mains inputs 228 that drive a diode bridge 230 used to deliver DC to the LED circuit driver system 214. Direct DC could eliminate the need for the universal AC input 228. Power factor correction means 232 may be integrated into the LED circuit driver 216 as part of the circuit. The voltage source stage 216 includes a low voltage source circuit 234 that may include more than one voltage and polarity.

Figure 32:
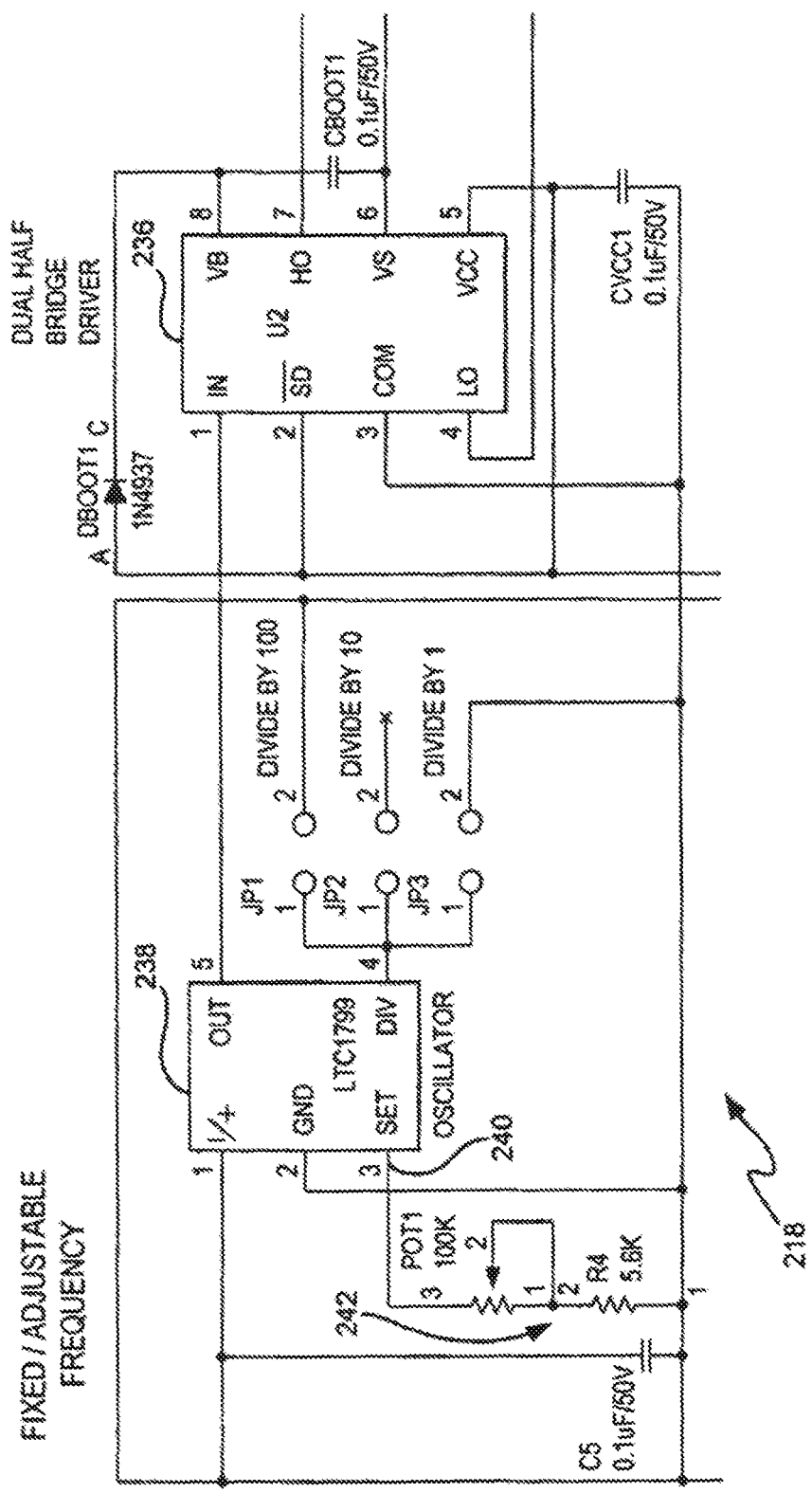
FIG. 32 shows a schematic view in accordance with an example embodiment.

FIG. 32 shows a schematic diagram of the fixed/adjustable frequency stage 218 as described in FIG. 20. The fixed/adjustable frequency stage 218 includes a bridge driver 236 that may include an integrated or external voltage controlled oscillator 238. The oscillator 238 has a set input pin 240 that sets the frequency of the oscillator to a fixed frequency through the use of a resistor or adjustable resistor 242 to ground. The adjustable resistor 242 allows for adjusting the fixed frequency to a different desired value through manual or digital control but keeps the frequency relatively constant based on the voltage at the set terminal 240.

Figure 33:
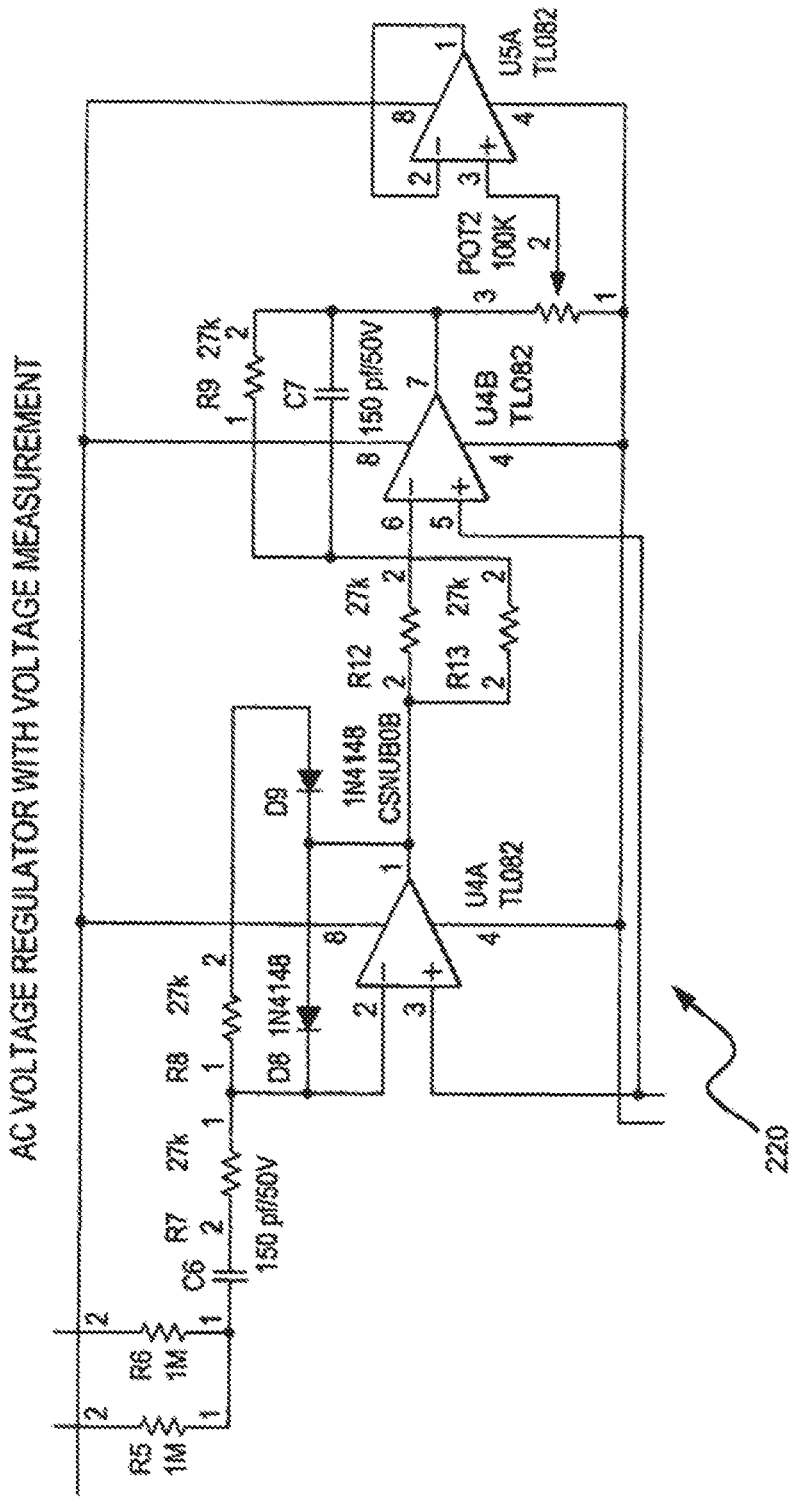
FIG. 33 shows a schematic view in accordance with an example embodiment.

FIG. 33 is a schematic diagram of the AC voltage regulator with voltage measurement stage 220 as described in FIG. 20. The AC voltage regulator with voltage measurement circuit 220 monitors the voltage at the driver output 226 as shown in FIG. 20 and sends a voltage level signal to the AC level response control stage 222 as shown in FIG. 20.

Figure 34:
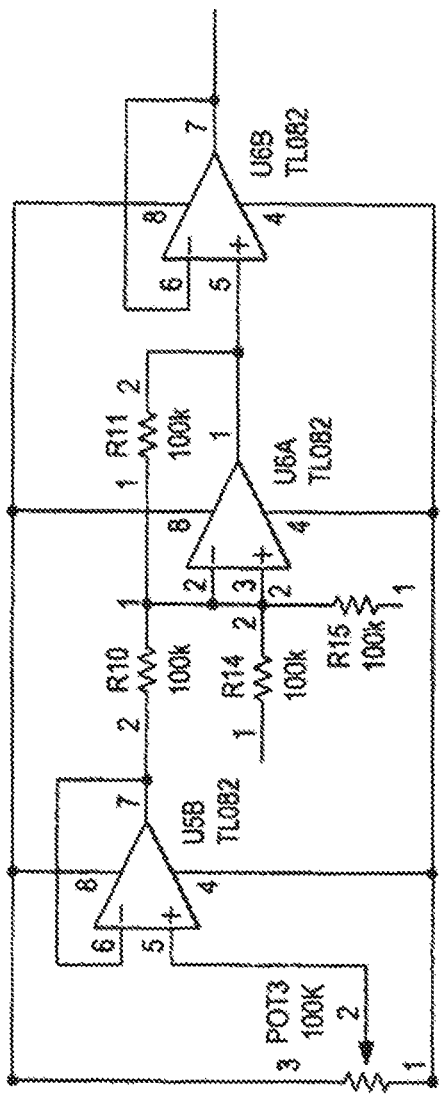
FIG. 34 shows a schematic view in accordance with an example embodiment.

FIG. 34 is a schematic diagram of the AC level response control 228 stage. The AC level response control stage 228 receives a voltage level signal from the AC voltage regulator with voltage measurement circuit 220 as shown in FIG. 23 and drives the AC regulator output control stage 224 as shown in FIG. 20.

Figure 35:
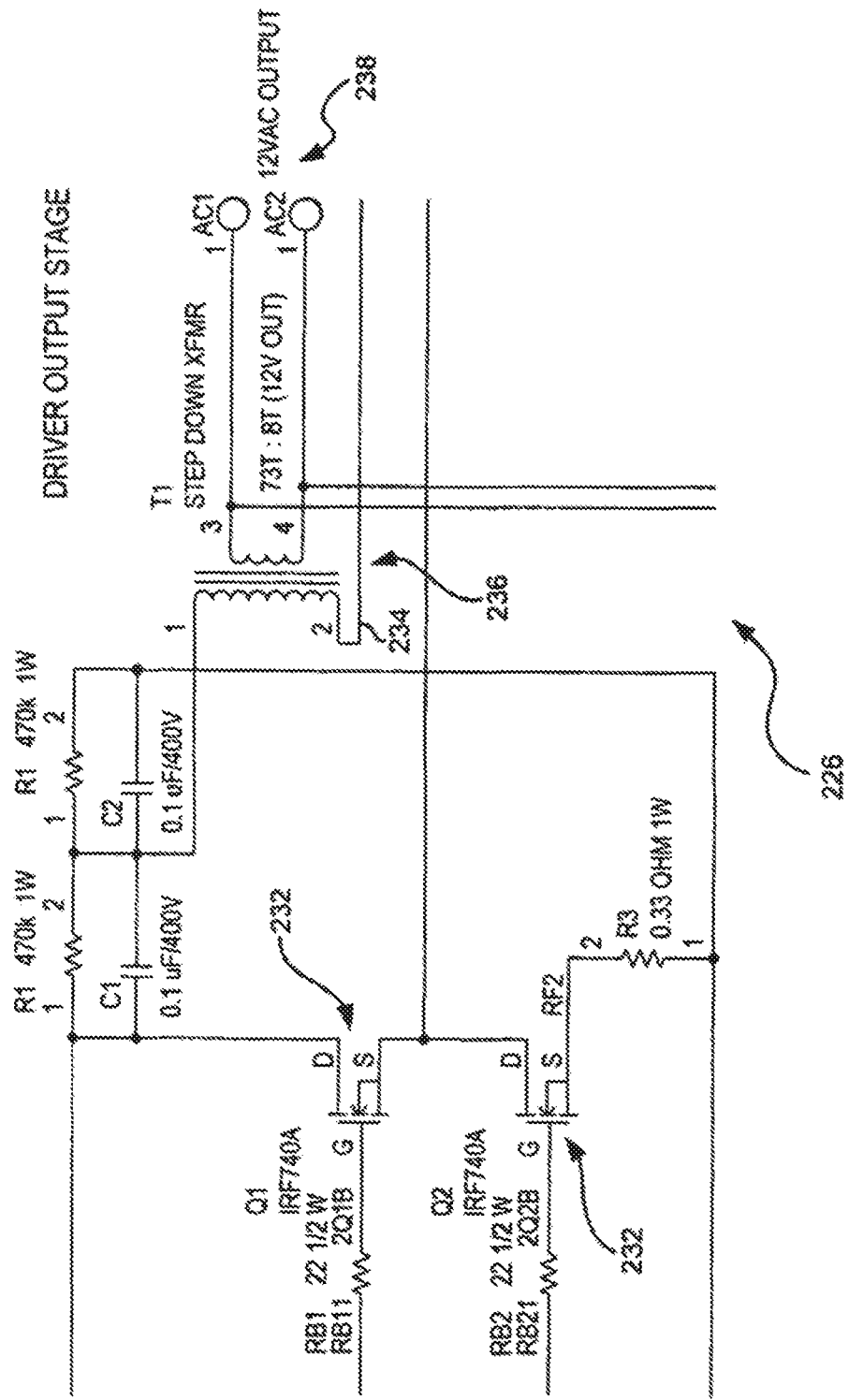
FIG. 35 shows a schematic view of in accordance with an example embodiment.

FIG. 35 is a schematic diagram of the AC regulator output control stage 230. The AC regulator output control stage 230 varies the resistance between the junction of the drive transistors 232 and the transformer input pin 234 of the driver output 226 as shown in FIG. 26. The AC regulator output control stage 230 is a circuit or component such as but not necessarily a transistor, a voltage dependent resistor or a current dependent resistor circuit having a means of varying its resistance in response to the voltage or current delivered to it.

Figure 36:
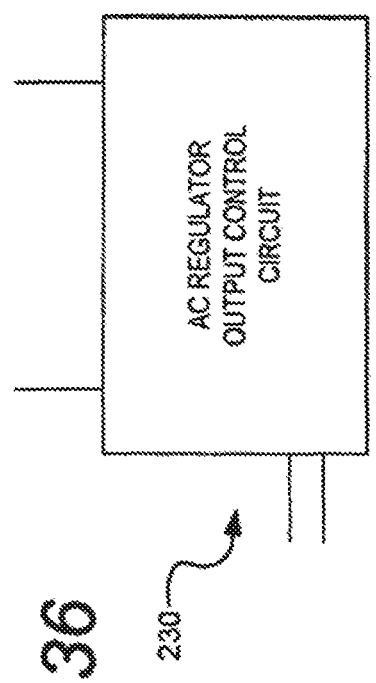
FIG. 36 shows a schematic view in accordance with an example embodiment.

FIG. 36 is a schematic diagram of the driver output stage 226. The driver output stage 226 includes drive transistors 232 and the transformer 236 that delivers an AC voltage output 238 to LED circuits at a relatively constant voltage and frequency.

Figure 37:
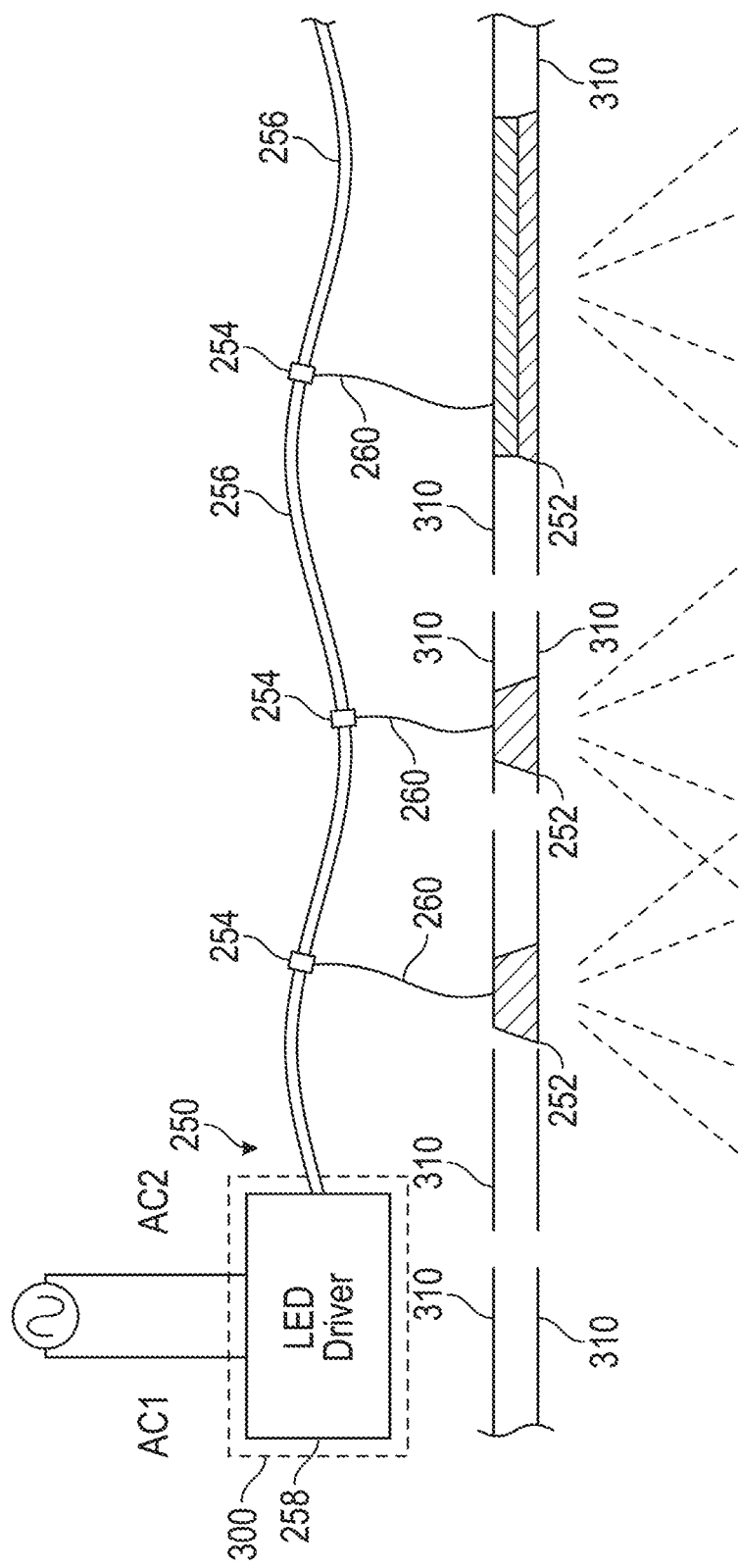
FIG. 37 shows a schematic view of an LED downlighting system in accordance with an example embodiment.

FIG. 37 is an illustration of a schematic diagram of an LED downlighting system 250 in accordance with an example embodiment. The LED downlighting system includes at least one LED downlight 252, at least one insulation displacement (IDC) connector 254, a wire system 256, a driver 258, and at least one connecting wire 260. In other example embodiments, the LED lighting system 250 may also include a bridge rectifier.

The LED downlight(s) 252 may also be referred to as a lighting fixture(s). Each LED downlight(s) 252 may be mounted to or mounted into a ceiling 310. For example, an LED downlight 252 may be at least partially integrated within a ceiling tile of ceiling 310.

The driver 258 may also be referred to as an LED driver. The LED driver may be a low voltage LED driver. In some example embodiments, the LED driver is configured to receive one of a plurality of voltage inputs. The driver 258 may be mounted to a wall, ceiling, or integrated into an electrical junction box 300. The driver 258 has an input and an output. In this illustrative example, the input is an AC voltage and the output is an AC voltage or DC voltage that is lower than the first voltage. The output of the driver 258 may provide an output voltage and an output current to the LED downlight(s) 252, the output voltage and output current being relatively constant when connected to the LED downlight(s) 252.

The wire system 256 may include at least one output wire. In some examples, the wire system 256 includes at least one pair of output wires connected to the output of the driver 258. Thus, the output voltage provided by the driver 258 is provided through the one or more output wires of the wire system 256.

As depicted, each LED downlight 252 is electrically connected to the driver 258 by a corresponding insulating displacement connector 254. In these example embodiments, the electrical connection is an indirect connection. Specifically, the corresponding insulating displacement connector 254 electrically connects the LED downlight 2582 to the wire system 256 to thereby electrically connect the LED downlight 252 to the driver 258. This electrical connection connects the LED downlight 252 to the output of the driver 258 such that the output voltage from the driver 258 is supplied to the LED downlight 252 through the wire system 256.

Each LED downlight 252 may be connected to the corresponding insulating displacement connector 254 directly or through at least one wired connection. This wired connection may be formed using one or more connecting wires 260. For example, the corresponding insulating displacement connector 254 may be connected to the LED downlight 252 via a connecting wire 260.

Each LED downlight 252 is integrated into ceiling 310 such that light faces (or projects) downward relative to ceiling 310. In some examples, an LED downlight 252 is configured to deliver one or more colors of light. In some embodiments, the LED downlighting system 250 that includes a first LED downlight for providing at least one of a different color, a different wavelength, or a different amount of light than at least one other LED downlight in the LED downlighting system 250. The driver or at least one LED downlight of the LED downlights 252 in the LED lighting system 250 may be able to produce light with at least one of a different color, a different wavelength, or a different amount of light in response to a change in voltage, in response to a dimmer, or in response to a controller.

In some example embodiments, the LED lighting system 250 is dimmable. In some cases, one or more of the LED downlights 252 in the LED lighting system 250 are configured to deliver light output during a power failure. For example, the LED downlight 252 may be powered using a battery during a power failure. The battery may be used for a battery backup system in one of a residential, commercial, or industrial building.

Each LED downlight 252 may include one or more LED circuits. An LED circuit in an LED downlight 252 may be capable of sensing and correcting reverse polarity being input to the LED downlight 252. Further, the LED circuit may be capable of emitting light during both a positive phase and a negative phase of a mains AC power source. The mains AC power source may be providing the input voltage to the driver 258.

Figure 38:
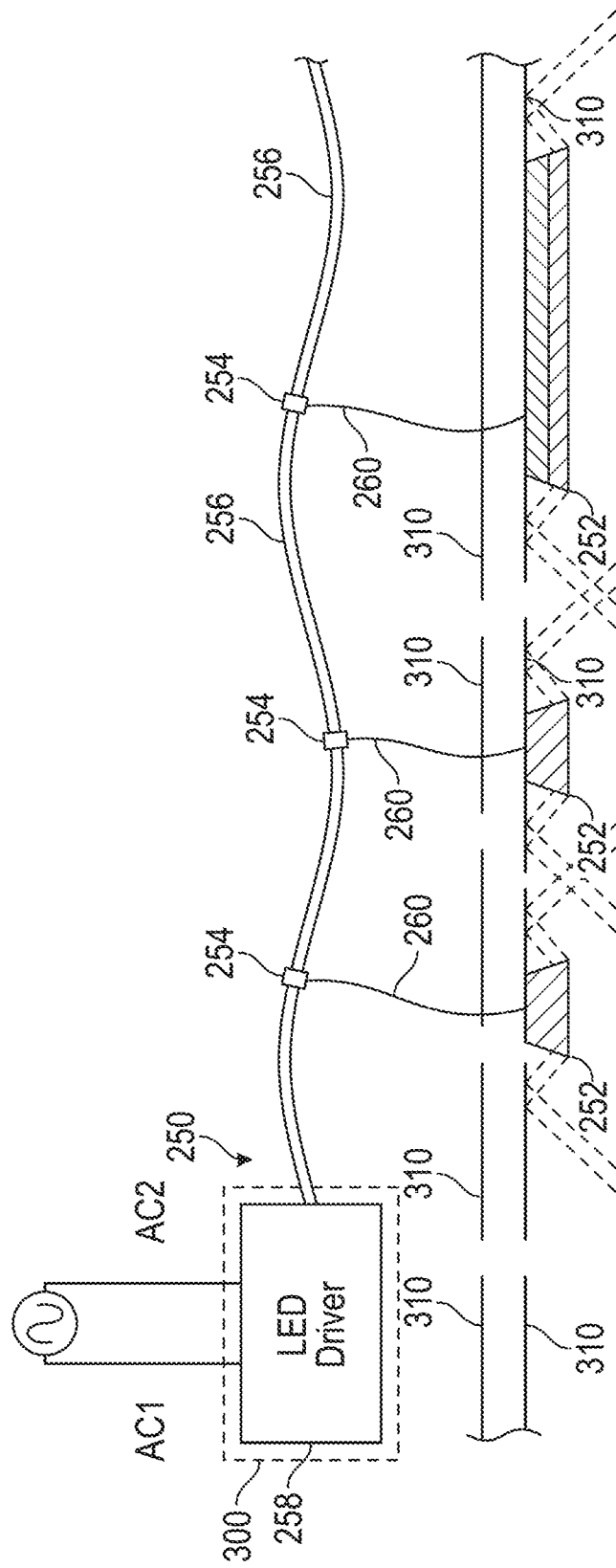
FIG. 38 shows a schematic view of an LED downlighting system in accordance with an example embodiment.

FIG. 38 is a schematic diagram of another configuration for LED lighting system 250 in accordance with an example embodiment. In this illustrative example, the LED downlight(s) 252 are mounted to the bottom of the ceiling 310. They are positioned such that light from the LED downlight(s) 252 faces (or projects) upward relative to the ceiling 310 and is reflected off of the ceiling 310.

FIG. 39 is a schematic diagram of an enlarged portion of the LED downlight 252 from FIG. 37 in accordance with an example embodiment. The LED downlight 252 has an LED light source 312 integrated within the LED downlight 252. In one or more example embodiments, the LED light source 312 may take the form of an LED circuit. In some example embodiments, the LED light source 312 may include a plurality of LED circuits. The insulation displacement connector 254 is electrically connected to the wire system 256 extending from the driver 258 from FIG. 37 (not shown here).

FIG. 40 is a schematic diagram of an enlarged portion of the insulation displacement connector 254 from FIG. 39 in accordance with an example embodiment. In one example embodiment, the insulation displacement connector 254 includes a cavity 314, conductive pins 316, and a hinge 318. The insulation displacement connector 254 is shown in an open configuration in FIG. 40.

The cavity 314 helps position and hold (or retain) a portion of the wire system 256. For example, the cavity 314 may help position and hold a pair of output wires of the wire system 256. In other example embodiments, some other type of wire positioning area or element may be used to position and hold these output wires. The conductive pins 316 are used to pierce through the insulation jacket of the output wires of the wire system 256 and to make an electrical connection once the insulation displacement connector 254 has been closed and placed in a closed configuration.

The hinge 318 allows insulation displacement connector 254 to be opened and closed at least once in order to position the output wires of the wire system 256 within the cavity 314 of the insulation displacement connector 254. The closing of the insulation displacement connector 254 via the hinge 318 (e.g., mechanically closed or squeezed by hand or by a tool) allows the conductive pins 316 to pierce through the output wires and make an electrical connection. In this manner, the insulation displacement connector 254, which may be connected to the LED downlight 252 from FIG. 39, be connected to and disconnected from the wire system 256, and thereby the driver 258.

Thus, the LED downlighting system 250 from FIG. 37 or FIG. 38 may be changed from a first configuration to a second configuration by at least one of adding one or more additional LED downlights to the LED lighting system 250 using one or more corresponding insulation displacement connectors or removing one or more existing LED downlights from the LED lighting system 250 using one or more corresponding insulation displacement connectors. The second configuration for the LED lighting system 250 does not significantly affect a predetermined desired output range of light from any LED downlight in the LED lighting system 250 or from any LED circuit of any LED downlight in the LED lighting system 250 that remains from or is preexisting from the first configuration.

Figure 41:
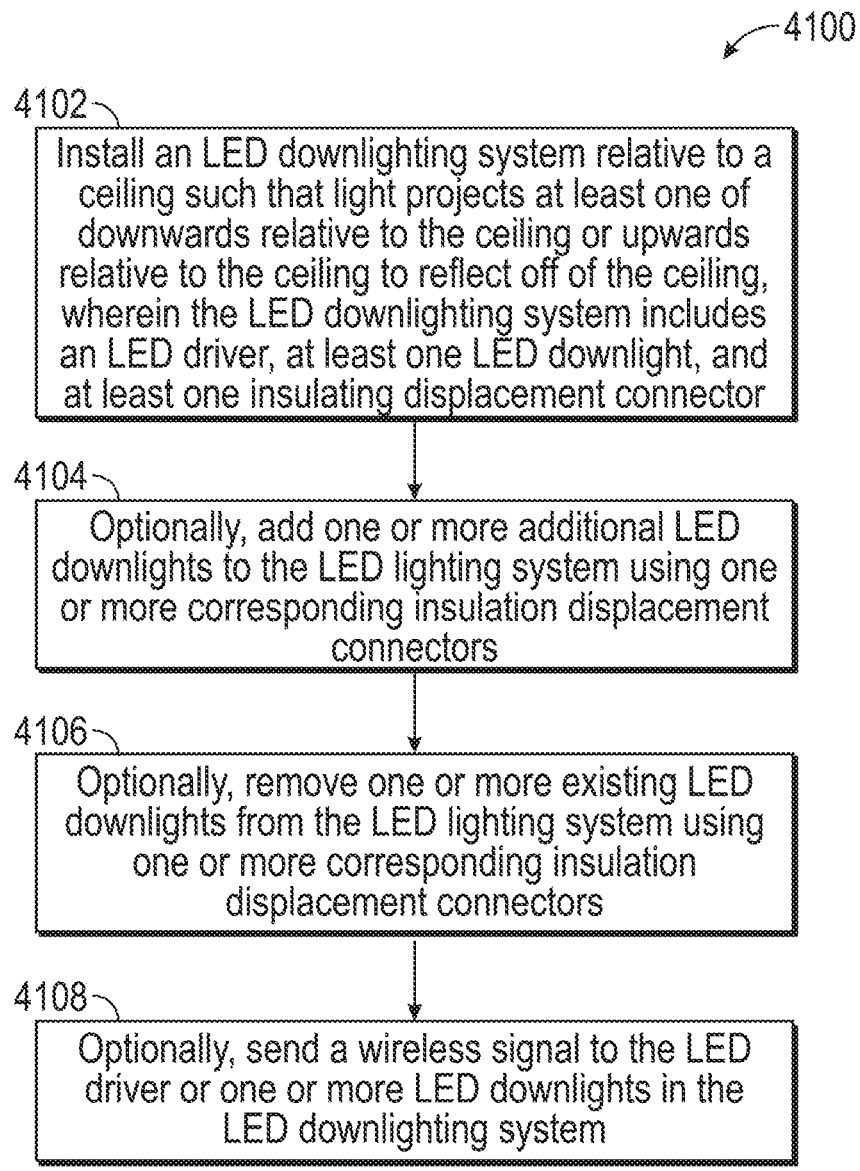
FIG. 41 is a flowchart of a method for installing an LED downlighting system in accordance with an example embodiment.

FIG. 41 is a flowchart of a method 4100 for installing an LED downlighting system in accordance with an example embodiment. The method 4100 may be used to install, for example, the LED lighting system 250 described in FIG. 37 or in FIG. 38.

The method 4100 may begin by installing an LED downlighting system relative to a ceiling such that light projects at least one of downwards relative to the ceiling or upwards relative to the ceiling to reflect off of the ceiling, wherein the LED downlighting system includes an LED driver, at least one LED downlight, and at least one insulating displacement connector (step 4102). Step 4102 may include mounting one or more LED downlights to a ceiling or integrating the one or more LED downlights at least partially into the ceiling.

Optionally, optionally, one or more additional LED downlights may be added to the LED lighting system using one or more corresponding insulation displacement connectors (step 4104). Optionally, one or more existing LED downlights may be removed from the LED lighting system using one or more corresponding insulation displacement connectors (step 4106). In some example embodiments, both steps 4104 and step 4106 may be performed. In other example embodiments, one of step 4104 and step 4106 may be performed. Each of or both of steps 4104 and 4106 may be considered changing the LED downlighting system from a first configuration to a second configuration. Changing the LED downlighting system to the second configuration by adding one or more LED downlights in step 4104, removing one or more LED downlights in step 4106, or both does not significantly affect a predetermined desired output range of light from any LED downlight in the LED lighting system or from any LED circuit of any LED downlight in the LED lighting system that remains from or is preexisting from the first configuration. In these example embodiments, step 4106 may only be performed as long as at least one LED downlight remains in the second configuration of the LED lighting system after one or more existing LED downlights are removed from the LED lighting system to form the second configuration.

Optionally, a wireless signal may be sent to the LED driver or to one or more LED downlights in the LED downlighting system (step 4108). The wireless signal may be used to control the light that is emitted by each individual LED downlight in the LED downlighting system or the LED downlighting system overall. In some cases, the wireless signal is sent to all of the LED downlights in the LED downlighting system simultaneously. In other cases, the wireless signal is sent individually to one or more of the LED downlights in the LED downlighting system.

In some alternative implementations, the function or functions noted in the blocks of method 4100 above may occur out of the order noted in the figures. For example, in some cases, step 4104, step 4106, or both may be performed prior to step 4102. In still other examples, steps shown in succession may be executed substantially concurrently, or performed in the reverse order, depending upon the functionality involved. Also, other steps in addition to those illustrated in FIG. 41 may be included in the method 4100.

Various portions of one or more of the embodiments described above may be used in combination with other portions of one or more other embodiments described above.

According to one broad aspect of the invention a lighting system is provided having one or more LED circuits. Each LED circuit has at least two diodes connected to each other in opposing parallel relation, wherein at least one of which such diodes is an LED. As used throughout the application, the term diode may mean any type of diode capable of allowing current to pass in a single direction, including but not limited to, a standard diode, a schottky diode, a zener diode, and a current limiting diode. A driver is connected to the one or more LED circuits, the driver providing an AC voltage and current to the one or more LED circuits. The driver and the LED circuits form a driven circuit. The driver and the LED circuits are also configured such that LED circuits may be added to or subtracted (intentionally or by component failure) from the driven circuit:
  (a) without significantly affecting the predetermined desired output range of light from any individual LED; and,
  (b) without the need to: (i) change the value of any discrete component; or, (ii) to add or subtract any discrete components, of any of the preexisting driven circuit components which remain after the change.

In another embodiment of the invention at least one capacitor is connected to and part of each LED circuit. In yet another embodiment, at least one resistor is connected to and is part of each opposing parallel LED circuit noted above. The resistor is connected in series with the at least one capacitor.

According to another aspect of the invention an LED circuit (sometimes referred to as an "AC LED") can comprise two opposing parallel LEDs, an opposing parallel LED string or an opposing parallel LED matrix. These opposing parallel LEDs may have a capacitor in series connected to at least one junction of the connected opposing parallel configurations within a single chip, a single package, an assembly or a module.

When a real capacitor is connected in series in one or more lines between an LED and an AC power source, there is a displacement current through that capacity of magnitude: $I=2\Pi fCV$. The capacitor in the LED circuits of the invention regulates the amount of current and forward voltage delivered to the one or more opposing parallel LEDs based on the voltage and frequency provided by the AC driver. Based on the number of LEDs in the LED circuit the opposing parallel connections provide two or more junctions to which at least one series capacitor may be connected in series of at least one power connection lead. In some embodiments, LED circuits may also use a series resistor in addition to the capacitor providing an "RC" resistor capacitor network for certain LED circuit driver coupling that does not provide protection against surge currents to the LED circuits.

According to another aspect of the invention an LED circuit may comprise a single LED or a series string of diodes and/or LEDs connected to a full bridge rectifier capable of rectifying a provided AC voltage and current for use by the series string of diodes and/or LEDs. The rectifier may be formed as part of the LED circuit, or may be formed separately, having leads provided on both the output of the driver and the input of the LED circuit to allow the LED circuit to connect directly to the driver. In order to protect the LED circuit from voltage spikes a capacitor may be connected across the inputs of the bridge rectifier. The capacitor may also be used for smoothing the AC waveform to reduce ripple. A capacitor may likewise be connected between one rectifier input and the AC voltage and current source in order to limit the DC current flow to protect the LEDs. The bridge diode and LED circuit may be packaged separate or together, and may be configured within a single chip or two chips, a single package or two packages, an assembly, or a module.

According to another aspect of the invention, a single bridge rectifier may be used to drive parallel LEDs or series strings of diodes and/or LEDs. Alternatively, it is contemplated by the invention that each LED circuit requiring a bridge rectifier to utilize both the high and low phases of an AC power wave may include its own full bridge rectifier integrated or otherwise connected thereto. In embodiments where each LED circuit includes its own rectifier, additional LED circuits may be added in parallel across an AC voltage and current source to any existing LED circuits without concern of connecting to any existing bridge rectifiers or, where used, capacitors. Providing each LED circuit with its own bridge rectifier has the further advantage of scaling capacitors included in the circuit for voltage protection and/or current limiting to be matched to a particular LED or string of diodes and/or LEDs.

It should be noted that "package" or "packaged" is defined herein as an integrated unit meant to be used as a discrete component in either of the manufacture, assembly, installation, or modification of an LED lighting device or system. Such a package includes LED's of desired characteristics with capacitors and or resistors (when used) sized relative to the specifications of the chosen LED's to which they will be connected in series and with respect to a predetermined AC voltage and frequency.

Preferred embodiments of a package may include an insulating substrate whereon the LEDs, capacitors and/or resistors are formed or mounted. In such preferred embodiments of a package, the substrate will include electrodes or leads for uniform connection of the package to a device or system associated with an AC driver or power source or any individually packaged rectifiers used to rectify AC voltage and current. The electrodes, leads, and uniform connection may include any currently known means including mechanical fit, and/or soldering. The substrate may be such as sapphire, silicon carbide, gallium nitride, ceramics, printed circuit board material, or other materials for hosting circuit components.

A package in certain applications may preferably also include a heat sink, a reflective material, a lens for directing light, phosphor, nano-crystals or other light changing or enhancing substances. In sum, according to one aspect of the invention, the LED circuits and AC drivers of the present invention permit pre-packaging of the LED portion of a lighting system to be used with standardized drivers (and when necessary full wave rectifiers) of known specified voltage and frequency output. Such packages can be of varied make up and can be combined with each other to create desired systems given the scalable and compatible arrangements possible with, and resulting from, the invention.

According to one aspect of the invention, AC driven LED circuits (or "driven circuits") permit or enable lighting systems where LED circuits may be added to or subtracted (either by choice or by way of a failure of a diode) from the driven circuit without significantly affecting the predetermined desired output range of light from any individual LED and, without the need to: (i) change the value of any discrete component; or, (ii) to add or subtract any discrete components, of any of the preexisting driven circuit components which remain after the change. During design of a lighting system, one attribute of the LEDs chosen will be the amount of light provided during operation. In this context, it should be understood that depending on the operating parameters of the driver chosen, the stability or range of the voltage and frequency of the driver will vary from the nominal specification based upon various factors including but not limited to, the addition or subtraction of the LED circuits to which it becomes connected or disconnected. Accordingly, as sometimes referred to herein, drivers according to the invention are described as providing "relatively constant" or "fixed" voltage and frequency. The extent of this relative range may be considered in light of the acceptable range of light output desired from the resulting circuit at the before, during, or after a change has been made to the lighting system as a whole. Thus it will be expected that a predetermined range of desired light output will be determined within which the driven LED circuits of the invention will perform whether or not additional or different LED circuits have been added or taken out of the driven circuit as a whole or whether additional or different LED circuits have been added proximate any existing LED circuits or positioned remotely.

According to another aspect of the invention an LED circuit may be at least one pre-packaged LED and one pre-packaged diode connected together opposing parallel of each other, two opposing parallel pre-packaged LEDs, an opposing parallel LED string of pre-packaged LEDs, an opposing parallel LED matrix of pre-packaged LEDs optionally having a capacitor in series of at least one junction of the connected LED circuits. It is contemplated that the LED circuit may also be at least one of a single LED or series string of diodes and/or LEDs having a bridge rectifier connected across the single LED or string of diodes. In embodiments where a series string of diodes and/or LEDs and a rectifier is utilized, each LED may likewise be pre-packaged. The rectifier may optionally have a capacitor connected across the rectifier inputs and/or a capacitor connected between to an input of the rectifier for connection between the rectifier and an AC voltage and current source. In either embodiment, utilizing an LED circuit capacitor may allow for direct coupling of at least one LED circuit to the LED driver without additional series components such as capacitors and/or inductors between the LED circuit driver and the LED circuits. The LED circuit driver provides a relatively fixed voltage and relatively fixed frequency AC output even with changes to the load using feedback AC voltage regulator circuitry. The LED circuit's may be directly coupled and scaled in quantity to the LED circuit driver without affecting the other LED circuit's lumen output as long as the LED circuit driver maintains a relatively fixed voltage and relatively fixed frequency AC output.

According to an aspect of the invention, an LED circuit driver provides a relatively fixed voltage and relatively fixed frequency AC output such as mains power sources. The LED circuit driver output voltage and frequency delivered to the LED circuit may be higher than, lower than, or equal to mains power voltage and frequencies by using an LED circuit inverter driver. The LED circuit inverter driver providing higher frequencies is preferable for LED circuits that are integrated into small form LED packages that include integrated capacitors or resistor capacitor "RC" networks. The LED circuit inverter driver has feedback circuitry such as a resistor divider network or other means allowing it to sense changes to the load and re-adjust the frequency and/or voltage output of the LED circuit driver to a desired relatively fixed value. The LED circuit driver may also provide a soft-start feature that reduces or eliminates any surge current from being delivered to the LED circuit when the LED circuit driver is turned on. Higher frequency and lower voltage LED circuit inverter drivers are preferred enabling smaller package designs of LED circuits as the capacitor at higher frequencies would be reduced in size making it easier to integrate into a single LED circuit chip, package, assembly or module.

According to the invention LED circuits may have a resistor capacitor ("RC") network connected together in series or separate from the LED circuits. The maximum resistor value needed is only that value of resistance needed to protect the one or more LEDs within the LED circuit from surge currents that may be delivered by LED circuit drivers that do not provide soft start or other anti surge current features. Direct mains power coupling would require RC network type LED circuits as the mains power source delivers surge currents when directly coupled to an LED circuit.

The higher frequency LED circuit inverter driver may be a halogen or high intensity discharge (HID) lamp type driver with design modifications for providing a relatively fixed voltage and relatively fixed frequency output as the LED circuit load changes. Meaning if the LED circuit inverter driver is designed to have an output voltage of 12V at a frequency of 50 Khz the LED circuit driver would provide this output as a relatively constant output to a load having one or more than one LED circuits up to the wattage limit of the LED circuit driver even if LED circuits were added to or removed from the output of the LED circuit driver.

The higher frequency inverter having a relatively fixed voltage and relatively fixed frequency output allows for smaller components to be used and provides a known output providing a standard reference High Frequency LED circuit driver enabling LED circuits to be manufactured in volume in existing or reasonably similar LED package sizes with integrated capacitors or RC networks based on the number of LEDs desired in the LED circuit package.

U.S. Patent Publication No. 2003/0122502 entitled Light Emitting Diode driver (Clauberg and Erhardt) does not disclose the use of a high frequency inverter driver having a means of keeping a relatively fixed voltage and relatively frequency in response to changes in the load. According to the present invention described herein, by not having additional components such as an inductor or capacitor in series between the LED circuit and the LED circuit driver one LED circuit at a time may be added to or removed from the LED circuit driver output without having to change any components, the LED circuit driver or make adjustments to the LED circuit driver. Additionally, according to this invention the lumen output of the existing LED circuits stays relatively constant due to the self-regulating nature of each individual LED circuit when driven with the relatively fixed frequency and voltage of the LED circuit driver. This level of scalability, single chip LED circuit packaging and standardization is not possible with the prior art using an inductor in series between the LEDs or other components due to the voltage or current increase or drop across the inductors and capacitors in response to changes in the load.

Prior art for single chip LED circuits, for example those disclosed in WO2004023568 and JP2004006582 do not provide a way to reduce the number of LEDs within the chip below the total forward voltage drop requirements of the source. The present invention however, enables an LED circuit to be made with any number of LEDs within a single chip, package or module by using, where desired, transformers, capacitors, or RC networks to reduce the number of LEDs needed to as few as one single LED. Improved reliability, integration, product and system scalability and solid state lighting design simplicity may be realized with LED circuits and the LED circuit drivers. Individual LED circuits being the same or different colors, each requiring different forward voltages and currents may be driven from a single source LED circuit driver. Each individual LED circuit can self-regulate current by matching the capacitor or RC network value of the LED circuit to the known relatively fixed voltage and frequency of the LED circuit driver whether the LED circuit driver is a mains power source, a high frequency LED circuit driver or other LED circuit driver capable of providing a relatively fixed voltage and relatively fixed frequency output.

When a real capacitor is connected in series in one or more lines between an LED and an AC power source, there is a displacement current through that capacity of magnitude: I=2IIfCV. This means that one can predetermine the amount of current to be delivered through a capacitance based upon a known voltage and frequency of an AC source, allowing for each LED circuit containing a series capacitor to have the specific or ideal current required to provide the desired amount of light from the LED circuit.

According to other aspects of the invention, the LED circuit driver may be coupled to a dimmer switch that regulates voltage or frequency or may have integrated circuitry that allows for adjustability of the otherwise relatively fixed voltage and/or relatively fixed frequency output of the LED circuit driver. The LED circuits get brighter as the voltage and/or frequency of the LED circuit driver output is increased to the LED circuits.

One form of the invention is at least one LED and one diode connected together opposing parallel of each other, two opposing parallel LEDs, an opposing parallel LED string and/or opposing parallel LED matrix having a capacitor in series of at least one connected junction of the connected opposing parallel LED configurations within a single chip, a single package, an assembly or a module. When desired, the LED circuit with capacitor may be placed on an insulating substrates such as but not necessarily ceramic or sapphire and/or within various LED package sizes; materials and designs based of product specifications or assembled on printed circuit board material. Any integrated LED circuit capacitors should be scaled to a predetermined value enabling the LED circuit to self-regulate a reasonably constant and specific current when coupled to an LED circuit driver that provides a relatively fixed voltage and frequency output. Utilized LED circuit capacitors may be of a value needed to provide the typical operating voltage and current of the LED circuit when designed for coupling to a specific LED circuit driver.

Another form of the invention is an LED circuit comprising at least one LED and one diode connected together opposing parallel of each other, two opposing parallel LEDs, an opposing parallel LED string and/or opposing parallel LED matrix having a series resistor capacitor ("RC") network connected together in series or independently in series between at least one connected junction of the opposing parallel LEDs and the respective power connection of the LED circuit. When desired, the opposing parallel LEDs and RC network may be placed on an insulating substrate such as but not necessarily ceramic or sapphire and/or within various LED package sizes; materials and designs based of product specifications or assembled on printed circuit board material. The LED circuit RC network may be of a value needed to provide the typical operating voltage and current of the LED circuit when designed for coupling to a specific LED circuit driver.

Another form of the invention is an LED circuit comprising a matrix of two opposing parallel LEDs connected together in parallel with every two opposing parallel LEDs having an individual capacitor in series to the power source connection if desired. The entire parallel array of opposing parallel LED circuits, including capacitors when used, may be may be placed on an insulating substrate such as but not necessarily ceramic or sapphire and/or within various LED package sizes; materials and designs based of product specifications or assembled on printed circuit board material. The opposing parallel matrix of LED circuits integrated in the LED circuit package may be RC network type LED circuits.

Another form of the invention is an LED circuit comprising a matrix of opposing parallel LEDs connected together in parallel with every set of opposing parallel LEDs having an individual RC network in series to the power connection lead if desired.

Another form of the invention is an LED circuit comprising a matrix of opposing parallel LEDs connected together in parallel, a capacitor connected in series to at least one side of the line going to the matrix of opposing parallel LEDs with every set of opposing parallel LEDs having an individual resistor in series to the power connection if desired.

Yet another form of the invention is an LED circuit comprising opposing parallel series strings of LEDs connected together and driven direct with a high frequency AC voltage equal to or less than to total series voltage drop of the opposing parallel series strings of LEDs within the LED circuit.

Yet another form of the invention is an LED circuit comprising a single LED or a series string of diodes and/or LEDs and a bridge rectifier connected across the LED or string of diodes and/or LEDs. The rectifier may optionally include a capacitor connected across the inputs of the rectifier. The rectifier may additionally, or alternatively, optionally include a capacitor connected in series with one input, the capacitor being capable of connecting the rectifier input to an AC voltage and current source.

Yet another form of the invention is an LED circuit comprising a single LEDs or a series strings of diodes and/or LEDs connected in parallel across the output of a bridge rectifier. The rectifier may optionally include a capacitor connected across the inputs of the rectifier. The rectifier may additionally, or alternatively, optionally include a capacitor connected in series with one input, the capacitor being capable of connecting the rectifier input to an AC voltage and current source.

Another form of the invention comprises a method of driving LED circuits direct from an AC power source ("LED circuit driver") having a relatively fixed voltage and relatively fixed frequency. The LED circuit driver may be a mains power source, the output of a transformer, a generator or an inverter driver that provides a relatively fixed voltage and relatively fixed frequency as the load changes and may be a higher or lower frequency than the frequencies of mains power sources. The LED circuit driver provides a relatively fixed voltage and relatively fixed frequency output even when one or more LED circuits are added to or removed from the output of the LED circuit driver. Higher frequency inverters with lower output voltages are used as one LED circuit driver in order to reduce component size and simplify manufacturing and standardization of LED circuits through the availability of higher frequency LED circuit drivers. The LED circuit driver may also include circuitry that reduces or eliminates surge current offering a soft-start feature by using MOSFET transistors, IGBT transistors or other electronic means. The LED circuit driver may also be pulsed outputs at a higher or lower frequency than the primary frequency.

Another form of the invention is an LED lighting system comprising an LED circuit array having a plurality of different LED circuits each drawing the same or different currents, each having the same or different forward operating voltages, and each delivering the same or different lumen outputs that may be the same or different colors and an LED circuit driver coupled to the LED circuit array. The LED circuit driver delivering a relatively fixed t frequency and voltage output allows for mixing and matching of LED circuits requiring different forward voltages and drive currents. The LED circuits may be connected to the output of an LED circuit driver in parallel one LED circuit at a time within the limit of the wattage rating of the LED circuit driver with no need to change or adjust the LED circuit driver as would typically be required with DC drivers and LEDs when increasing or reducing the load with LEDs and other components. Never having to go back to the power source allows for more efficient integration and scalability of lighting systems designed with LED circuits and allows for a single driver to independently provide power to multiple independently controlled LED circuits in the system. Introducing an inductor and/or an additional capacitor such as the impedance circuit described in prior art between the LED circuit drive source and the LED circuits would require changes to the driver or components and prohibit scalability, standardization and mass production of AC-LEDs with integrated capacitors or RC networks.

With the LED circuit driver providing a known relatively constant AC voltage and frequency, mass production of various LED circuits with specific capacitor or RC network values would deliver 20 mA, 150 mA or 350 mA or any other desired current to the LED circuit based on the output of the specified LED circuit driver. The relatively fixed voltage and frequency allows for standardization of LED circuits through the standardization of LED circuit drivers.

In another aspect, a transistor is coupled to at least one power connection of the LED circuit or built into the LED circuit package in series between the power connection lead and the LED circuit with the transistor being operable to control (e.g., varying or diverting) the flow of the alternating current through the LED circuit through a capacitance within the transistor.

According to another form of the invention, a low voltage downlight system is having downlights with IDC connectors integrated and/or mounted to the downlights to provide for simple electrical connectivity of the downlights to a low voltage power supply that may or may not have polarity requirements, polarity control and/or polarity indication means within the LED downlights and/or IDC connectors.

According to another aspect of the invention, the present invention proposes that low voltage downlight systems can be installed with a much simpler process with less work, reduced and simplified electrical wiring and lower cost to the end user by connecting downlights in parallel using insulation displacement "IDC" connectors across a low voltage pair of wires that are treated like a power buss. In most cases the present invention may also substantially reduce and or eliminate the need to pay for the expense of a professional electrician and allows an installer of these downlights to make the final electrical connections using only a simple tool such as pliers or the like. In the case of DC power supplier that require polarity, it is contemplated the IDC connector could be keyed and/or marked and that the wire could be keyed and or marked as one option, and another option is to have polarity sensing capability and circuitry in the LED downlight that would prevent and correct for any improper polarity connections to the IDC connectors.

The above-described embodiments of the present invention are intended to be examples only. Alterations, modifications and variations may be effected to the particular embodiments by those of ordinary skill in the art without departing from the scope of the invention, which is defined by the claims appended hereto.

The invention is claimed as follows:

1. An LED lighting system comprising:
an LED downlight that is mountable to a ceiling and includes an LED circuit, wherein light from the LED downlight faces downward relative to the ceiling to project light or faces upward relative to the ceiling to reflect light off of the ceiling;
an LED driver having an input with a first voltage and an output with a second voltage, the second voltage being lower than the first voltage and being provided through a wire system extending from the LED driver; and
an insulation displacement connector for connecting the LED downlight to the wire system extending from the LED driver,
wherein the LED lighting system is configured to allow changing the LED lighting system from a first configuration to a second configuration by at least one of adding one or more additional LED downlights to the LED lighting system using one or more corresponding insulation displacement connectors or removing one or more existing LED downlights from the LED lighting system using one or more corresponding insulation displacement connectors,
wherein the second configuration for the LED lighting system does not significantly affect a predetermined desired output range of light from any LED downlight in the LED lighting system or from any LED circuit of any LED downlight in the LED lighting system that remains from or is preexisting from the first configuration, and
wherein, if one or more existing LED downlights are removed from the LED lighting system to form the second configuration, at least one LED downlight remains in the second configuration of the LED lighting system.

* * * * *